(12) United States Patent
Lee

(10) Patent No.: US 10,490,570 B2
(45) Date of Patent: Nov. 26, 2019

(54) METHOD OF FABRICATING VERTICAL MEMORY DEVICES HAVING A PLURALITY OF VERTICAL CHANNELS ON A CHANNEL LAYER

(71) Applicant: Samsung Electronics Co., Ltd., Suwon-si, Gyeonggi-do (KR)

(72) Inventor: Chang-Hyun Lee, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/122,386

(22) Filed: Sep. 5, 2018

(65) Prior Publication Data

US 2019/0043885 A1 Feb. 7, 2019

Related U.S. Application Data

(60) Division of application No. 15/455,900, filed on Mar. 10, 2017, now Pat. No. 10,134,753, which is a continuation of application No. 14/605,529, filed on Jan. 26, 2015, now Pat. No. 9,634,023.

(30) Foreign Application Priority Data

Feb. 3, 2014 (KR) .................. 10-2014-0011902

(51) Int. Cl.
*H01L 27/11582* (2017.01)
*H01L 29/04* (2006.01)
*H01L 29/16* (2006.01)
*H01L 29/66* (2006.01)
*H01L 29/792* (2006.01)

(52) U.S. Cl.
CPC ........ *H01L 27/11582* (2013.01); *H01L 29/04* (2013.01); *H01L 29/16* (2013.01); *H01L 29/66833* (2013.01); *H01L 29/7926* (2013.01)

(58) Field of Classification Search
CPC ......... H01L 27/11582; H01L 27/11556; H01L 27/11578
See application file for complete search history.

(56) References Cited

U.S. PATENT DOCUMENTS

| 8,338,882 | B2 | 12/2012 | Tanaka et al. | |
|---|---|---|---|---|
| 9,634,023 | B2 | 4/2017 | Lee | |
| 2011/0298038 | A1* | 12/2011 | Son | H01L 27/11578 257/324 |
| 2012/0064682 | A1* | 3/2012 | Jang | H01L 21/28273 438/268 |
| 2013/0121081 | A1 | 5/2013 | Kito et al. | |

* cited by examiner

*Primary Examiner* — Ermias T Woldegeorgis
(74) *Attorney, Agent, or Firm* — Harness, Dickey & Pierce, P.L.C.

(57) ABSTRACT

According to example embodiments, a vertical memory device includes a low resistance layer on a lower insulation layer, a channel layer on the low resistance layer, a plurality of vertical channels on the channel layer, and a plurality of gate lines. The vertical channels extend in a first direction that is perpendicular with respect to a top surface of the channel layer. The gate lines surround outer sidewalls of the vertical channels, and are stacked in the first direction and are spaced apart from each other.

20 Claims, 61 Drawing Sheets

FIG. 2
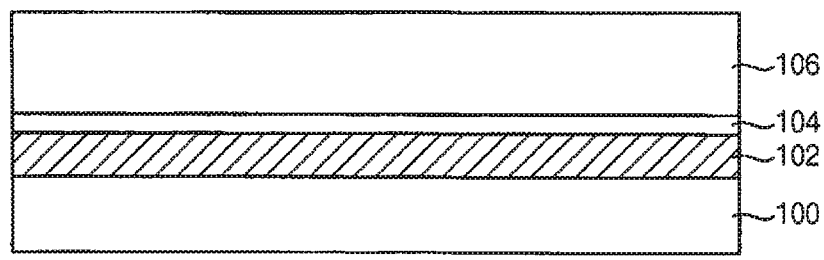
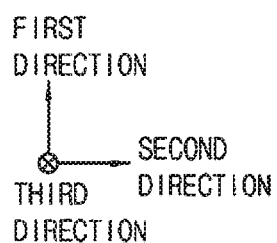
FIRST
DIRECTION
SECOND
DIRECTION
THIRD
DIRECTION

FIG. 18
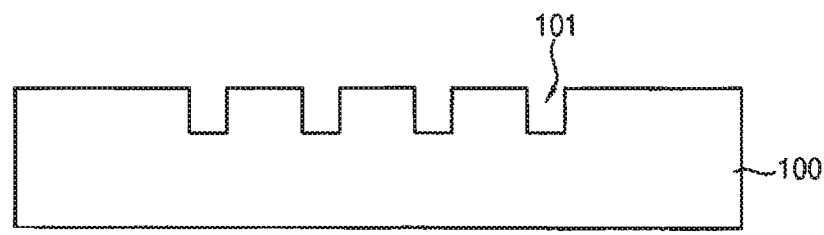
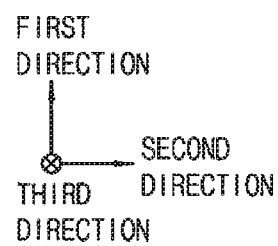
FIG. 19
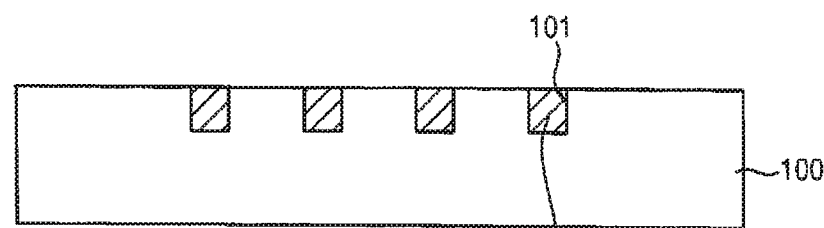
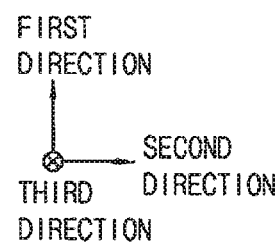

FIG. 21
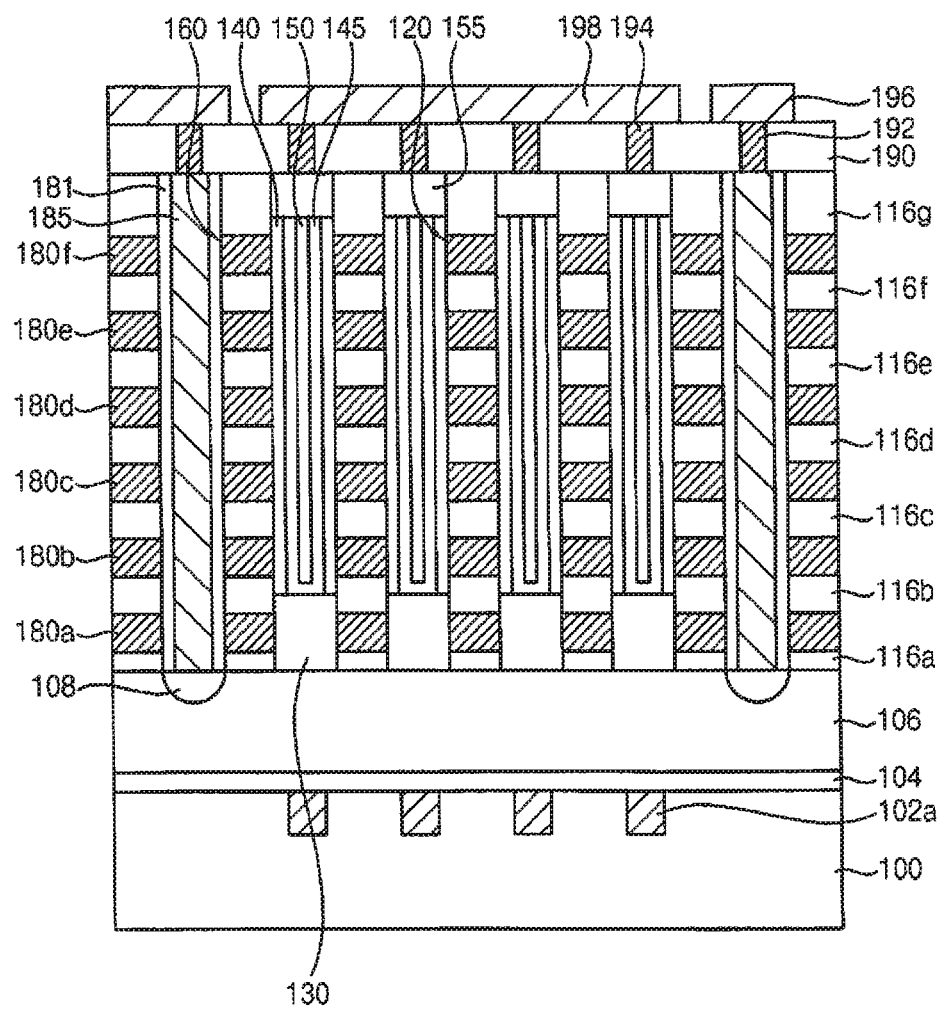
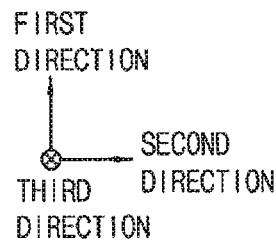

FIG. 23
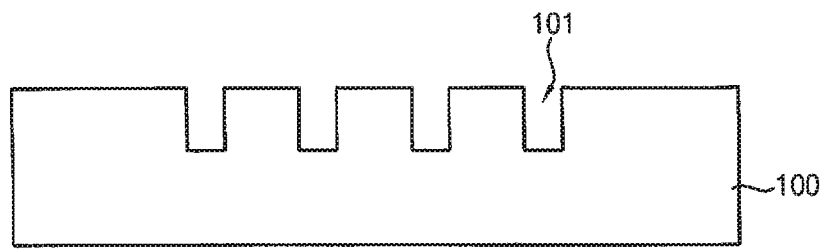
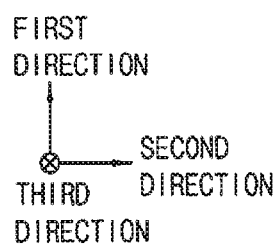
FIG. 24
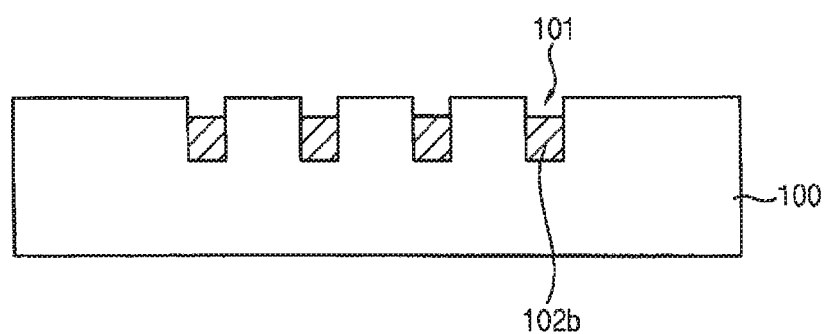
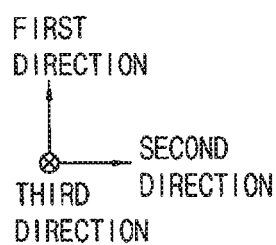

FIG. 30
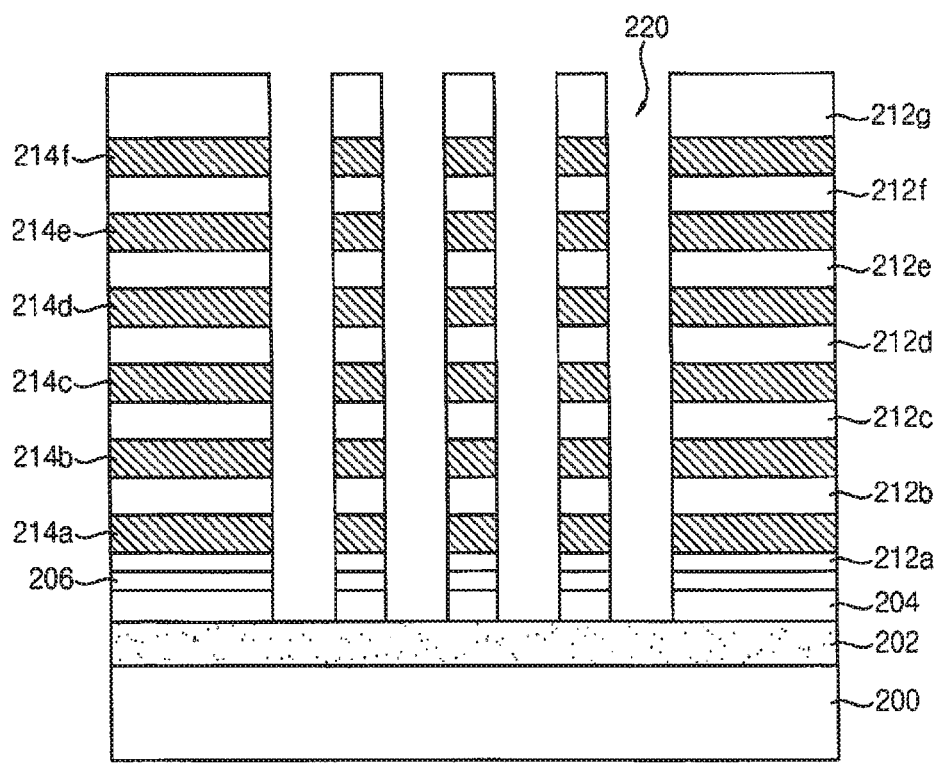
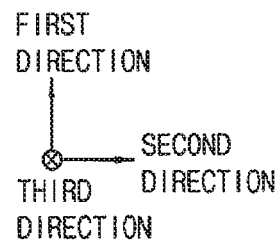

FIG. 31
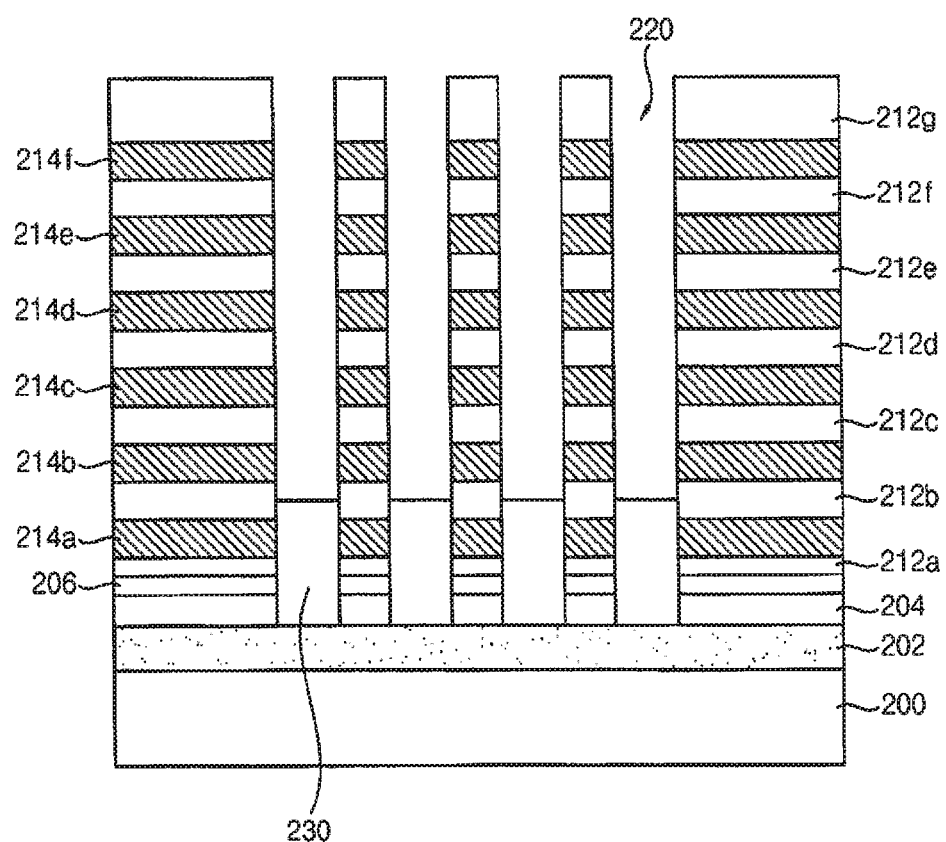
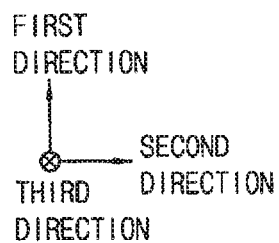

FIG. 33
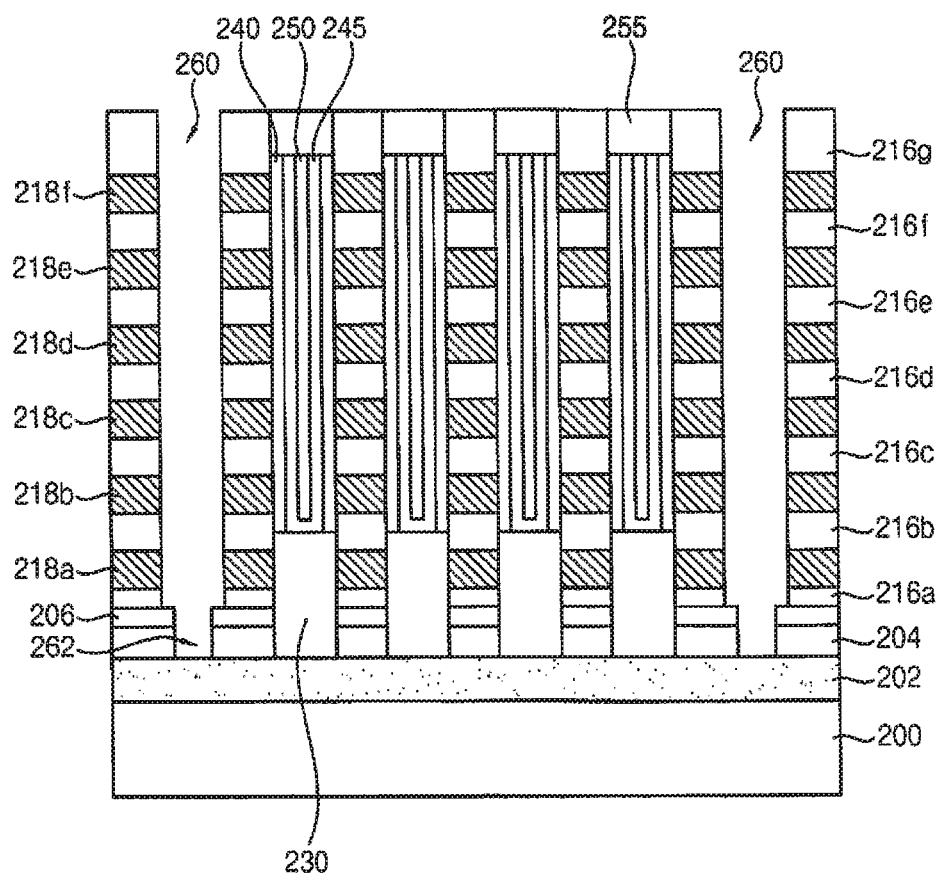
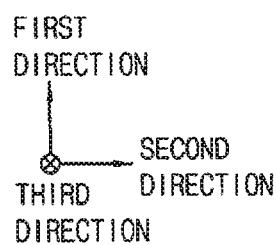

FIG. 35
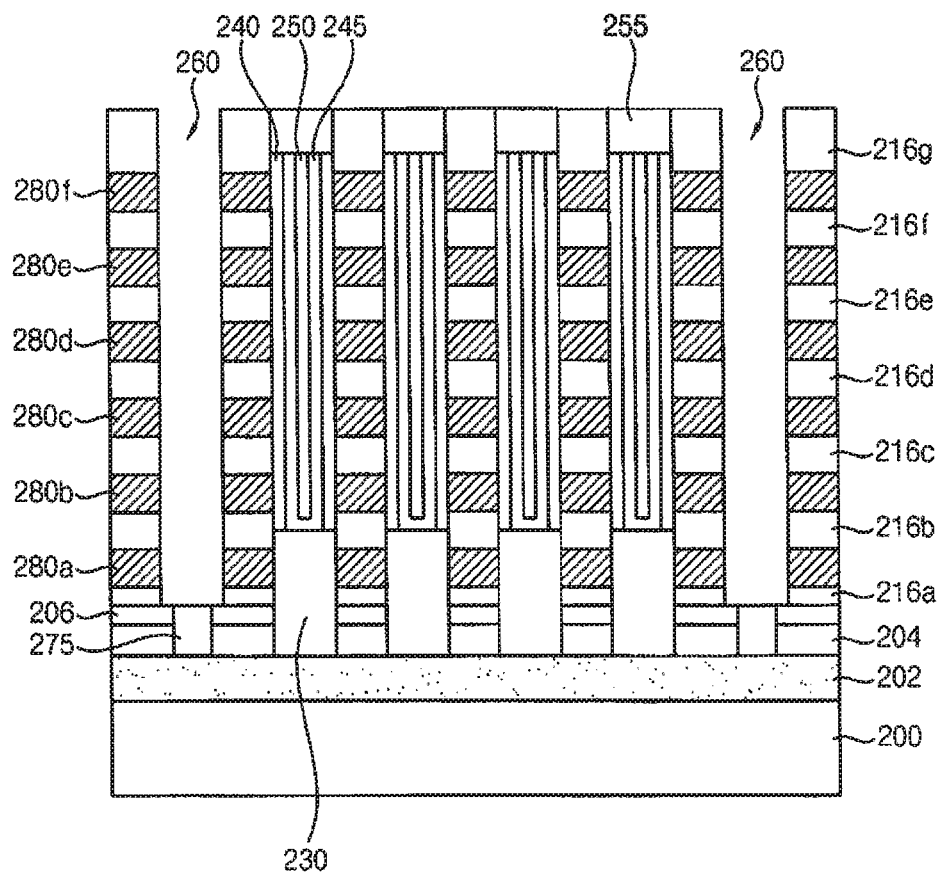
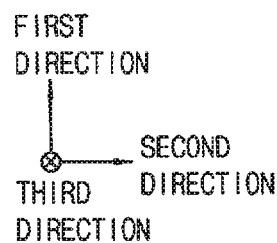

FIG. 41
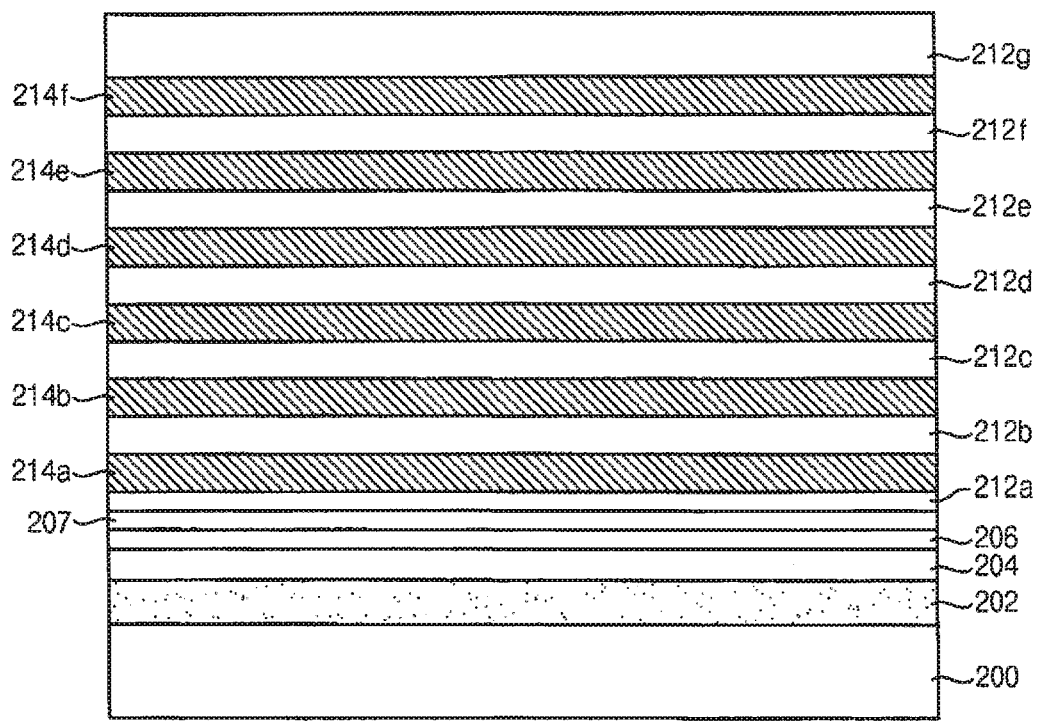
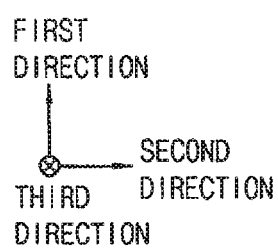
FIRST
DIRECTION
SECOND
DIRECTION
THIRD
DIRECTION

FIG. 44
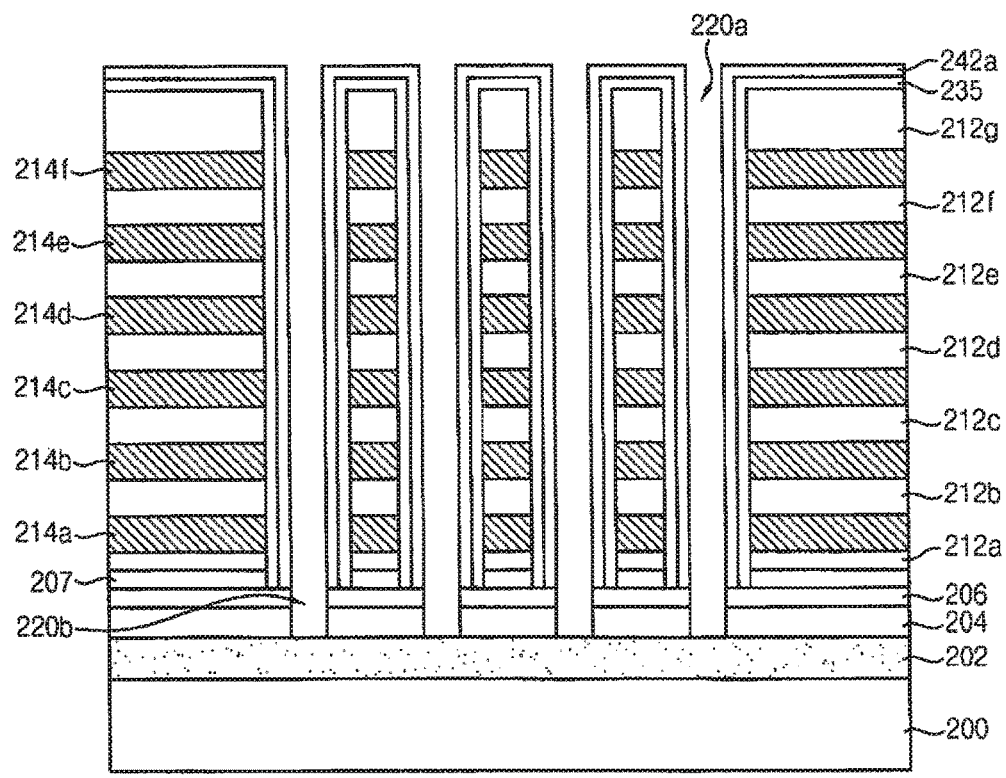
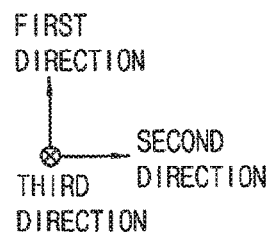

FIG. 45
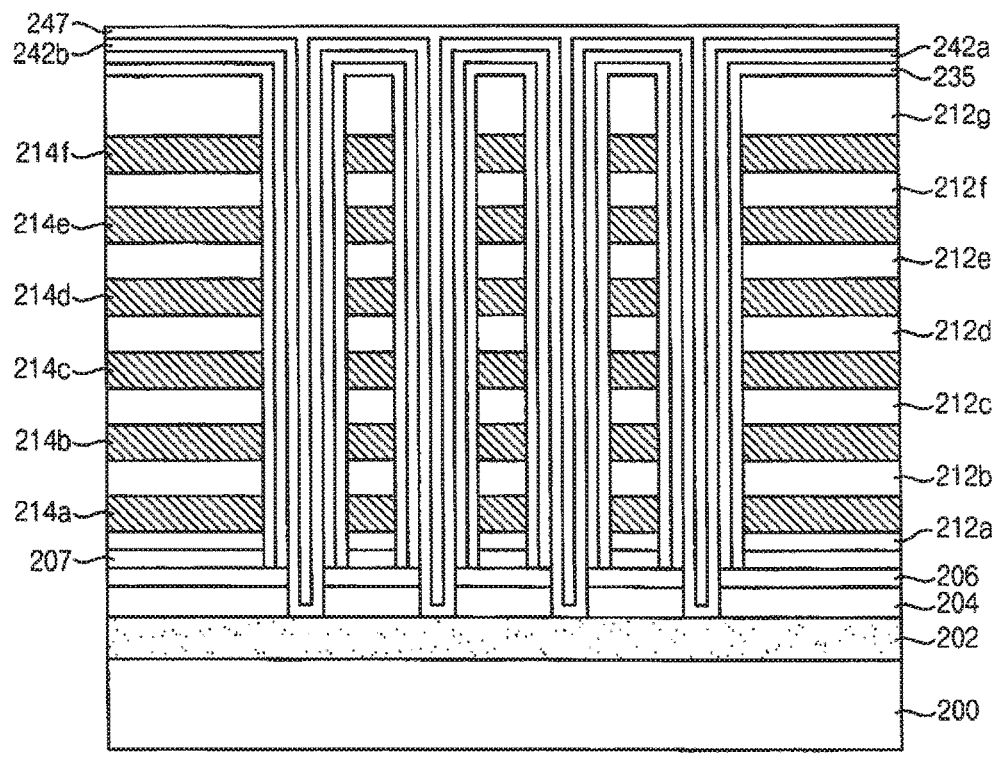
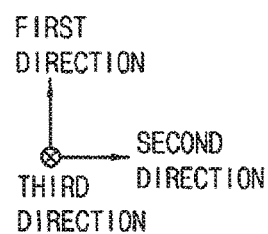

FIG. 46
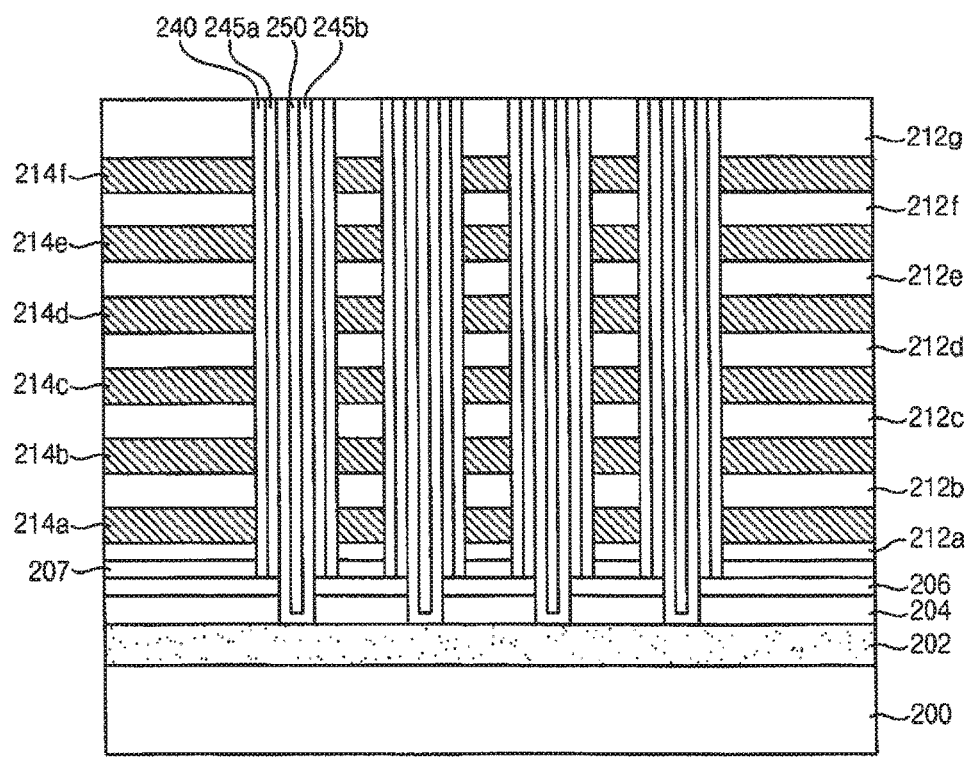
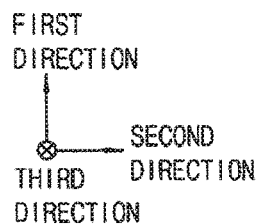

FIG. 47
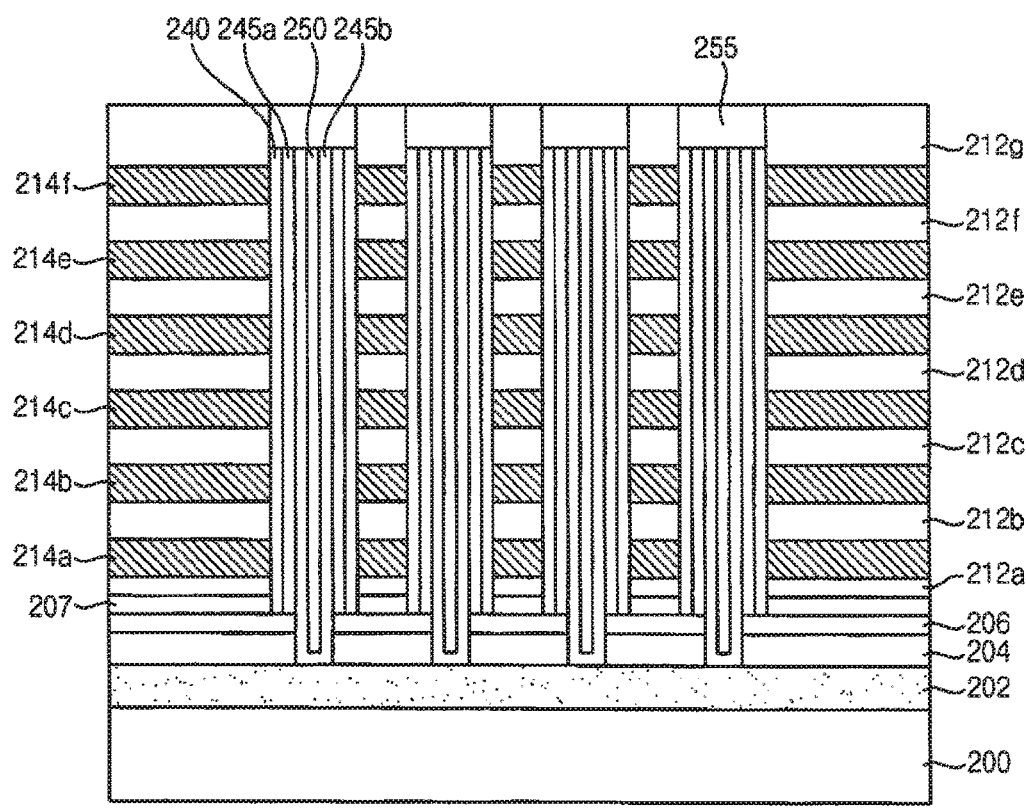
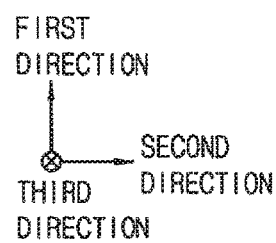

FIRST
DIRECTION

SECOND
DIRECTION
THIRD
DIRECTION

FIG. 49
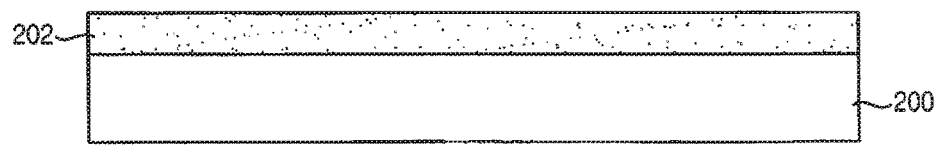
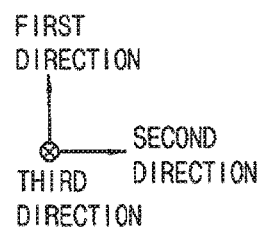
FIG. 50
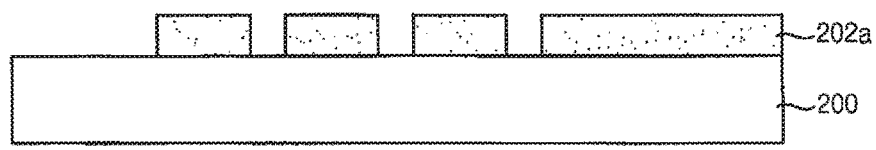
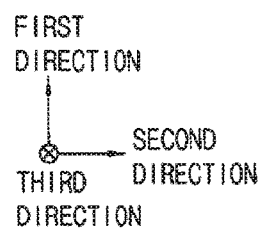

FIG. 53A
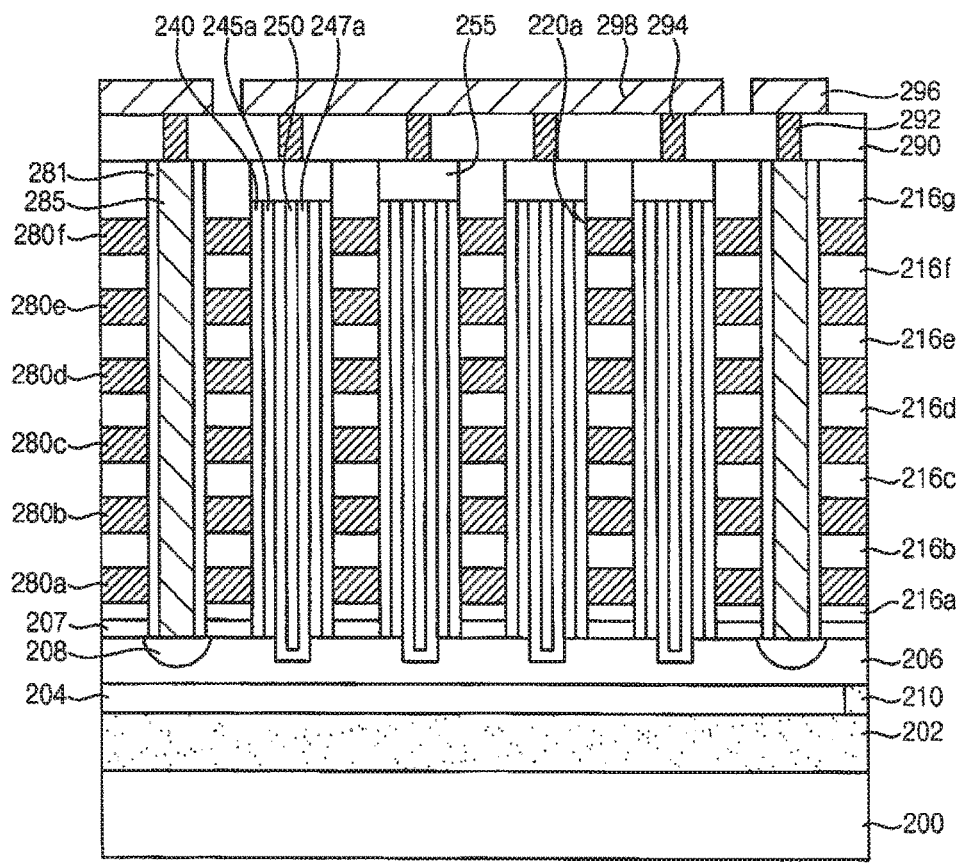
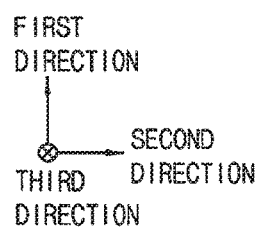

FIG. 55
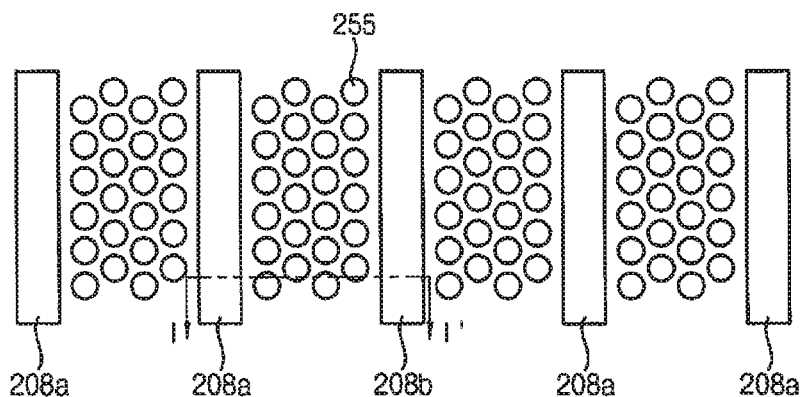
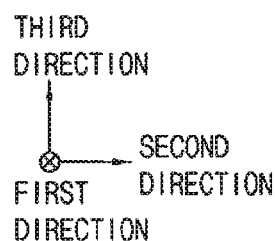
FIG. 56A
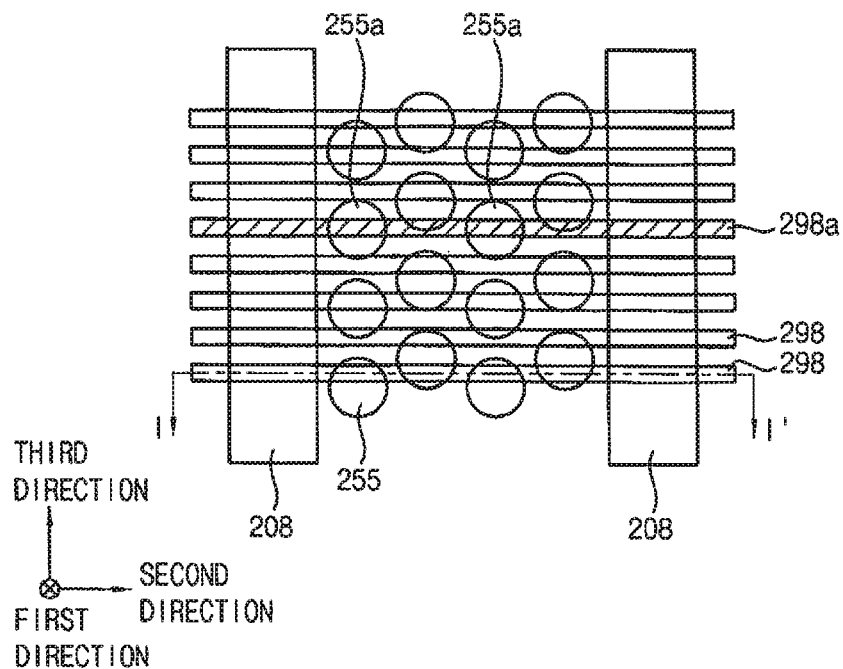

FIG. 59
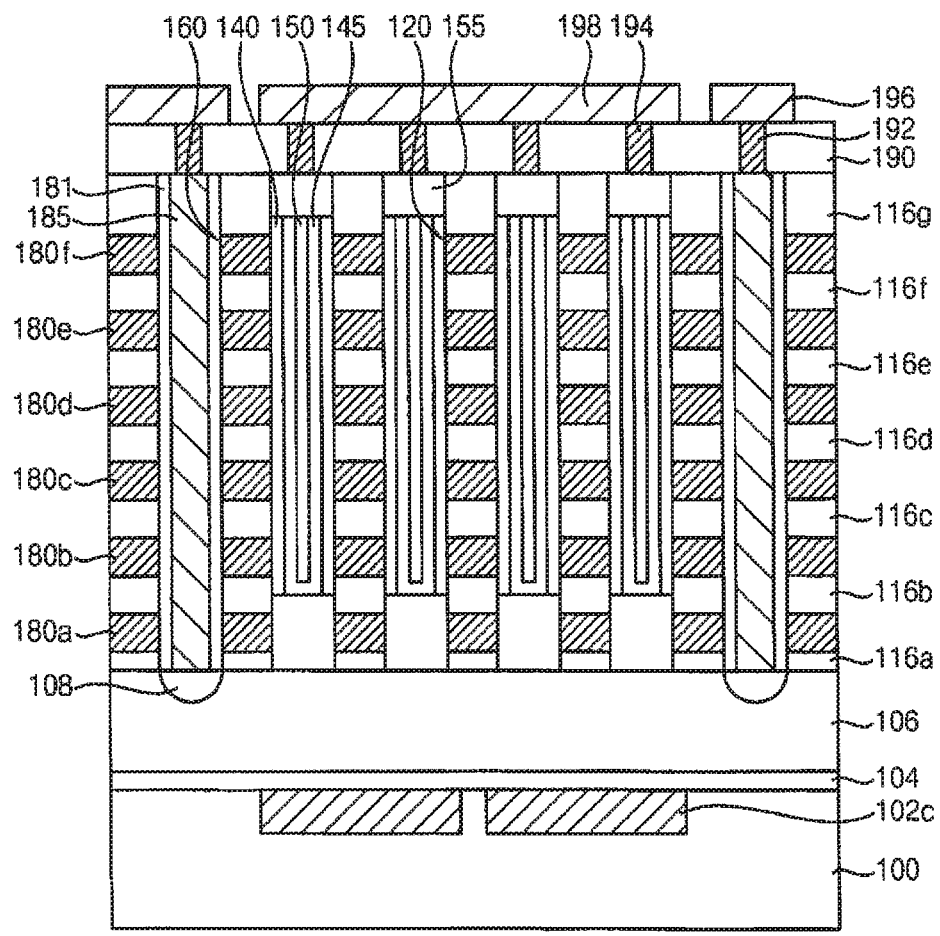
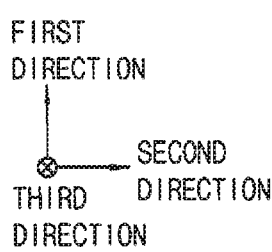

METHOD OF FABRICATING VERTICAL MEMORY DEVICES HAVING A PLURALITY OF VERTICAL CHANNELS ON A CHANNEL LAYER

CROSS-REFERENCE TO RELATED APPLICATION

This application is a divisional of U.S. application Ser. No. 15/455,900, filed on Mar. 10, 2017, which is a continuation of U.S. Pat. No. 9,634,023, filed on Jan. 26, 2015, which claims priority under 35 USC § 119 to Korean Patent Application No. 10-2014-0011902, filed on Feb. 3, 2014 in the Korean Intellectual Property Office (KIPO), the entire contents of each of the above-referenced applications are hereby incorporated by reference.

BACKGROUND

1. Field

Example embodiments relate to vertical memory devices. More particularly, example embodiments relate to non-volatile memory devices including vertical channels.

2. Description of Related Art

Recently, a vertical memory device including a plurality of memory cells stacked repeatedly with respect to a surface of a substrate has been developed in order to realize a higher degree of integration. In vertical memory devices, a channel may protrude vertically from the surface of the substrate, and gate lines and insulation layers surrounding the channel may be repeatedly stacked.

As the degree of integration of vertical memory devices becomes greater, the stacked number of the memory cells and a height of the channel may be increased. Thus, improving an operational reliability of the vertical memory device may be desired.

SUMMARY

Example embodiments relate to a vertical memory device having an improved reliability.

According to example embodiments, a vertical memory device includes a lower insulation layer, a low resistance layer on the lower insulation layer, a channel layer on the low resistance layer, a plurality of vertical channels on the channel layer, and a plurality of gate lines. The vertical channels extend in a first direction that is perpendicular with respect to a top surface of the channel layer. The gate lines surround outer sidewalls of the vertical channels, and are stacked in the first direction and are spaced apart from each other.

In example embodiments, the vertical memory device may further include an ohmic contact layer between the low resistance layer and the channel layer.

In example embodiments, the ohmic contact layer and the channel layer may include polysilicon doped with p-type impurities. The impurity concentration of the ohmic contact layer may be greater than an impurity concentration of the channel layer.

In example embodiments, the low resistance layer may include at least one of a metal, a metal nitride, and a metal silicide. These may be used alone or in a combination thereof.

In example embodiments, the low resistance layer may have a linear shape or an island shape buried in the lower insulation layer.

In example embodiments, the lower insulation layer may include at least one trench, and the low resistance layer may fill a lower portion of the trench. The vertical memory device may further include an ohmic contact pattern on the low resistance layer. The ohmic contact pattern may fill a remaining portion of the trench.

According to example embodiments, a vertical memory device includes a lower insulation layer, a first channel layer on the lower insulation layer, a second channel layer on the first channel layer, a plurality of vertical channels on the first channel layer, and a plurality of gate lines. The second channel layer and the first channel layer are spaced apart from each other in a first direction that is perpendicular with respect to a top surface of the second channel layer. The vertical channels extend in the first direction. The gate lines surround outer sidewalls of the vertical channels. The gate lines are stacked in the first direction to be spaced apart from each other. The gate lines are on the lower insulation layer.

In example embodiments, the first channel layer and the second channel layer may include polysilicon doped with p-type impurities. An impurity concentration of the first channel layer may be greater than an impurity concentration of the second channel layer.

In example embodiments, a thickness of the first channel layer may be greater than a thickness of the second channel layer.

In example embodiments, the vertical memory device may further include a semiconductor pattern connecting the first channel layer and the second channel layer to each other. The vertical channels may be on the semiconductor pattern.

In example embodiments, the second channel layer may surround an outer sidewall of the semiconductor pattern, and may serve as a channel of a ground selection transistor (GST).

In example embodiments, the vertical channel may include a first vertical channel and a second vertical channel. The first vertical channel may be on the second channel layer, and the second vertical channel may be adjacent to an inner wall of the first vertical channel and may extend through the second channel layer.

In example embodiments, the second vertical channel may be in contact with the first channel layer.

In example embodiments, the first channel layer may include a plurality of line patterns, and each one of the line patterns may overlap at least one channel row including a plurality of the vertical channels.

In example embodiments, the vertical memory device may further include a peripheral circuit on a semiconductor substrate. The lower insulation layer may be formed on the semiconductor substrate to cover the peripheral circuit.

According to example embodiments, a vertical memory device may include a low resistance layer including, e.g., a metal under a bottom surface of a channel layer so that a resistance of the channel layer may be reduced. According to example embodiments, the channel layer may have a double-layered structure including a first channel layer and a second channel layer. The first channel layer may include impurities of a relatively high concentration. The second channel layer may include impurities of a relatively low concentration. The second channel layer may be provided as a ground selection transistor (GST), and the first channel layer may be provided as a substrate in contact with a vertical channel. Further, the first and second channel layers may form a parallel connection with each other by the vertical channel. Therefore, a resistance of the channel layer may be reduced while maintaining driving or operational properties of the GST.

As described above, the resistance of the channel layer and a leakage current of the GST may be reduced so that driving or operational reliability of the vertical memory device may be improved.

According to example embodiments, a vertical memory device includes a lower insulation layer, a plurality of gate lines on the lower insulation layer, a channel layer between the gate lines and the lower insulation layer, a plurality of vertical channels on the lower insulation layer, and a at least one of a low resistance layer and a well layer between the lower insulation layer and the vertical channels. The gate lines are spaced apart from each other in a first direction. The gate lines define channel holes and openings. The vertical channels extend in the first direction through the channel holes of the gate lines.

In example embodiments, the low resistance layer may be between the lower insulation layer and the vertical channels, the channel layer may be between the vertical channels and the low resistance layer, and a resistance of the channel layer may be greater than a resistance of the low resistance layer.

In example embodiments, a semiconductor pattern may be on the lower insulation layer, and the vertical channels may be on the semiconductor pattern.

In example embodiments, the vertical memory device may further include a separation insulation layer. The well layer may be between the lower insulation layer and the vertical channels. The channel layer may be on the separation insulation layer. The separation insulation layer may be between the well layer and the channel layer.

In example embodiments, the vertical memory device may further include bit lines electrically connected to the vertical channels, a common source line, and a dielectric layer structure in the channel holes. The dielectric layer structure may be between the vertical channels and the gate lines. The channel layer may include impurity regions that are exposed by the openings in the gate lines, and the common source line may be electrically connected to the impurity regions.

BRIEF DESCRIPTION OF THE DRAWINGS

Example embodiments will be more clearly understood from the following detailed description taken in conjunction with the accompanying drawings. The drawings represent non-limiting, example embodiments as described herein. The drawings are not necessarily to scale, emphasis instead being placed upon illustrating the principles of inventive concepts. In the drawings:

FIGS. 2 to 16 are cross-sectional views illustrating a method of manufacturing a vertical memory device in accordance with example embodiments;

FIGS. 18 to 21 are cross-sectional views illustrating a method of manufacturing a vertical memory device in accordance with example embodiments;

FIGS. 23 to 26 are cross-sectional views illustrating a method of manufacturing a vertical memory device in accordance with example embodiments;

FIGS. 28 to 37 are cross-sectional views illustrating a method of manufacturing a vertical memory device in accordance with example embodiments;

FIGS. 41 to 47 are cross-sectional views illustrating a method of manufacturing a vertical memory device in accordance with example embodiments;

FIGS. 49 to 52 are cross-sectional views illustrating a method of manufacturing a vertical memory device in accordance with example embodiments;

FIGS. 53A to 53C are cross-sectional views illustrating vertical memory devices in accordance with example embodiments;

FIG. 55 is a top plan view illustrating a vertical memory device in accordance with example embodiments;

FIGS. 56A to 56C are cross-sectional views illustrating vertical memory devices in accordance with example embodiments;

FIG. 59 is a cross-sectional view illustrating a vertical memory device in accordance with example embodiments;

DESCRIPTION OF EMBODIMENTS

Figure 1:
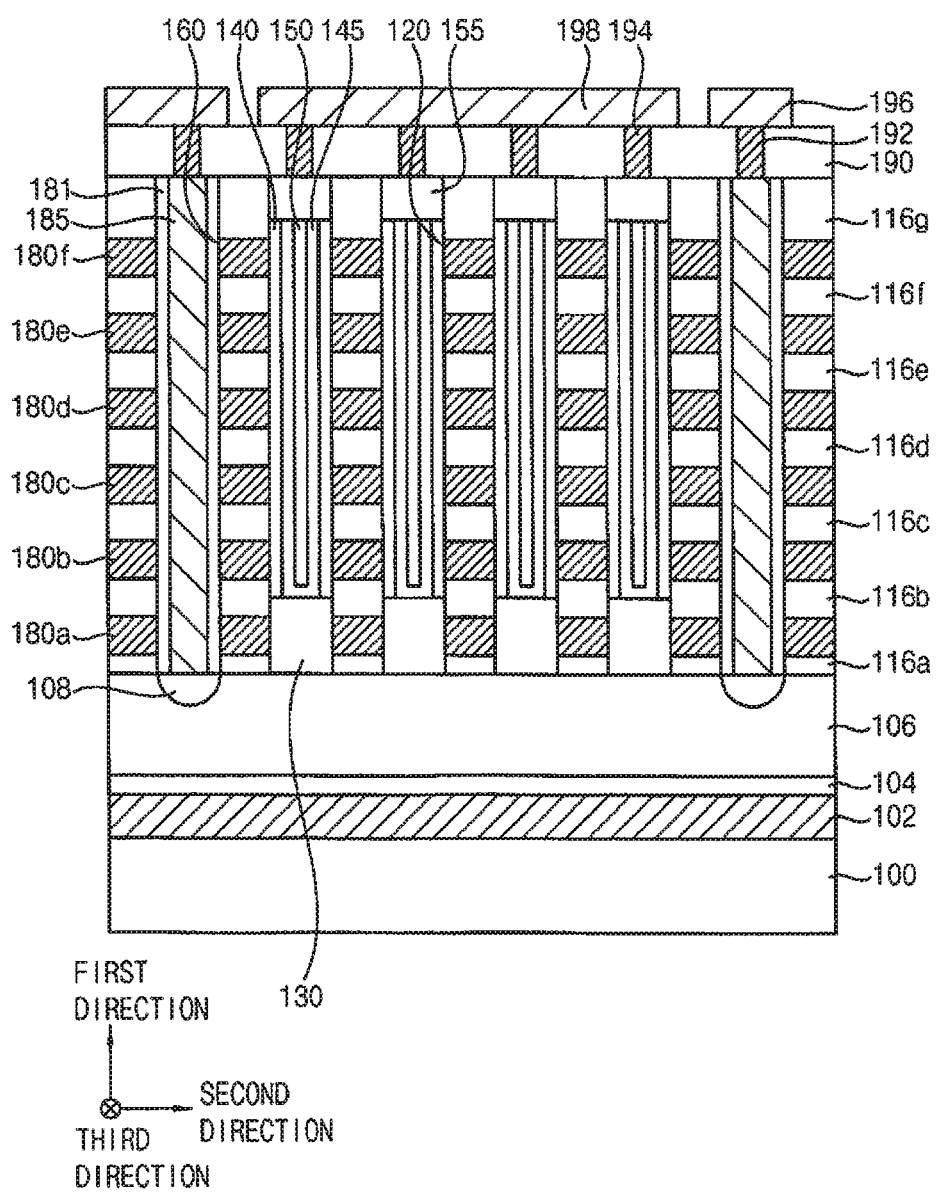
FIG. 1 is a cross-sectional view illustrating a vertical memory device in accordance with example embodiments.

Various example embodiments will be described more fully hereinafter with reference to the accompanying drawings, in which some example embodiments are shown. Inventive concepts may, however, be embodied in many different forms and should not be construed as limited to the example embodiments set forth herein. Rather, these example embodiments are provided so that this description will be thorough and complete, and will fully convey the scope of inventive concepts to those skilled in the art. In the drawings, the sizes and relative sizes of layers and regions may be exaggerated for clarity. Like reference characters and/or numerals in the drawings denote like elements, and thus their description may be omitted.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, fourth etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In the figures cited in this specification, a direction substantially vertical to a top surface of a channel layer is referred to as a first direction, and two directions substantially parallel to the top surface of the channel layer and substantially perpendicular to each other are referred to as a second direction and a third direction. Additionally, a direction indicated by an arrow in the figures and a reverse direction thereto are considered to be the same direction.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

FIG. 1 is a cross-sectional view illustrating a vertical memory device in accordance with example embodiments.

Referring to FIG. 1, the vertical memory device may include a memory cell structure disposed on a channel layer 106 and a lower structure disposed under the channel layer 106.

In example embodiments, the channel layer 106 may include a semiconductor that may be doped with impurities. For example, the channel layer 106 may include polysilicon doped with impurities. For example, the channel layer 106 may include p-type impurities such as boron (B) or gallium (Ga). In this case, the channel layer 106 may serve as a p-type well (hereinafter, referred to as a p-well). The channel layer 106 may be a well layer.

The memory cell structure on the channel layer 106 may include a semiconductor pattern 130 protruding from the channel layer 106, a vertical channel 145 extending in the first direction on the semiconductor pattern 130, a dielectric layer structure 140 surrounding an outer sidewall of the vertical channel 145, and a plurality of gate lines 180 (180a through 180f) at least partially surrounding the vertical channel 145 on an outer sidewall of the dielectric layer structure 140 and spaced apart from each other in the first direction. While FIG. 1 illustrates gate lines 180a through 180f and insulating interlayer patterns 116a through 116f alternately stacked on each other, example embodiments are not limited thereto and the number of gate lines 180 and insulating layer interlayer patterns 116 may vary.

The semiconductor pattern 130 may fill a lower portion of a channel hole 120 through which a top surface of the channel layer 106 may be exposed. The semiconductor pattern 130 may contact the top surface of the channel layer 106. In example embodiments, the semiconductor pattern 130 may include polysilicon or single crystalline silicon.

In example embodiments, the semiconductor pattern 130 may be partially buried or embedded in the channel layer 106.

The vertical channel 145 may be disposed on the semiconductor pattern 130 and may have a hollow cylindrical shape or a cup shape. The vertical channel 145 may include a semiconductor such as polysilicon or single crystalline silicon. The vertical channel 145 may include impurities. For example, the vertical channel 145 may include an impurity region doped with p-type impurities such as B or Ga.

A plurality of the vertical channels 145 may be arranged in the third direction to define a channel row. A plurality of the channel rows may be formed in the second direction.

A first filling layer pattern 150 may be formed in the vertical channel 145. The first filling layer pattern 150 may have a pillar shape or a solid cylindrical shape. The first filling layer pattern 150 may be made of a dielectric material such as silicon oxide and/or silicon nitride, but example embodiments are not limited thereto.

In example embodiments, the vertical channel 145 may have a pillar shape or a solid cylindrical shape. In this case, the first filling layer pattern 150 may be omitted.

The dielectric layer structure 140 may be disposed on a sidewall of the channel hole 120 and on a peripheral portion of the top surface of the semiconductor pattern 130. The dielectric layer structure 140 may have a cup shape or a straw shape. If the dielectric layer structure 140 has a cup shape, a central bottom of the dielectric layer structure 140 may define an opening.

The dielectric layer structure 140 may include a tunnel insulation layer pattern, a charge storage layer pattern and a blocking layer pattern which may be sequentially stacked from the outer sidewall of the vertical channel 145. The blocking layer pattern may include silicon oxide or a metal oxide such as hafnium oxide or aluminum oxide. The charge storage layer pattern may include a nitride such as silicon nitride or a metal oxide, and the tunnel insulation layer pattern may include an oxide such as silicon oxide. For example, the dielectric layer structure 140 may have an oxide-nitride-oxide (ONO) layer structure.

A pad 155 may be formed on the first filling layer pattern 150, the vertical channel 145 and the dielectric layer structure 140 to fill an upper portion of the channel hole 120. The pad 155 may serve as a source/drain region through which charges are moved or transferred into the vertical channel 145. The pad 155 may include a semiconductor and may be doped with impurities. For example, the pad 155 may include polysilicon or single crystalline silicon. The pad 155 may further include n-type impurities, for example, phosphorus (P) or arsenic (As).

The gate lines 180 may be disposed on the outer sidewall of the dielectric layer structure 140 to be spaced apart from each other in the first direction. In example embodiments, each gate line 180 may surround the vertical channels 145 included in at least one channel row and may extend in the third direction.

FIG. 1 illustrates that one gate line 180 surrounds four channel rows, however, the number of the channel rows surrounded by each gate line 180 are not specifically limited.

The gate line 180 may include a metal having a low electrical resistance and/or a nitride thereof. For example, the gate line 180 may include tungsten (W), tungsten nitride, titanium (Ti), titanium nitride, tantalum (Ta), tantalum nitride, platinum (Pt), or the like. In example embodiments, the gate line 180 may have a multi-layered structure including a barrier layer formed of a metal nitride and a metal layer.

For example, a lowermost gate line 180a may serve as a ground selection line (GSL). Four gate lines 180b, 180c, 180d and 180e on the GSL may serve as word lines. An uppermost gate line 180f on the word lines may serve as a string selection lines (SSL).

As described above, the GSL, the word lines, and the SSL may be formed at a single level, four levels and a single level, respectively. However, the number of levels at which the GSL, the word line and the SSL are formed are not specifically limited. In example embodiments, the GSL and the SSL may be formed at two levels, respectively, and the word line may be formed at 2, 8 or 16 levels. The stacked number of the gate lines 180 may be determined in consideration of a circuit design and a degree of integration of the vertical memory device.

In example embodiments, the GSL 180a may surround an outer sidewall of the semiconductor pattern 130. In this case, a gate insulation layer (not illustrated) may be further formed between the GSL 180a and the semiconductor pattern 130. Thus, a ground selection transistor (GST) including the GSL may be defined.

Insulating interlayer patterns 116 (116a through 116g) may be disposed between the gate lines 180 neighboring the first direction. The insulating interlayer patterns 116 may include a silicon oxide based material, e.g., silicon dioxide ($SiO_2$), silicon oxycarbide (SiOC) or silicon oxyfluoride (SiOF), but not limited thereto. The gate lines 180 included in one string or one cell block may be insulated from each other by the insulating interlayer patterns 116.

An opening 160 may be formed through the gate lines and the insulating interlayer patterns 116 and between some of the channel rows neighboring in the second direction. The opening 160 may extend in the third direction. The opening 160 may be provided as a gate line cut region by which the gate lines 180 may be divided by a desired (and/or alternatively predetermined) unit. In example embodiments, the top surface of the channel layer 106 may be exposed by the opening 160. A second filling layer pattern 181 may be formed in the opening 160 to at least partially fill the opening 160.

An impurity region 108 may be formed at an upper portion of the channel layer 106 exposed by the channel layer 160. The impurity region 108 may extend in the third direction and serve as a common source line (CSL) of the vertical memory device. The impurity region 108 may include n-type impurities such as P or As. In example embodiments, a metal silicide pattern (not illustrated) such as a cobalt silicide pattern and/or a nickel silicide pattern may be further formed on the impurity region 108.

In example embodiments, a first CSL contact 185 may extend through the second filling layer pattern 181 in the first direction such that the first CSL contact 185 may be in contact with or electrically connected to the impurity region 108. An outer sidewall of the first CSL contact 185 may be surrounded by the second filling layer pattern 181.

An upper insulation layer 190 may be formed on an uppermost insulating interlayer pattern 116g, the second filling layer pattern 181, the first CSL contact 185 and the pad 155. A second CSL contact 192 and a bit line contact 194 may be formed through the upper insulation layer 190 to contact the first CSL contact 185 and the pad 155, respectively. A plurality of the bit line contacts 194 may form an array substantially comparable to an arrangement of the pads 155.

A bit line 198 may be disposed on the upper insulation layer 190 to be electrically connected to a plurality of the bit line contacts 194. As illustrated in FIG. 1, the bit line 198 may extend in the second direction, and a plurality of the bit lines 198 may be arranged in the third direction. In example embodiments, the bit line 198 may extend in the third direction and may be electrically connected to the pads 155 included in one channel row.

Additionally, a CSL wiring 196 may be disposed on the upper insulation layer 190 to be electrically connected to the second CSL contact 192. For example, the CSL wiring 196 may extend in the third direction.

The lower structure disposed under the channel layer 106 may include a lower insulation layer 100 and a low resistance layer 102 thereon. In example embodiments, an ohmic contact layer 104 may be further formed between the low resistance layer 102 and the channel layer 106. A resistance of the low resistance layer 102 may be less than a resistance of the channel layer 106. In example embodiments, the resistance of the low resistance layer may be also less than a resistance of the ohmic contact layer 104. The resistance of the ohmic contact layer 104 may be less than the resistance of the channel layer 106.

The lower insulation layer 100 may cover, e.g., a peripheral circuit formed on a semiconductor substrate. The lower insulation layer 100 may include silicon oxide, e.g., plasma enhanced oxide (PEOX), tetraethyl orthosilicate (TEOS), boro tetraethyl orthosilicate (BTEOS), phosphorous tetraethyl orthosilicate (PTEOS), boro phospho tetraethyl orthosilicate (BPTEOS), boro silicate glass (BSG), phospho silicate glass (PSG), boro phospho silicate glass (BPSG), or the like.

The low resistance layer 102 may include a metal, a metal nitride or a metal silicide. For example, the low resistance layer 102 may include a metal, e.g., tungsten (W), cobalt (Co), titanium (Ti), aluminum (Al and/or nickel (Ni), a nitride thereof and/or a silicide thereof.

The ohmic contact layer 104 may be provided for reducing a contact resistance generated between the channel layer 106 and the low resistance layer 102. In example embodiments, the ohmic contact layer 104 may include a semiconductor doped with impurities. For example, the ohmic contact layer 140 may include polysilicon doped with p-type impurities. In this case, an impurity concentration of the ohmic contact layer 104 may be greater than that of the channel layer 106.

According to example embodiments described above, the low resistance layer 102 may be disposed under the channel layer 106 so that a resistance of the channel layer 106 serving as, e.g., the p-well may be reduced. In a case that the vertical memory device is disposed on the peripheral circuit, a polysilicon layer may be deposited to form the channel layer 106. The polysilicon layer may have a resistance greater than that of a single crystalline substrate due to defects therein. Thus, the low resistance layer 102 may be formed under the channel layer 106 so that a resistance of the p-well may be reduced. Further, an operational speed of the vertical memory device may be improved and a leakage current from the vertical memory device may be decreased.

FIGS. 2 to 16 are cross-sectional views illustrating a method of manufacturing a vertical memory device in accordance with example embodiments. For example, FIGS. 2 to 16 illustrate a method of manufacturing the vertical memory device of FIG. 1.

Referring to FIG. 2, a low resistance layer 102 and a channel layer 106 may be formed sequentially on a lower insulation layer 100. An ohmic contact layer 106 may be further formed between the low resistance layer 102 and the channel layer 106.

The lower insulation layer 100 may be formed using silicon oxide such as PEOX, TEOS, BTEOS, PTEOS, BPTEOS, BSG, PSG and/or BPSG. In example embodiments, the lower insulation layer 100 may be formed on a semiconductor substrate on which a peripheral circuit may be formed. The lower insulation layer 100 may be formed by a deposition process such as a chemical vapor deposition (CVD) process, a plasma enhanced chemical vapor deposition (PECVD) process, a low pressure chemical vapor deposition (LPCVD) process, a high density plasma chemical vapor deposition (HDP-CVD) process, a spin coating process, etc.

In example embodiments, the low resistance layer 102 may be formed using a metal such as W, Co, Ti, Al, Ni and/or the like, a nitride thereof, and/or a silicide thereof. The low resistance layer 102 may be formed by a deposition process, a sputtering process, a physical vapor deposition (PVD) process, an atomic layer deposition (ALD) process, a CVD process, etc. If the low resistance layer 102 includes a metal silicide, a polysilicon layer and a metal layer may be formed on the lower insulation layer 100. The polysilicon layer and the metal layer may be reacted with each other by an annealing process to obtain the low resistance layer 102.

The ohmic contact layer 104 and the channel layer 106 may be formed using polysilicon doped with p-type impurities by, e.g., a sputtering process, an ALD process and/or a PVD process.

In example embodiments, the ohmic contact layer 104 may have an impurity concentration that is greater than that of the channel layer 106. In this case, the ohmic contact layer 104 may be provided as a p+ layer, and the channel layer 106 may serve as a p-well. The channel layer 106 may have a thickness greater than that of the ohmic contact layer 104.

Figure 3:
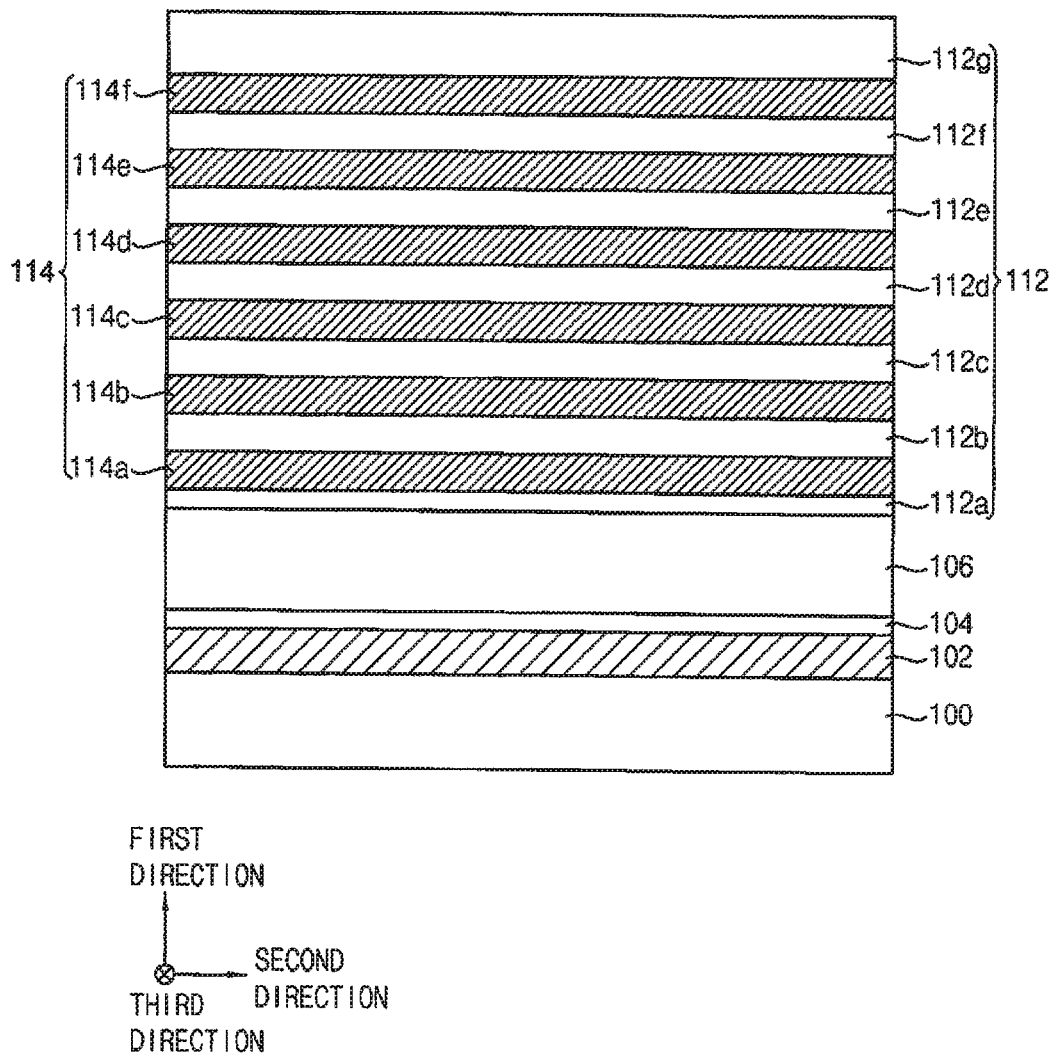

Referring to FIG. 3, an insulating interlayer 112 and a sacrificial layer 114 may be alternately and repeatedly formed on the channel layer 106. In example embodiments, a plurality of the insulating interlayers 112 (112a through 112g) and a plurality of the sacrificial layers 114 (114a through 104f) may be alternately formed on each other at a plurality of levels.

The insulating interlayer 112 may be formed using a silicon oxide based material, e.g., silicon dioxide, silicon oxycarbide and/or silicon oxyfluoride. The sacrificial layer 114 may be formed using a material that may have an etching selectivity with respect to the insulating interlayer 112 and may be easily removed by a wet etching process. For example, the sacrificial layer 114 may be formed using a silicon nitride and/or silicon boronitride (SiBN).

The insulating interlayer 112 and the sacrificial layer 114 may be formed by a CVD process, a PECVD process, an ALD process, etc. A lowermost insulating interlayer 112a may be formed by a thermal oxidation process on the channel layer 106.

The sacrificial layers 114 may be removed in a subsequent process to provide spaces for a GSL, a word line and an SSL. Thus, the number of the insulating interlayers 112 and the sacrificial layers 114 may be adjusted in consideration of the number of the GSL, the word line and the SSL. In example embodiments, each of the GSL and the SSL may be formed at a single level, and the word line may be formed at 4 levels. Accordingly, the sacrificial layers 114 may be formed at 6 levels, and the insulating interlayers 112 may be formed at 7 levels as illustrated in FIG. 3. In example embodiments, each of the GSL and the SSL may be formed at 2 levels, and the word line may be formed at 2, 8 or 16 levels. In this case, the sacrificial layers 114 may be formed at 6, 12 or 20 levels, and the insulating interlayers 112 may be formed at 7, 13 or 21 levels. However, the number of the GSL, the SSL and the word lines may not be limited to the examples provided herein.

Figure 4:
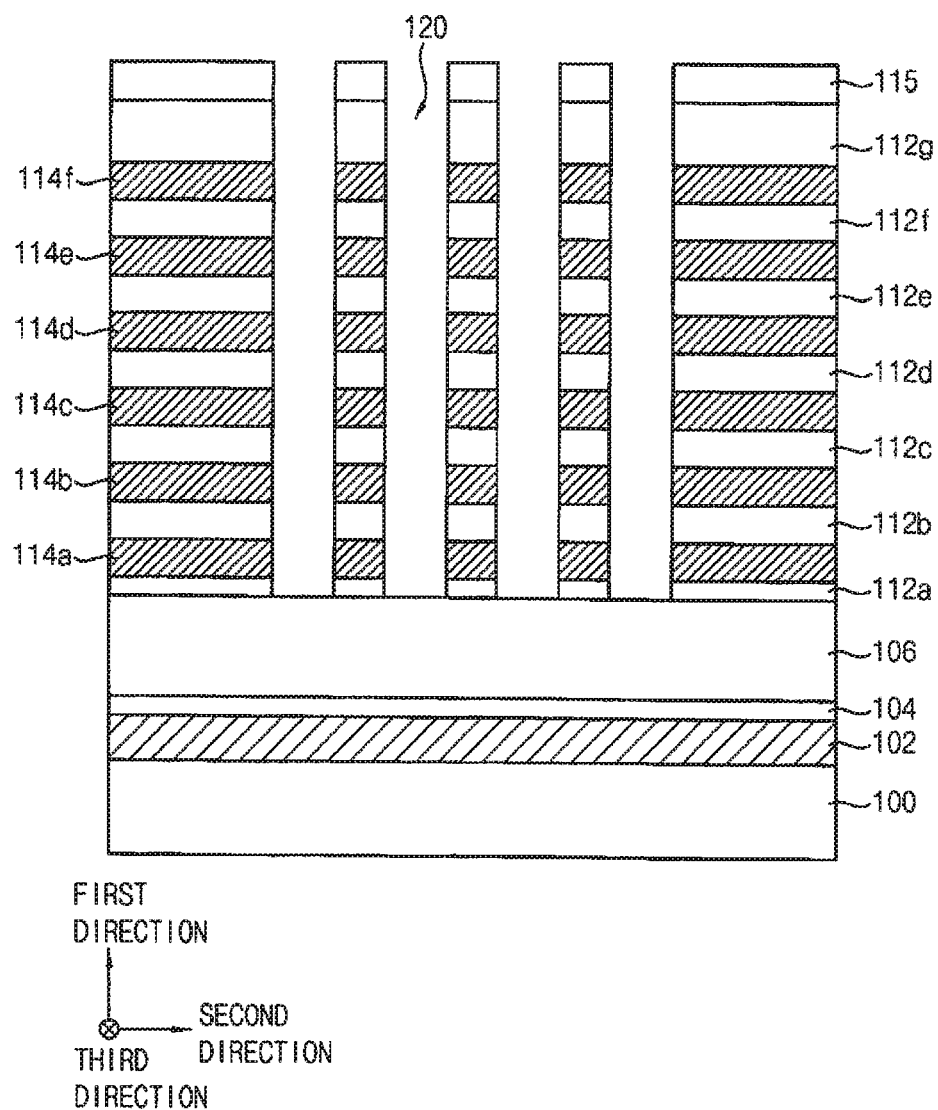

Referring to FIG. 4, a channel hole 120 may be formed through the insulating interlayers 112 and the sacrificial layers 114.

For example, a hard mask 115 may be formed on an uppermost insulating interlayer 112g. The insulating interlayers 112 and the sacrificial layers 114 may be partially etched by performing, e.g., a dry etching process. The hard mask 115 may be used as an etching mask to form the channel hole 120. A top surface of the channel layer 106 may be partially exposed by the channel hole 120. The channel hole 120 may extend in the first direction from the top surface of the channel layer 106. The hard mask 115 may include a material that may have an etching selectivity with respect to the insulating interlayers 112 and the sacrificial layers 114. For example, the hard mask 110 may include silicon-based or carbon-based spin-on hardmask (SOH) materials, and/or a photoresist material.

In example embodiments, a plurality of the channel holes 120 may be formed in the third direction to form a channel hole row. A plurality of the channel hole rows may be formed in the second direction to define a channel hole array.

In example embodiments, an upper portion of the channel layer 106 may be partially removed during the formation of the channel hole 120. In this case, the channel hole 120 may extend through the upper portion of the channel layer 106.

Figure 5:
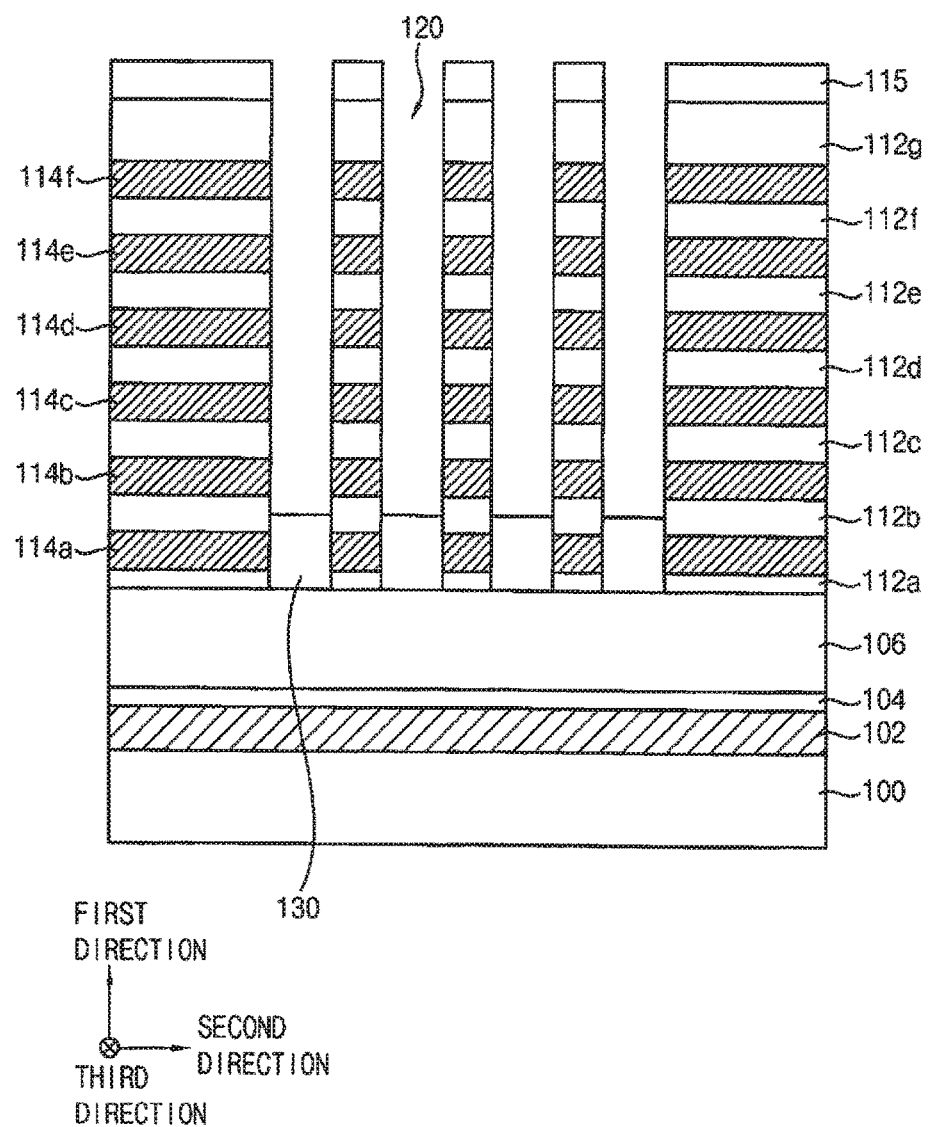

Referring to FIG. 5, a semiconductor pattern 130 filling a lower portion of the channel hole 120 may be formed.

In example embodiments, the semiconductor pattern 130 may be formed by a selective epitaxial growth (SEG) process using the top surface of the channel layer 106 as a seed. Accordingly, the semiconductor pattern 130 may be formed to include polysilicon or single crystalline silicon. In example embodiments, an amorphous silicon layer filling the channel hole 120 may be formed, and then a laser epitaxial growth (LEG) process or a solid phase epitaxy (SPE) process may be performed on the amorphous silicon layer to obtain the semiconductor pattern 130.

In example embodiments, a top surface of the semiconductor pattern 130 may be located between a top surface of a first sacrificial layer 114a and a bottom of a second sacrificial layer 114b. Accordingly, the semiconductor pattern 130 may serve as a channel for a GSL 180a (see FIG. 13) replacing the first sacrificial layer 114a to define a GST.

Figure 6:
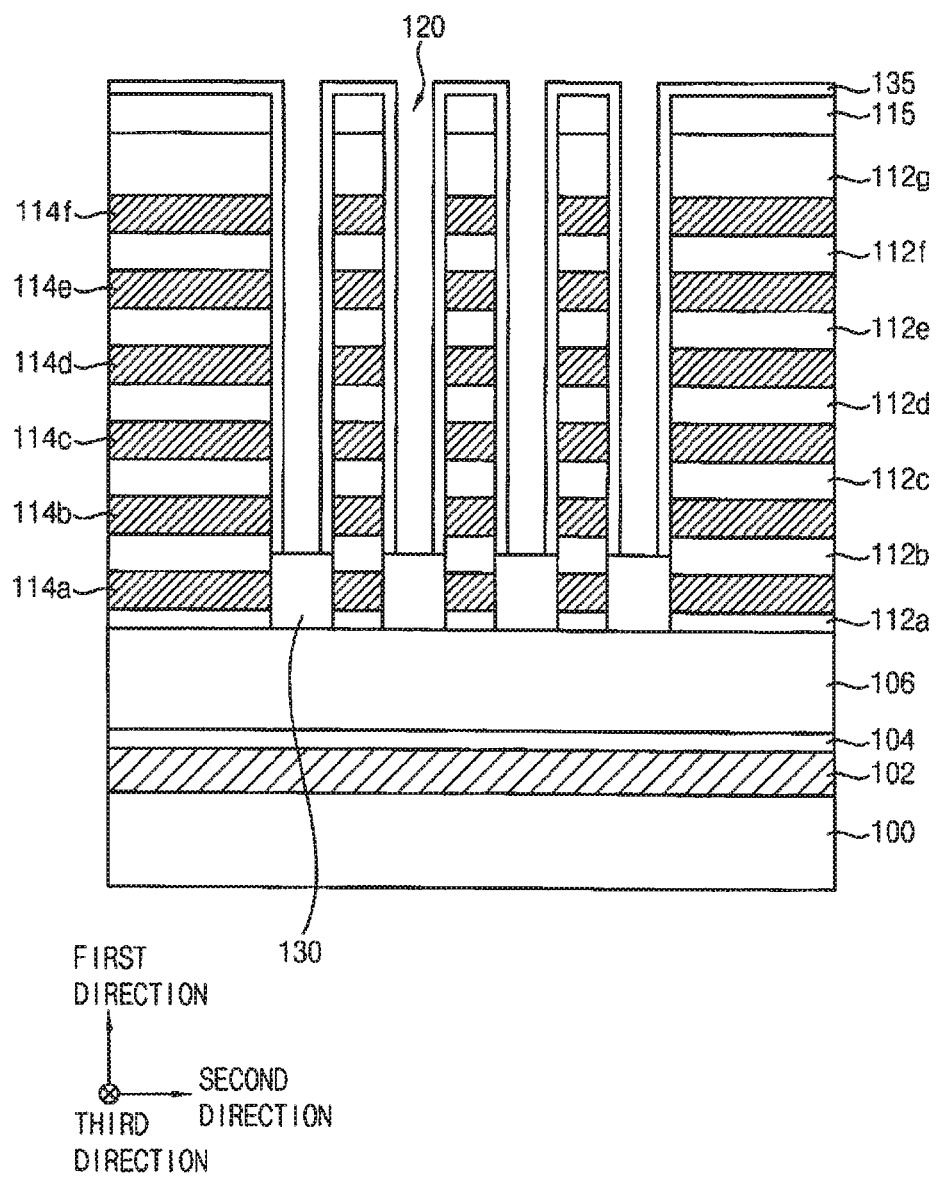

Referring to FIG. 6, a dielectric layer 135 may be formed conformably on a surface of the hard mask 115, a sidewall of the channel hole 120 and the top surface of the semiconductor pattern 130. A portion of the dielectric layer 135 formed on the top surface of the semiconductor pattern 130 may be partially removed by, e.g., an anisotropic etching process. Accordingly, a central bottom of the dielectric layer 135 may be opened in the channel hole 120 so that the top surface of the semiconductor pattern 130 may be exposed again.

In example embodiments, a blocking layer, a charge storage layer and a tunnel insulation layer may be sequentially formed to obtain the dielectric layer 135. For example, the blocking layer may be formed using an oxide, e.g., silicon oxide, the charge storage layer may be formed using silicon nitride or a metal oxide, and the tunnel insulation layer may be formed using an oxide, e.g., silicon oxide. In example embodiments, the dielectric layer 135 may have an oxide-nitride-oxide (ONO) layer structure. The blocking layer, the charge storage layer and the tunnel insulation layer may be formed by a CVD process, a PECVD process, an ALD process, etc.

Figure 7:
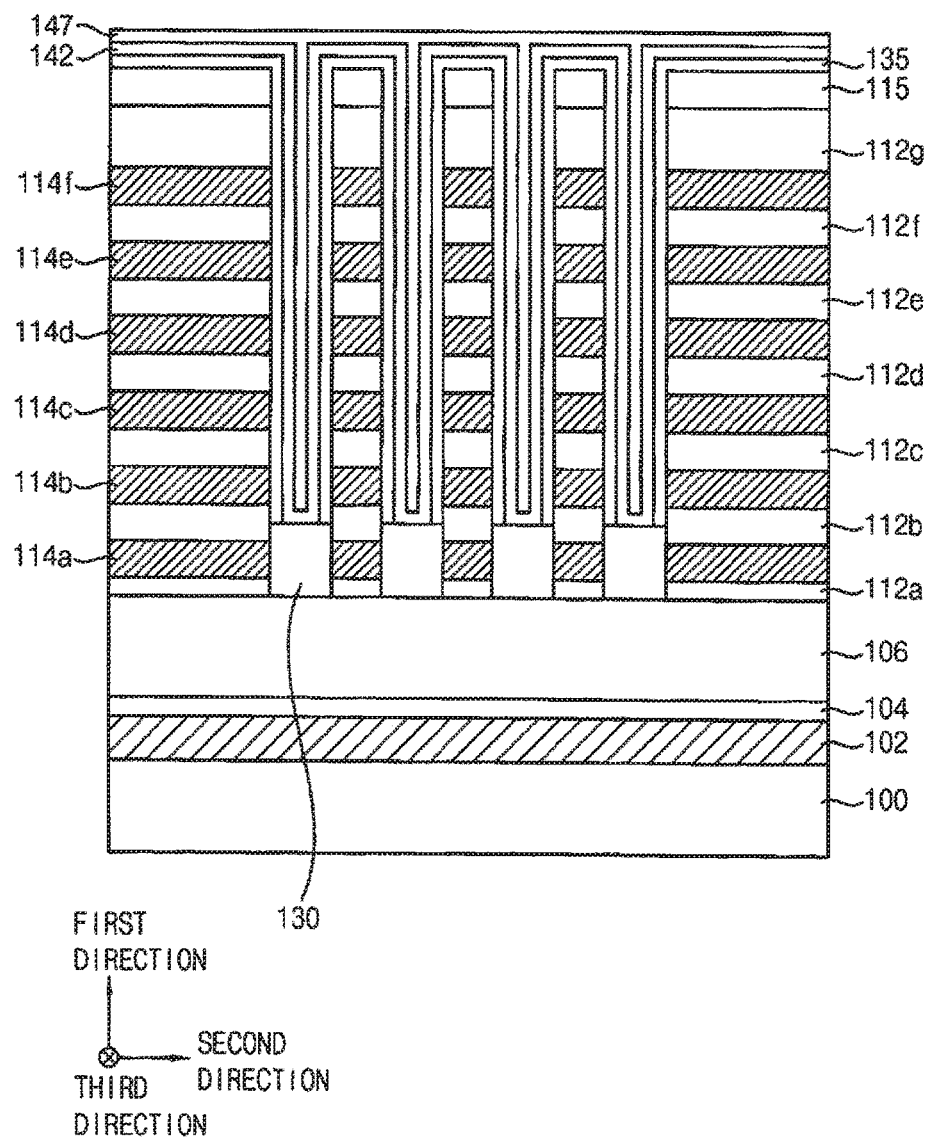

Referring to FIG. 7, a vertical channel layer 142 may be formed on the dielectric layer 135 and the exposed top surface of the semiconductor pattern 130. A first filling layer 147 may be formed on the vertical channel layer 142 to sufficiently fill a remaining portion of the channel hole 120. The vertical channel layer 142 may be formed using a semiconductor that may be doped with impurities. For example, the vertical channel layer 142 may be formed using polysilicon or amorphous silicon optionally doped with impurities. In example embodiments, a heat treatment or a laser beam irradiation may be further performed on the vertical channel layer 142. In this case, the vertical channel layer 142 may include single crystalline silicon and defects in the vertical channel layer 142 may be cured. The first filling layer 147 may be formed using an insulation material, e.g., silicon oxide and/or silicon nitride.

The vertical channel layer 142 and the first filling layer 147 may be formed by a deposition process such as a CVD process, a PECVD process, a PVD process, an ALD process, etc.

In example embodiments, the vertical channel layer 142 may be formed to sufficiently fill the channel hole 120. In this case, the formation of the first filling layer 147 may be omitted.

Figure 8:
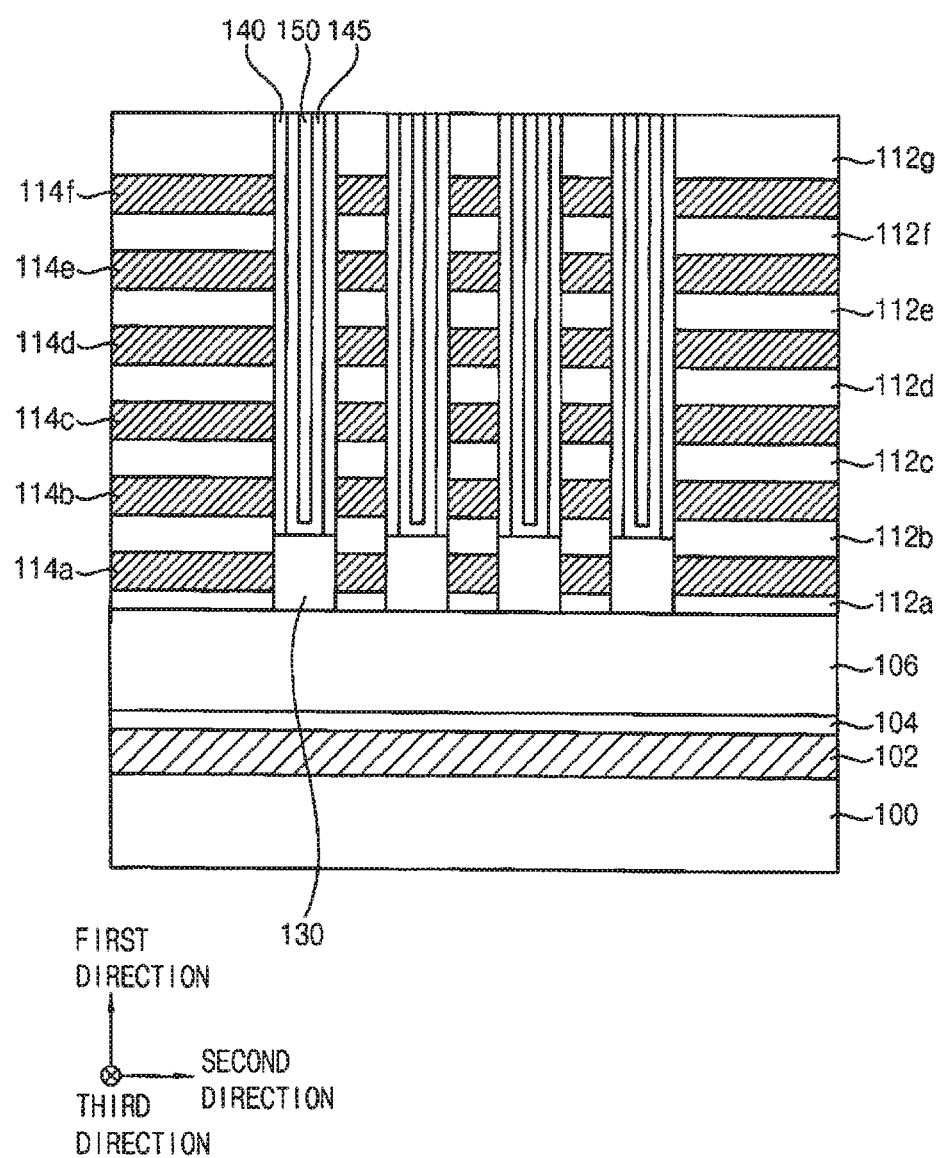

Referring to FIG. 8, the first filling layer 147, the vertical channel layer 142, the dielectric layer 135 and the hard mask 115 may be planarized until a top surface of the uppermost insulating interlayer 112g is exposed to form a dielectric layer structure 140, a vertical channel 145 and a first filling layer pattern 150 sequentially stacked in the channel hole 120. The planarization process may include an etch-back process or a chemical mechanical polish (CMP) process.

In example embodiments, the dielectric layer structure 140 may have a substantially hollow cylindrical shape of which a central bottom is opened, or a straw shape. The vertical channel 145 may have a substantially cup shape. The first filling layer pattern 150 may have a substantially solid cylindrical shape or a substantially pillar shape. The dielectric layer structure 140 may have a multi-layered structure including the tunnel insulation layer, the charge storage layer and the blocking layer sequentially stacked from an outer sidewall of the vertical channel 145.

In example embodiment, if the vertical channel layer 142 fully fills the channel hole 120, the first filling layer pattern 150 may be omitted and the vertical channel 145 may have a substantially solid cylindrical shape or a substantially pillar shape.

As the vertical channel 145 is formed in each channel hole 120, a channel array may be formed substantially comparable to the channel hole array. For example, a plurality of the vertical channels 145 may be arranged in the third direction to form a channel row, and a plurality of the channel rows may be arranged in the second direction to form the channel array.

Figure 9:
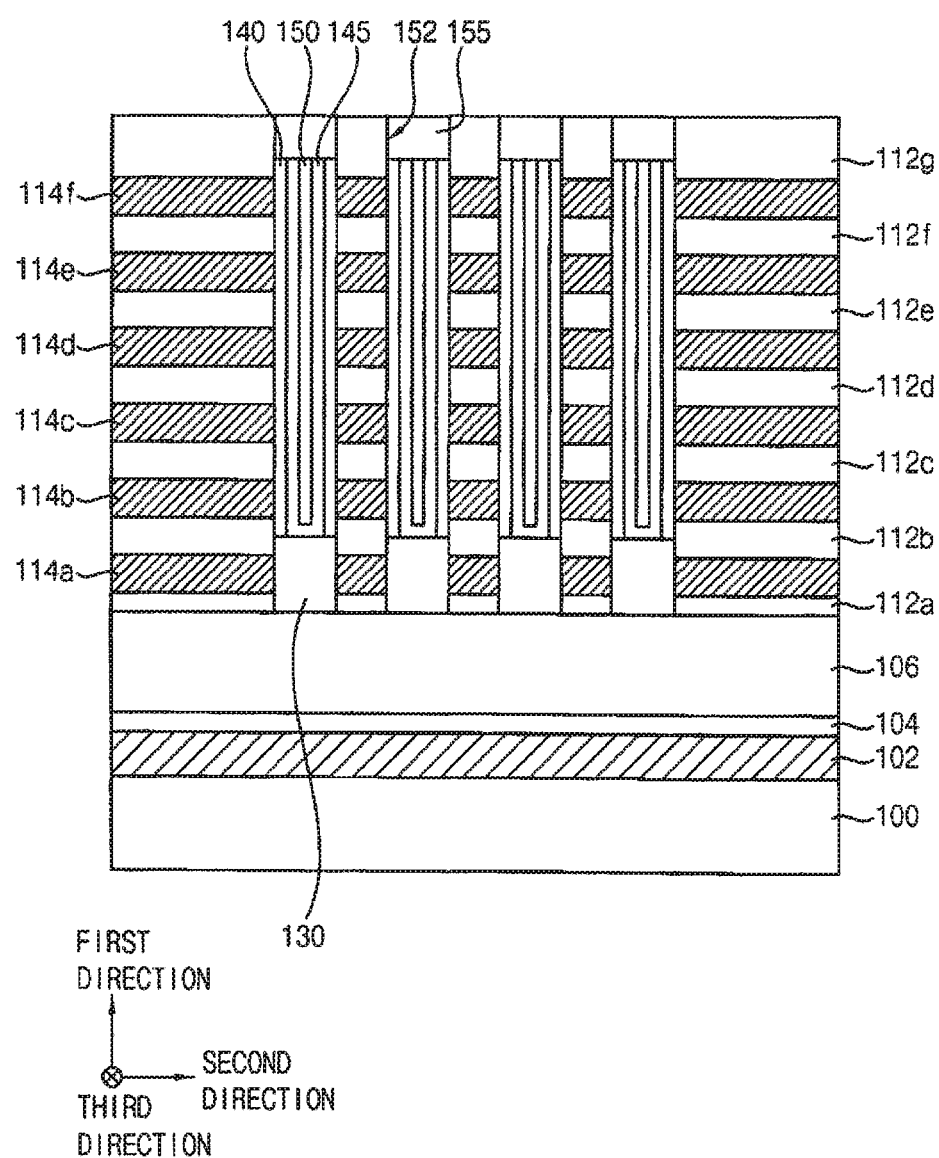

Referring to FIG. 9, upper portions of the dielectric layer structure 140, the vertical channel 145 and the first filling layer pattern 150 may be partially removed by, e.g., an etch-back process to form a recess 152. A pad layer may be formed on the dielectric layer structure 140, the vertical channel 145, the first filling layer pattern 150 and the uppermost insulating interlayer 112g to sufficiently fill the recess 152. An upper portion of the pad layer may be planarized until the top surface of the uppermost insulating interlayer 112g is exposed to form a pad 155 from a remaining portion of the pad layer. In example embodiments, the pad layer may include polysilicon optionally doped with n-type impurities. In example embodiments, a preliminary pad layer including amorphous silicon may be formed, and then a crystallization process may be performed thereon to form the pad layer. The planarization process may include a CMP process or the like.

Figure 10:
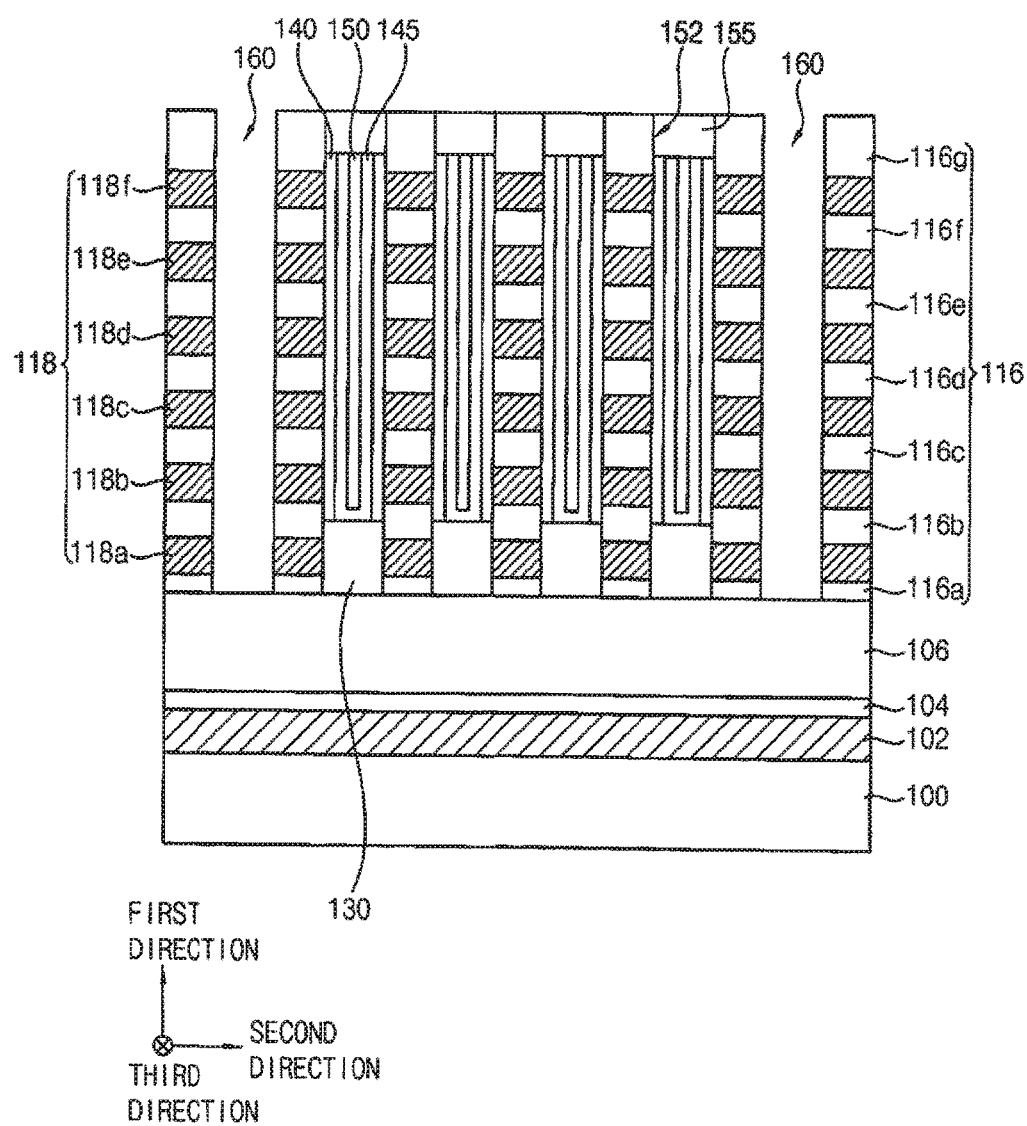

Referring to FIG. 10, an opening 160 may be formed through the insulating interlayers 112 and the sacrificial layers 114.

In example embodiments, a hard mask (not illustrated) covering the pads 155 may be formed on the uppermost insulating interlayer 112g, and then the insulating interlayers 112 and the sacrificial layers 114 may be partially etched by, e.g., a dry etching process using the hard mask as an etching mask to form the opening 160. The hard mask may be formed using a photoresist material or an SOH material. The hard mask may be removed by an ashing process and/or a strip process after the formation of the opening 160.

In example embodiments, a plurality of the openings 160 may be formed in the second direction. The opening 160 may extend in the third direction. The opening 160 may be formed between some of the channel rows neighboring in the second direction. The opening 160 may be provided as a gate line cut region.

By the formation of the opening 160, the insulating interlayers 112 and the sacrificial layers 114 may be changed into insulating interlayer patterns 116 (116a through 116g) and sacrificial layer patterns 118 (118a through 118f). The insulating interlayer pattern 116 and the sacrificial layer pattern 118 at each level may extend in the third direction. The top surface of the channel layer 106, and sidewalls of the insulating interlayer patterns 116 and the sacrificial layer patterns 118 may be exposed through the opening 160.

Figure 11:
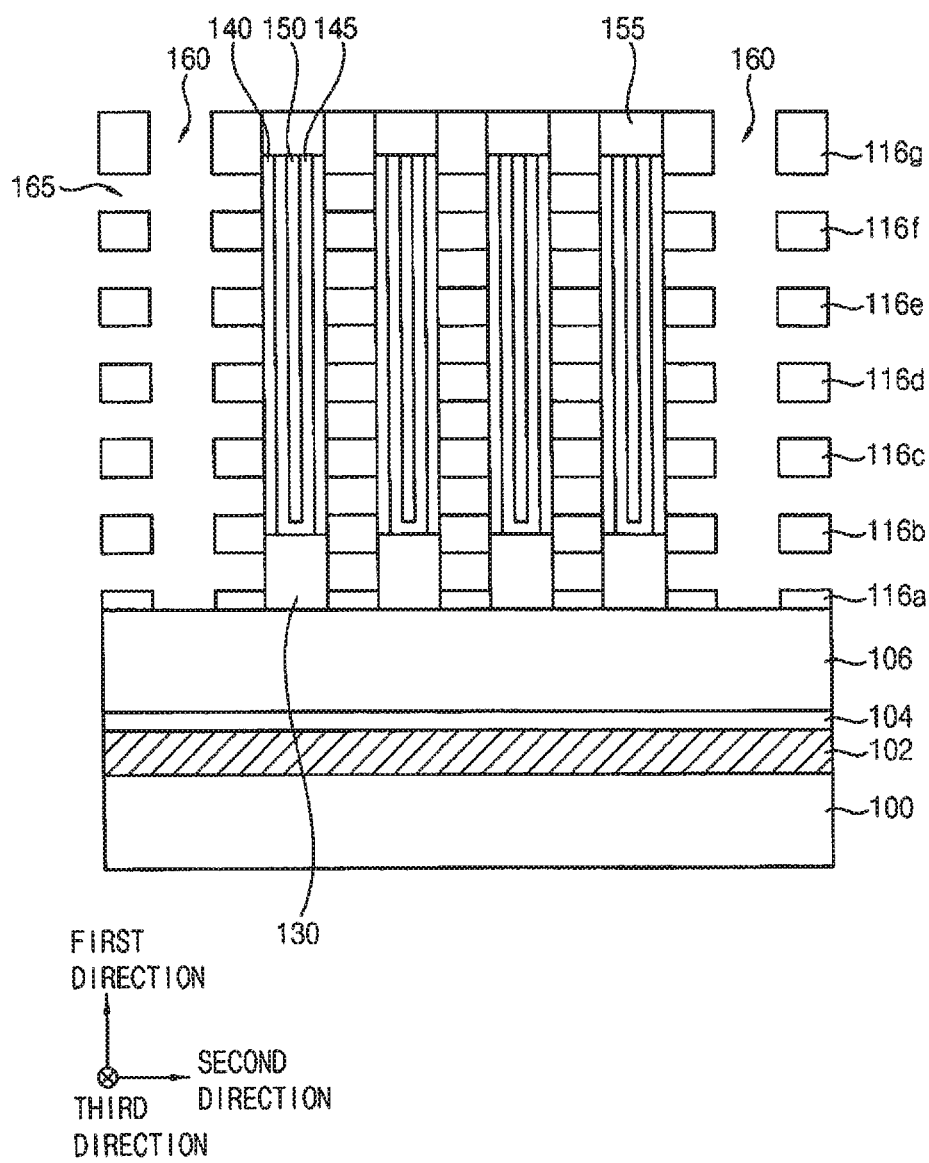

Referring to FIG. 11, the sacrificial layer patterns 118, the sidewalls of which are exposed by the opening 160 may be removed. In example embodiments, the sacrificial layer patterns 118 may be removed by a wet etching process using, e.g., phosphoric acid and/or sulfuric acid as an etchant solution.

A gap 165 may be defined by a space from which the sacrificial layer pattern 118 is removed. A plurality of the gaps 165 may be formed along the first direction. Each gap 165 may be formed between the adjacent insulating interlayer patterns 116. Outer sidewalls of the dielectric layer structure 140 and the semiconductor pattern 130 may be at least partially exposed by the gap 165.

Figure 12:
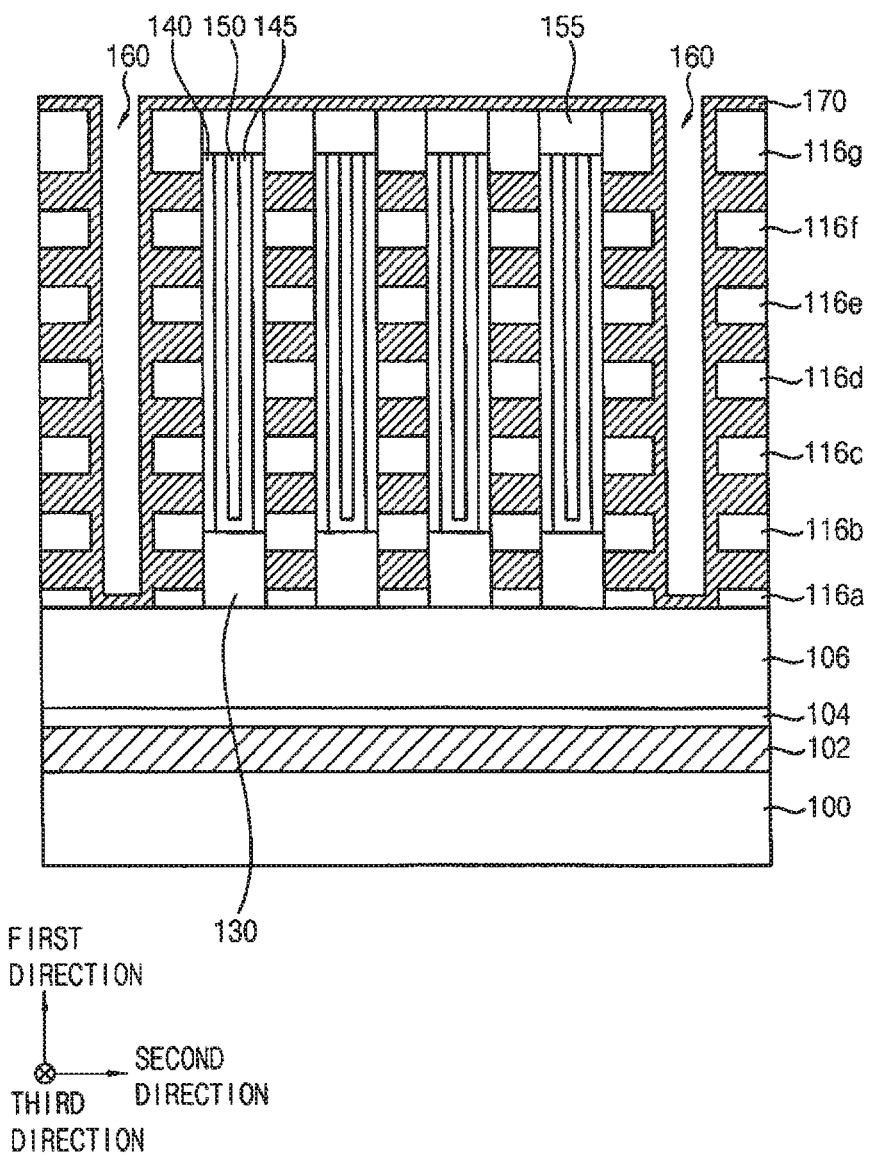

Referring to FIG. 12, a gate electrode layer 170 may be formed on the exposed outer sidewalls of the dielectric layer structure 140 and the semiconductor pattern 130, surfaces of the insulating interlayer patterns 116, the exposed top surface of the channel layer 106 and a top surface of the pad 155. The gate electrode layer 165 may sufficiently fill the gaps 165 and at least partially fill the opening 160.

The gate electrode layer 170 may be formed using a metal or a metal nitride having low electrical resistance and work function. For example, the gate electrode layer 170 may be formed using tungsten, tungsten nitride, titanium, titanium nitride, tantalum, tantalum nitride, platinum, etc. In example embodiments, the gate electrode layer 170 may be formed as a multi-layered structure including a barrier layer formed of a metal nitride and/or a metal layer. The gate electrode layer 170 may be formed by a deposition process such as a CVD process, a PECVD process, an ALD process, a PVD process, a sputtering process, etc.

In example embodiments, an additional blocking layer may be formed along inner walls of the gaps 165 and the surfaces of the insulating interlayer patterns 106 prior to the formation of the gate electrode layer 170. The additional blocking layer may be formed using silicon oxide or a metal oxide. In example embodiments, the outer sidewall of the semiconductor pattern 130 which may be exposed by the lowermost gap 165 may be thermally oxidized to form a gate insulation layer including silicon oxide.

Figure 13:
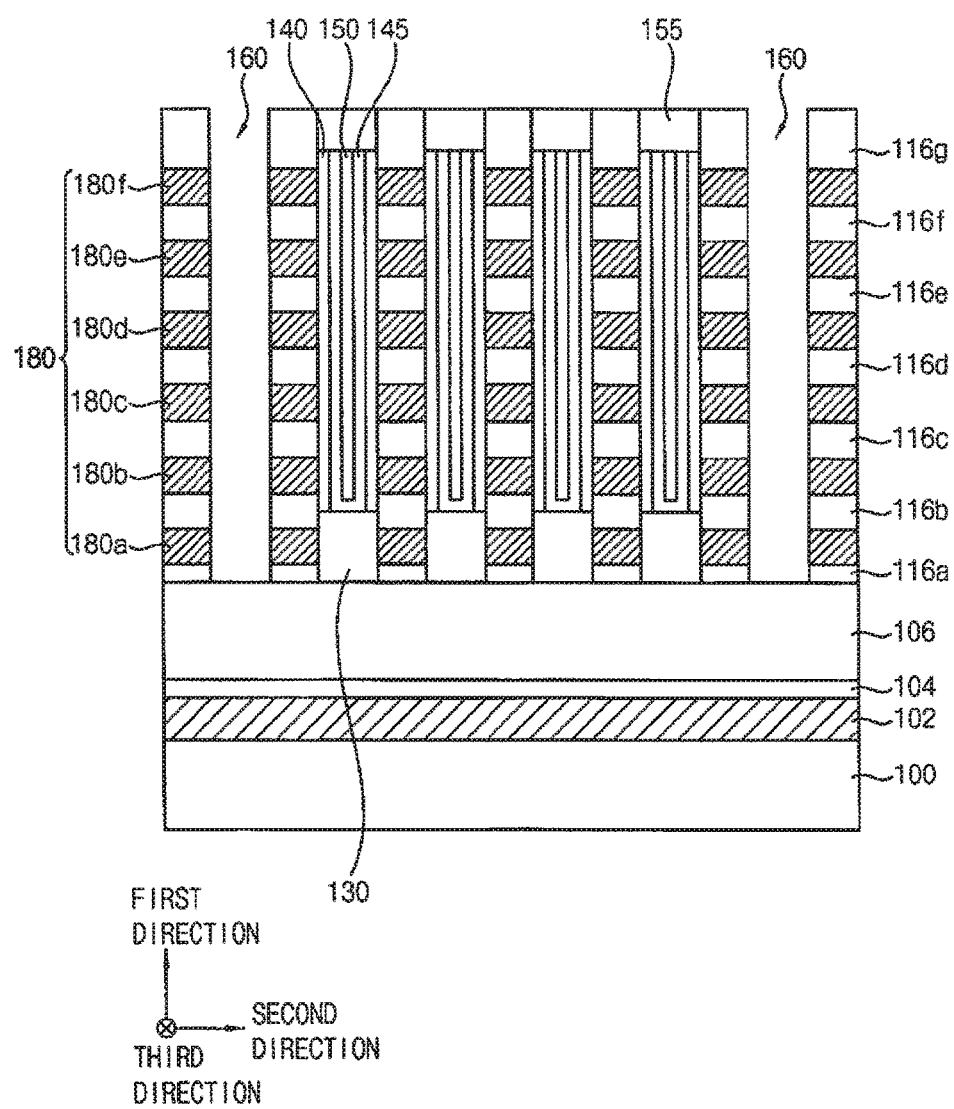

Referring to FIG. 13, the gate electrode layer 170 may be partially removed to form a gate line 180 in the gap 165 at each level.

For example, an upper portion of the gate electrode layer 170 may be planarized by a CMP process until an uppermost insulating interlayer pattern 116g is exposed. Portions of the gate electrode layer 170 formed in the opening 160 and on the top surface of the channel layer 106 may be etched to obtain the gate lines 180. The gate electrode layer 170 may be partially etched by a wet etching process using, e.g., a hydrogen peroxide-containing solution.

The gate lines 180 may include the GSL, the word line and the SSL, for example, described herein, which are sequentially stacked and spaced apart from one another in the first direction. For example, a lowermost gate lines 180a may serve as the GSL. Four gate lines 180b, 180c, 180d and 180e on the GSL may serve as the word line. An uppermost gate line 180f on the word line may serve as the SSL. As described above, the additional blocking layer or the gate insulation layer may be formed between the GSL 180a and the semiconductor pattern 130 to form a GST.

The gate line 180 at each level may partially surround the dielectric layer structure 140 and extend in the third direction. The gate line 180 at each level may surround four channel rows as illustrated in FIG. 13. However, the number of the channel rows surrounded by the gate line 180 may be determined in consideration of a constructional design of the vertical memory device.

Figure 14:
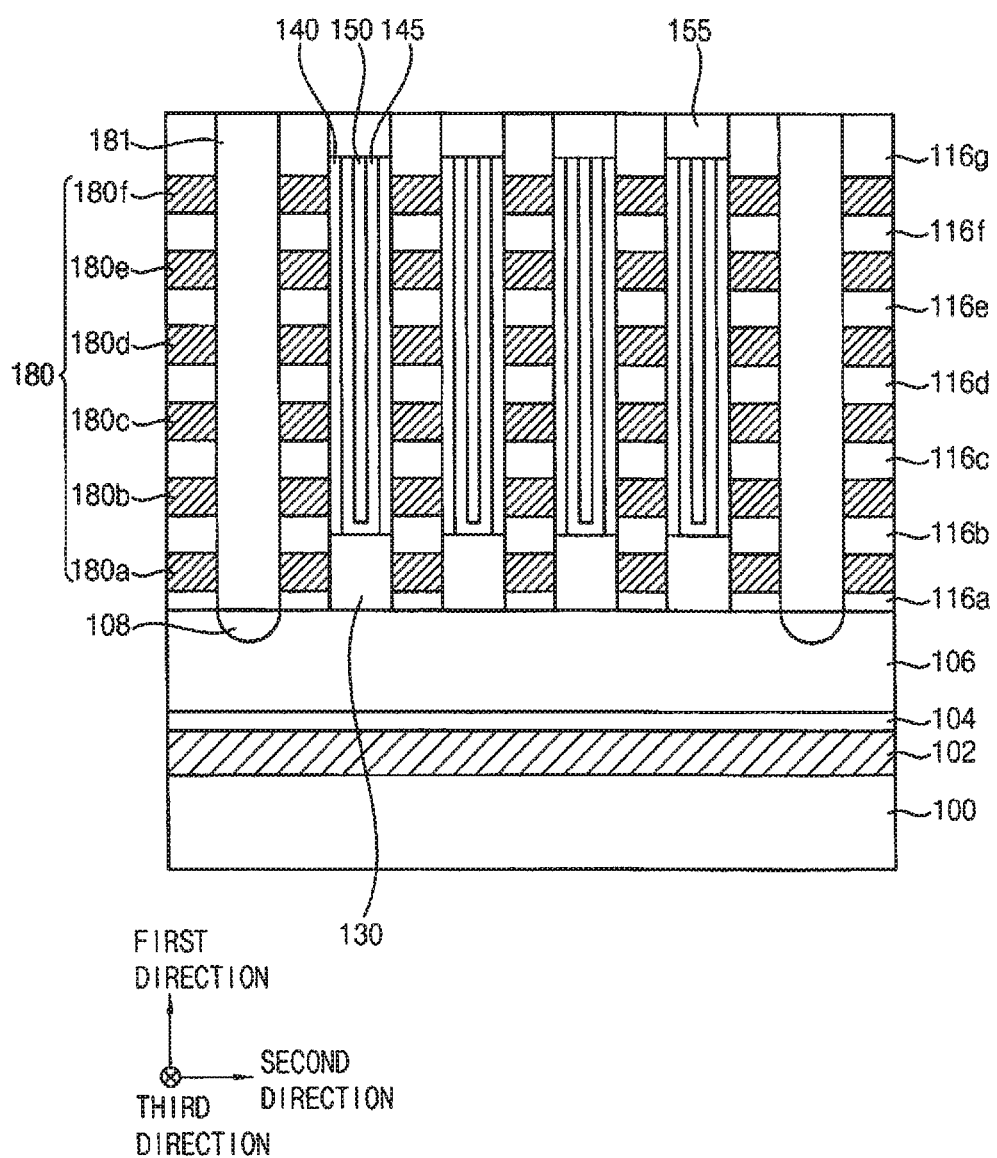

Referring to FIG. 14, an impurity region 108 may be formed at an upper portion of the channel layer 106 exposed through the opening 160, and a second filling layer pattern 181 filling the opening 160 may be formed.

In example embodiments, an ion-implantation mask (not illustrated) covering the pads 155 may be formed on the uppermost insulating interlayer pattern 116 (e.g., 116g). N-type impurities such as P or As may be implanted through the opening 160 using the ion-implantation mask to form the impurity region 108. The impurity region 108 may serve as a CSL extending in the third direction.

A metal silicide pattern (not illustrated) including, e.g., nickel silicide or cobalt silicide may be further formed on the impurity region 108.

A second filling layer sufficiently filling the opening 160 may be formed on the channel layer 106, the uppermost insulating interlayer pattern 116g and the pad 155. An upper portion of the second filling layer may be planarized by a CMP process or an etch-back process until the uppermost insulating interlayer pattern 116g is exposed to form the second filling layer pattern 181. The second filling layer may be formed using an insulation material, e.g., silicon oxide by a CVD process.

Figure 15:
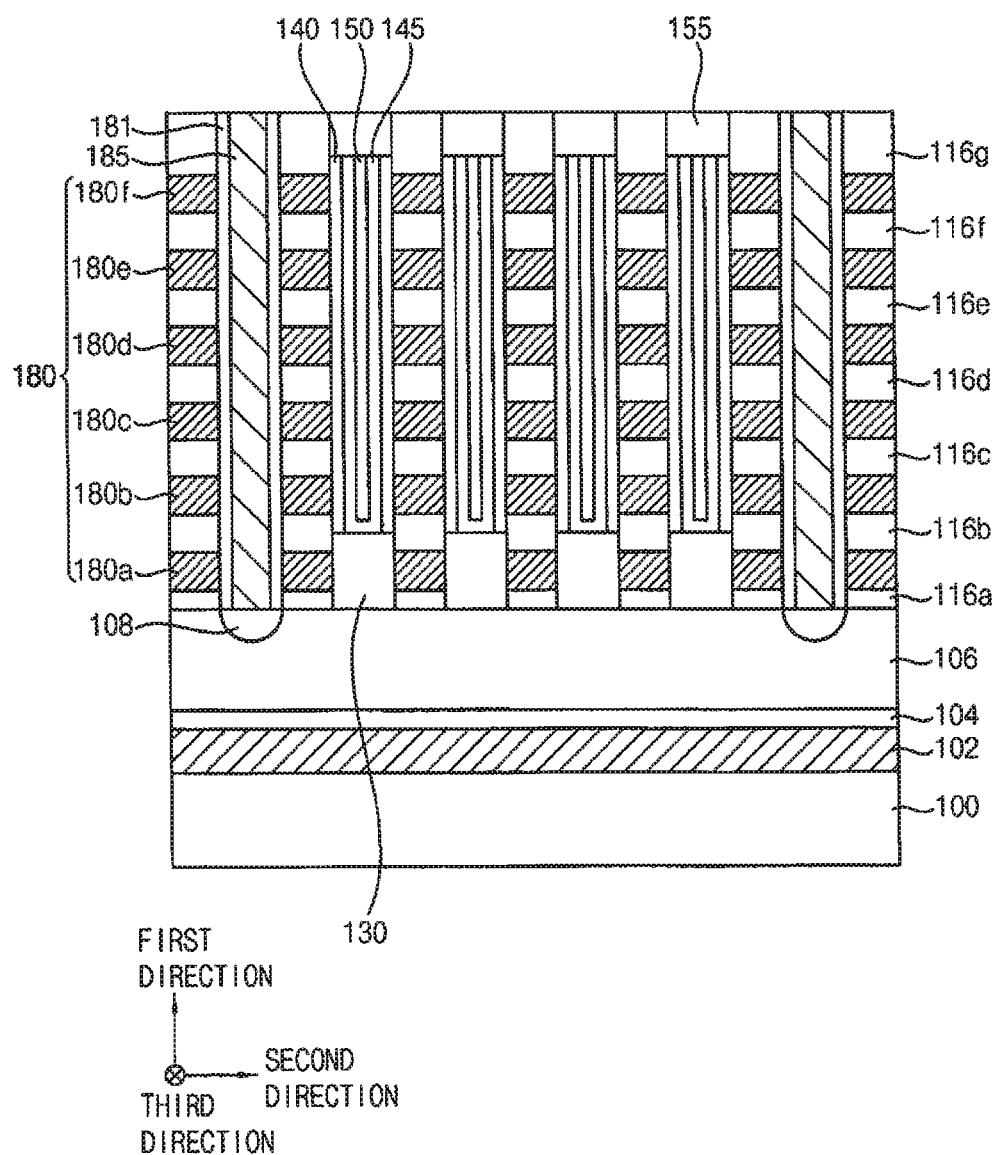

Referring to FIG. 15, a first CSL contact 185 may be formed through the second filling layer pattern 181. The first CSL contact 185 may be in contact with or electrically connected to the impurity region 108.

In example embodiments, the second filling layer pattern 181 may be partially etched along the first direction to form a CSL contact hole through which the impurity region 108 is exposed. A conductive layer sufficiently filling the CSL contact hole may be formed on the impurity region 108. An upper portion of the conductive layer may be planarized until top surfaces of the uppermost insulating interlayer pattern 116g and/or the second filling layer pattern 181 is exposed to form the first CSL contact 185. The conductive layer may be formed using a metal or metal nitride by a PVD process, an ALD process, a sputtering process, etc.

Figure 16:
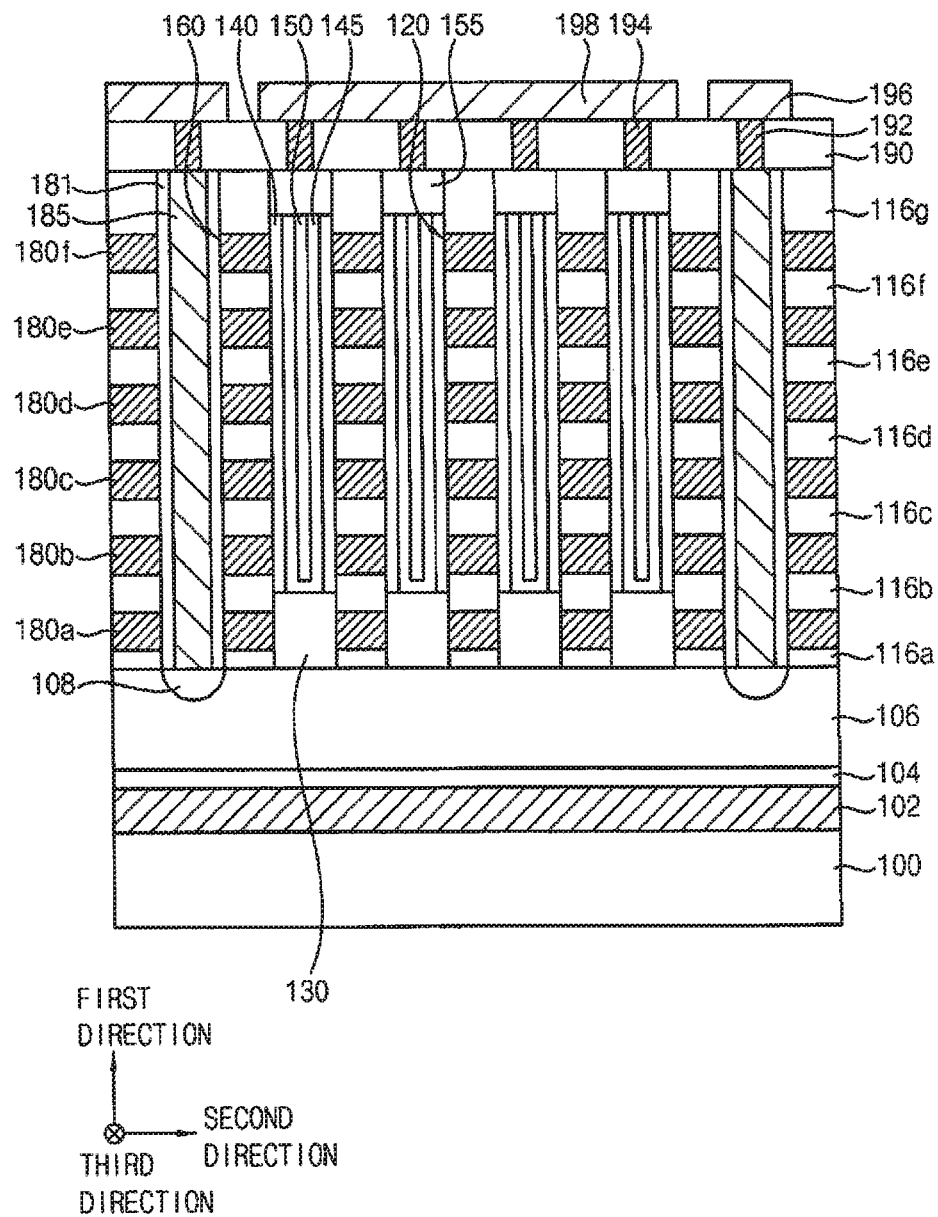

Referring to FIG. 16, an upper insulation layer 190 may be formed on the uppermost insulating interlayer pattern 116g, the second filling layer pattern 181, the first CSL contact 185 and the pad 155. The upper insulation layer 190 may be formed using an insulation material such as silicon oxide and may be formed by a deposition process such as a CVD process.

A bit line contact 194 and a second CSL contact 192 may be formed through the upper insulation layer 190 to contact the pad 155 and the first CSL contact 185, respectively. A plurality of the bit line contacts 194 may form an array substantially comparable to an arrangement of the vertical channels 145 or the pads 155. The bit line contact 194 and the second CSL contact 192 may be formed using a metal, a metal nitride and/or doped polysilicon by, e.g., a PVD process, an ALD process or a sputtering process.

A bit line 198 and a CSL wiring 196 may be formed on the upper insulation layer 190 to be electrically connected to the bit line contact 194 and the second CSL contact 192, respectively. For example, a conductive layer including a metal, a metal nitride and/or doped polysilicon may be formed on the upper insulation layer 190 by a PVD process, an ALD process or a sputtering process. The conductive layer may be patterned into the bit line 198 and the CSL wiring 196.

The bit line 198 may extend in the second direction, and a plurality of the bit lines 198 may be formed in the third direction. Alternatively, the bit line 198 may extend in the third direction to be electrically connected to the pads 155 included in one channel row. The CSL wiring 196 may extend in the third direction.

Figure 17:
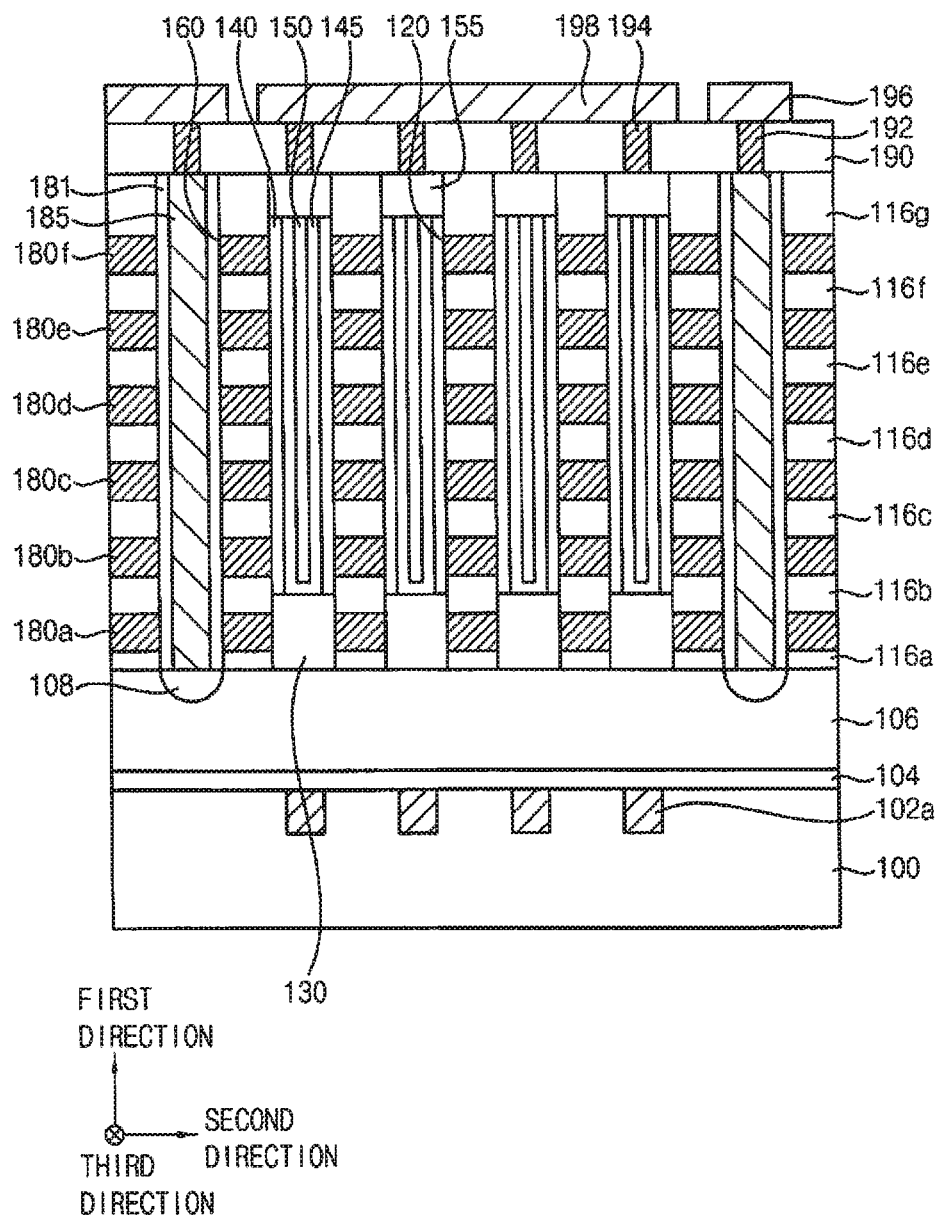
FIG. 17 is a cross-sectional view illustrating a vertical memory device in accordance with example embodiments.

FIG. 17 is a cross-sectional view illustrating a vertical memory device in accordance with example embodiments. Detailed descriptions of elements and/or constructions that are substantially the same as or similar to those illustrated with reference to FIG. 1 are omitted for brevity.

Referring to FIG. 17, a memory cell structure that is substantially the same as or similar to that illustrated in FIG. 1 may be disposed on a channel layer 106. A lower structure including a lower insulation layer 100, a low resistance layer 102a and an ohmic contact layer 104 may be disposed under the channel layer 106.

The low resistance layer 102a may include a pattern buried or embedded in the lower insulation layer 100. The low resistance layer 102a may include a plurality of the patterns. In example embodiments, each pattern of the low resistance layer 102a may extend linearly in the third direction. In this case, the low resistance layer 102a may substantially overlap a channel row including a plurality of vertical channels 145.

In example embodiments, the low resistance layer 102a may include an island-shaped pattern buried or embedded in the lower insulation layer 100. In this case, the low resistance layer 102a may substantially overlap the semiconductor pattern 130.

According to example embodiments, the low resistance layer 102a may be buried in the low insulation layer 100, and a top surface of the low resistance layer 102a may be in contact with an ohmic contact layer 104. Accordingly, a current path or a charge path having a low resistance may be provided through the low resistance layer 102a, the ohmic contact layer 104 and the channel layer 106. Thus, a current flow through the vertical channel 145 and the semiconductor pattern 130 may be facilitated.

FIGS. 18 to 21 are cross-sectional views illustrating a method of manufacturing a vertical memory device in accordance with example embodiments. For example, FIGS. 18 to 21 illustrate a method of manufacturing the vertical memory device of FIG. 17. Detailed descriptions on processes and/or materials that are substantially the same as or similar to those illustrated with reference to FIGS. 2 to 16 are omitted for brevity.

Referring to FIG. 18, an upper portion of a lower insulation layer 100 may be partially etched to form a plurality of trenches 101. In example embodiments, the trench 101 may have a linear shape extending in the third direction. In example embodiments, the trenches 101 may have a recess shape or a dent shape arranged regularly in the second and third directions.

Referring to FIG. 19, a low resistance layer 102a filling the trench 101 may be formed. In example embodiments, a conductive layer filling the trenches 101 may be formed on the lower insulation layer 100 using a metal, a metal nitride and/or a metal silicide. An upper portion of the conductive layer may be planarized by a CMP process until a top surface of the lower insulation layer 100 is exposed to form the low resistance layer 102a.

In example embodiments, the low resistance layer 102a may have a linear shape extending in the third direction. In example embodiments, the low resistance layer 102a may have an island shape filling the trench 101 and buried in the lower insulation layer 100.

Figure 20:
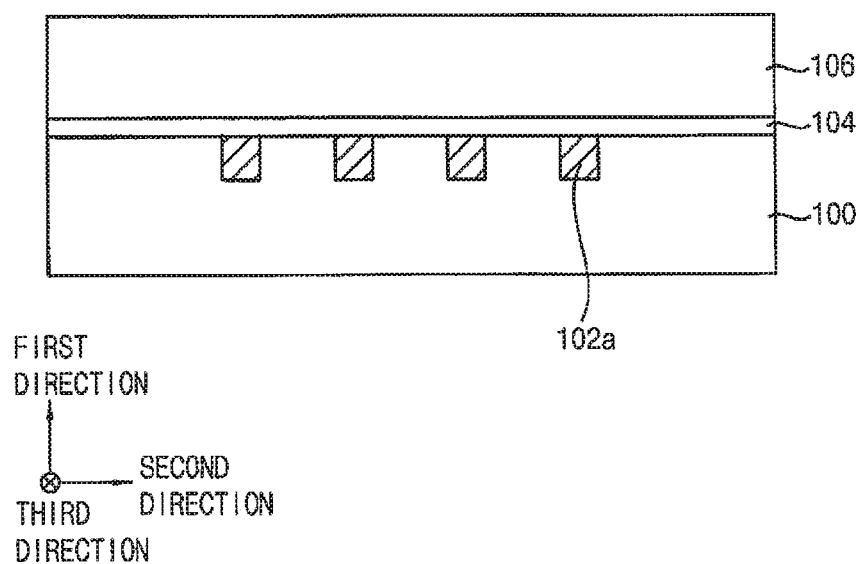

Referring to FIG. 20, an ohmic contact layer 104 and a channel layer 106 may be sequentially formed on the lower insulation layer 100 and the low resistance layer 102a.

Referring to FIG. 21, processes that are substantially the same as or similar to those illustrated with reference to FIGS. 3 to 16 may be performed to form a memory cell structure on the channel layer 106. Accordingly, a vertical memory device including the low resistance layer 102a under the channel layer 106 may be obtained.

Figure 22:
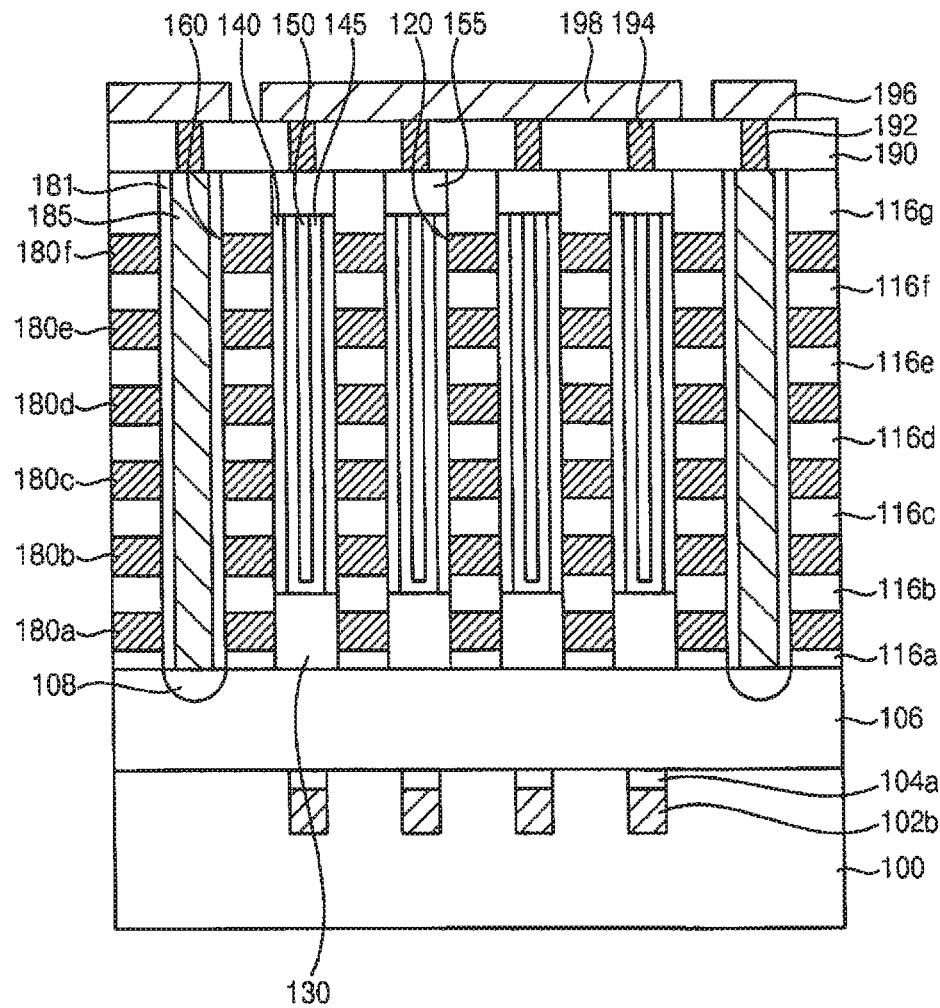
FIG. 22 is a cross-sectional view illustrating a vertical memory device in accordance with example embodiments.

FIG. 22 is a cross-sectional view illustrating a vertical memory device in accordance with example embodiments. Detailed descriptions on elements and/or constructions that are substantially the same as or similar to those illustrated with reference to FIG. 1 are omitted for brevity.

Referring to FIG. 22, a memory cell structure that is substantially the same as or similar to that illustrated in FIG. 1 may be disposed on a channel layer 106. A lower structure including a lower insulation layer 100, a low resistance layer 102b and an ohmic contact layer pattern 104a may be disposed under the channel layer 106.

The low resistance layer 102b may partially fill a trench 101 formed at an upper portion of the lower insulation layer 100. The ohmic contact layer pattern 104a may be disposed on the low resistance layer 102b to fill a remaining portion of the trench 101.

In example embodiments, the low resistance layer 102b and the ohmic contact layer pattern 104a may have a linear shape extending in the third direction. In this case, the low resistance layer 102b and the ohmic contact layer pattern 104a may substantially overlap a channel row including a plurality of vertical channels 145 in the first direction.

In example embodiments, the low resistance layer 102b and the ohmic contact layer pattern 104a may have an island shape buried in the lower insulation layer 100. In this case, the low resistance layer 102b and the ohmic contact layer pattern 104a may substantially overlap a semiconductor pattern 130.

According to example embodiments, the ohmic contact layer pattern 104a may be buried or embedded in the lower insulation layer 100 together with the low resistance layer 102b. Thus, a thickness of the vertical memory device may become smaller than thicknesses of the vertical memory devices illustrated in FIGS. 1 and 17. Further, the low resistance layer 102b and the ohmic contact layer pattern 104a may be localized to overlap the vertical channels 145 and/or the semiconductor patterns 130, so that desired regions of the channel layer 106 may have a relatively low resistance.

FIGS. 23 to 26 are cross-sectional views illustrating a method of manufacturing a vertical memory device in accordance with example embodiments. For example, FIGS. 23 to 26 illustrate a method of manufacturing the vertical memory device of FIG. 22. Detailed descriptions on processes and/or materials that are substantially the same as or similar to those illustrated with reference to FIGS. 2 to 16 are omitted for brevity.

Referring to FIG. 23, an upper portion of a lower insulation layer 100 may be partially etched to form a plurality of trenches 101. In example embodiments, the trench 101 may have a linear shape extending in the third direction. In example embodiments, the trenches 101 may have a recess shape or a dent shape arranged regularly in the second and third directions.

Referring to FIG. 24, a low resistance layer 102b filling a lower portion of the trench 101 may be formed. In example embodiments, a conductive layer filling the trenches 101 may be formed on the lower insulation layer 100 using a metal, a metal nitride and/or a metal silicide. An upper portion of the conductive layer may be planarized by a CMP process until a top surface of the lower insulation layer 100 is exposed to form a conductive layer pattern. An upper portion of the conductive layer pattern may be removed by an etch-back process to form the low resistance layer 102b.

Figure 25:
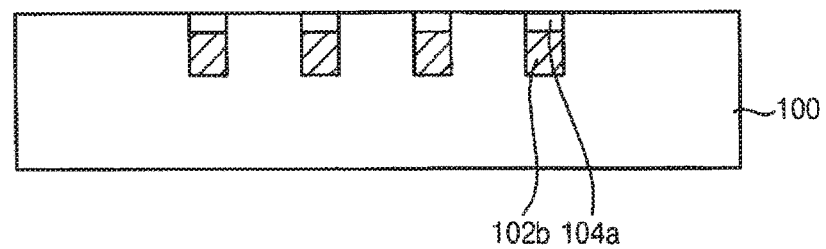

Referring to FIG. 25, an ohmic layer pattern 104a filling a remaining portion of the trench 101 may be formed. In example embodiments, an ohmic contact layer filling the trenches 101 may be formed on the lower insulation layer 100 and the low resistance layer 102b using a semiconductor doped with impurities. For example, the lower resistance layer 102b may be formed using polysilicon doped with p-type impurities. An upper portion of the ohmic contact layer may be planarized by a CMP process until the top surface of the lower insulation layer 100 is exposed to form the ohmic contact layer pattern 104a.

Figure 26:
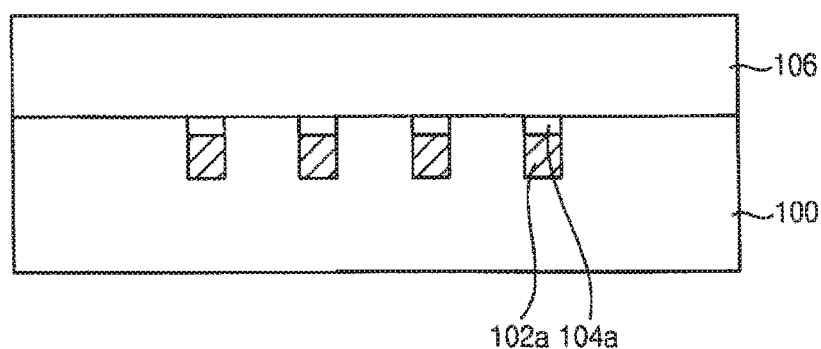

Referring to FIG. 26, a channel layer 106 may be formed on the lower insulation layer 100 and the ohmic contact layer pattern 104a. Processes that are substantially the same as or similar to those illustrated with reference to FIGS. 3 to 16 may be performed to form a memory cell structure on the channel layer 106. Accordingly, a vertical memory device including the low resistance layer 102b and the ohmic contact layer pattern 104a under the channel layer 106 may be obtained.

Figure 27:
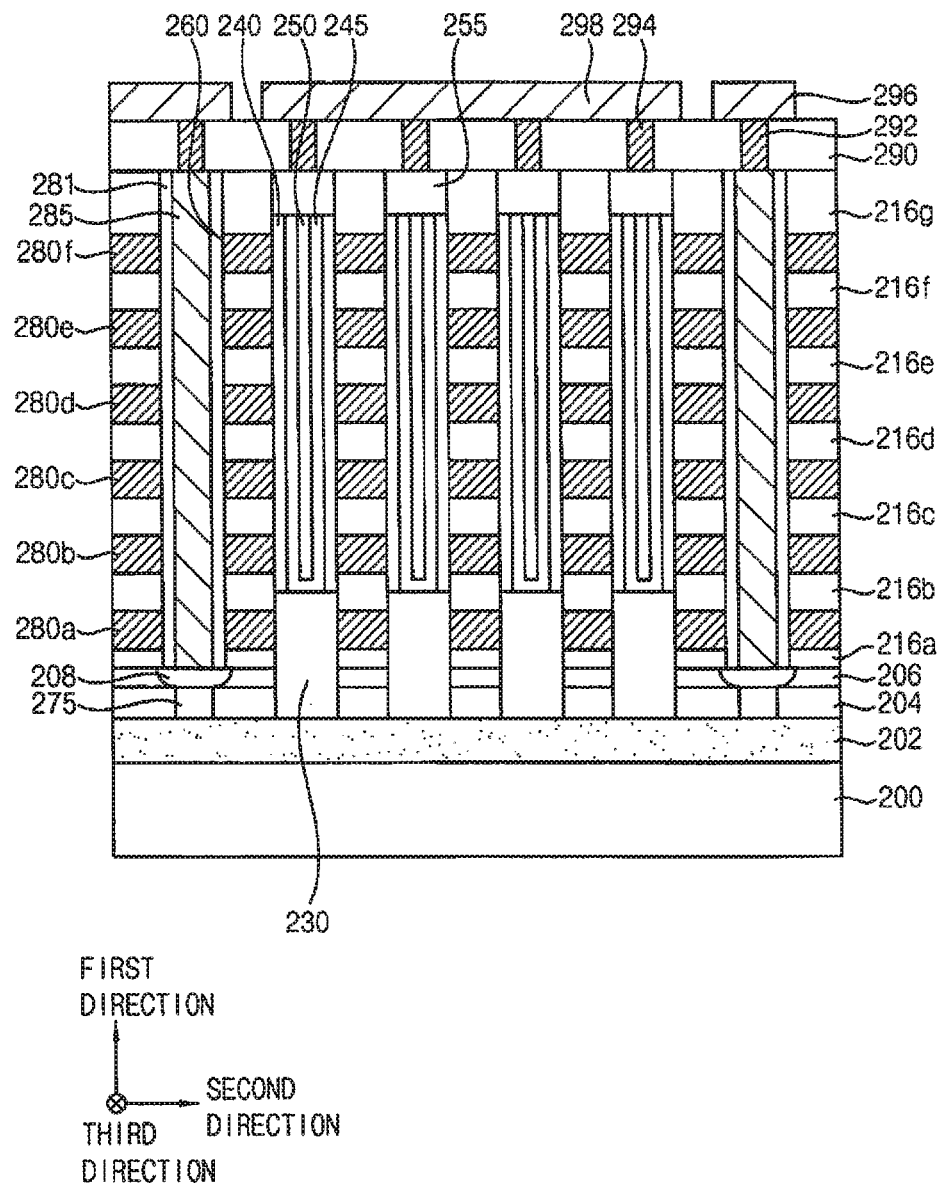
FIG. 27 is a cross-sectional view illustrating a vertical memory device in accordance with example embodiments.

FIG. 27 is a cross-sectional view illustrating a vertical memory device in accordance with example embodiments. Detailed descriptions on elements and/or constructions that are substantially the same as or similar to those illustrated with reference to FIG. 1 are omitted for brevity. Like reference numerals are used to designate like elements.

Referring to FIG. 27, the vertical memory device may include a first channel layer 202, a separating insulation layer 204 and a second channel layer 206 which may be sequentially stacked on a lower insulation layer 200.

The lower insulation layer 200 may be formed on a semiconductor substrate including a peripheral circuit thereon.

The first channel layer 202 may include polysilicon doped with, e.g., p-type impurities. In this case, the first channel layer 202 may serve as a p-well. In other words, the first channel layer 202 may be a well layer.

The separating insulation layer 204 may be interposed between the first channel layer 202 and the second channel layer 206. The separating insulation layer may include, e.g., silicon oxide, silicon nitride or silicon oxynitride.

The second channel layer 206 may be formed on the separating insulation layer 204. The second channel layer 206 may include a semiconductor that may be doped with impurities. For example, the second channel layer 206 may include polysilicon doped with, e.g., p-type impurities. In example embodiments, an impurity concentration of the first channel layer 202 may be greater than that of the second channel layer 206. Additionally, a thickness of the first channel layer 202 may be greater than that of the second channel layer 206.

A first semiconductor pattern 230 may extend through the second channel layer 206 and the separating insulation layer 204 to be in contact with the first channel layer 202. In example embodiments, a portion of the first semiconductor pattern 230 may be inserted in the first channel layer 202.

In example embodiments, the second channel layer 206 may surround an outer sidewall of the first semiconductor pattern 230. The second channel layer 206 may serve as a channel of a GST included in the vertical memory device.

A vertical channel 245 may extend in the first direction on the first semiconductor pattern 230. A dielectric layer structure 240 may be disposed on an outer sidewall of the vertical channel 245, and a first filling layer pattern 250 may be formed in the vertical channel 245. A pad 255 may be disposed on the dielectric layer structure 240, the vertical channel 245 and the first filling layer pattern 250.

Gate lines 280 (280a through 280f) may surround the outer sidewalls of the first semiconductor pattern 230 or the dielectric layer structure 240, and may be spaced apart from each other in the first direction. Insulating interlayer patterns 216 (216a through 216g) may be disposed between the gate lines 280 neighboring in the first direction. Each gate line 280 may surround a plurality of channel rows and extend in the third direction.

A lowermost gate line 280a (also referred to as a first gate line) may surround the outer sidewall of the first semiconductor pattern 230. In this case, the lowermost gate line 280a may serve as a GSL of the vertical memory device. An additional blocking layer or a gate insulation layer may be formed between the lowermost gate line 280a and the outer sidewall of the first semiconductor pattern 230 so that a GST including the GSL may be defined. In example embodiments, a top surface of the first semiconductor pattern 230 may be located between a top surface of the first gate line 280a and a bottom of a second gate line 280b.

An uppermost gate line 280 (e.g., 280f) may serve as an SSL, and the gate lines 280b, 280c, 280d and 280e between the SSL and the GSL may serve as word lines.

An opening 260 may be formed between some of the channel rows and may intersect or cut the gate lines 280 and the insulating interlayer patterns 216. The opening 260 may extend in the third direction. An impurity region 208 may be formed at a portion of the second channel layer 206 exposed through the opening 260. The impurity region 208 may include n-type impurities and serve as a CSL.

A second filling layer pattern 281 may be formed in the opening 260. A first CSL contact 285 may be formed through the second filling layer pattern 281 to be electrically connected to the impurity region 208.

In example embodiments, a second semiconductor pattern 275 may protrude from the first channel layer 202 to extend through the separating insulation layer 204. The second semiconductor pattern 275 may be electrically connected to the first CSL contact 285 via the impurity region 208.

An upper insulation layer 290 may be formed on an uppermost insulating interlayer pattern 216g, the second filling layer pattern 281, the first CSL contact 285 and the pad 255. A second CSL contact 292 and a bit line contact 294 may be formed through the upper insulation layer 290 to contact the first CSL contact 285 and the pad 255, respectively.

A bit line 298 may be disposed on the upper insulation layer 290 to be electrically connected to a plurality of the bit line contacts 294. The bit line 298 may extend in the second direction, and a plurality of the bit lines 298 may be arranged in the third direction. In example embodiments, the bit line 298 may extend in the third direction and may be electrically connected to the pads 255 included in one channel row.

Additionally, a CSL wiring 296 may be disposed on the upper insulation layer 290 to be electrically connected to the second CSL contact 292. For example, the CSL wiring 296 may extend in the third direction.

According to example embodiments described above, the channel layer including polysilicon doped with p-type impurities may have a double-layered structure. The first channel layer 202 may have a relatively high concentration and may serve as the p-well and/or a substrate in contact with the first semiconductor pattern 230. The second channel layer 206 may have a relatively low concentration and a relatively thin thickness. The second channel layer 206 may be in direct contact with the outer sidewall of the first semiconductor pattern 230 and may serve as a channel for the GST, so that a leakage current from the GST may be reduced. The first channel layer 202 and the second channel layer 206 may form a parallel connection with each other by the first semiconductor pattern 230 and/or the second semiconductor pattern 275. Thus, a resistance of the first channel layer 202 serving as the p-well may be reduced.

While FIG. 27 illustrates gate lines 280a through 280f and insulating interlayer patterns 216a through 216f alternately stacked on each other, example embodiments are not limited thereto and the number of gate lines 280 and insulating layer interlayer patterns 216 may vary.

FIGS. 28 to 37 are cross-sectional views illustrating a method of manufacturing a vertical memory device in accordance with example embodiments. For example, FIGS. 28 to 37 illustrate a method of manufacturing the vertical memory device of FIG. 27. Detailed descriptions on processes and/or materials that are substantially the same as or similar to those illustrated with reference to FIGS. 2 to 16 are omitted for brevity.

Figure 28:
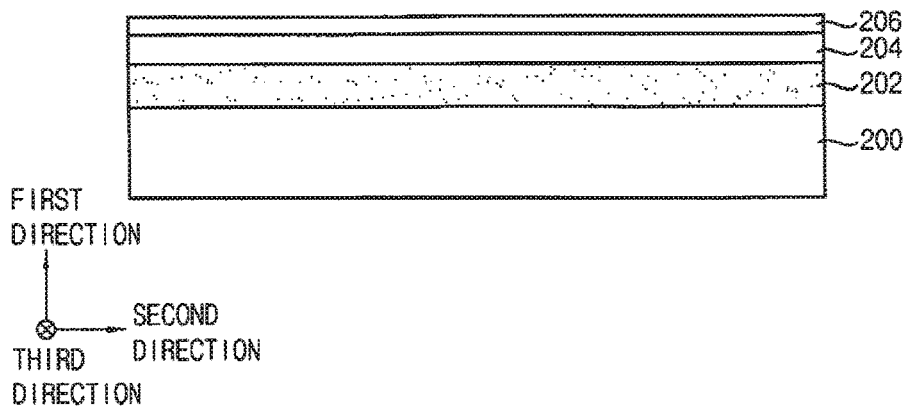

Referring to FIG. 28, a first channel layer 202, a separating insulation layer 204 and a second channel layer 206 may be sequentially formed on a lower insulation layer 200.

The lower insulation layer 200 may be formed on a semiconductor substrate and may cover a peripheral circuit formed on the semiconductor substrate. The lower insulation layer 200 may be formed using an insulation material such as silicon oxide (e.g., PEOX, TEOS, BTEOS, PTEOS, BPTEOS, BSG, PSG, BPSG, or the like).

The first and second channel layers 202 and 206 may be formed using polysilicon doped with p-type impurities by a sputtering process, a PVD process, an ALD process, etc. The separating insulation layer 204 may be formed using an insulation material such as silicon oxide, silicon nitride or silicon oxynitride by a CVD process, a spin coating process, etc.

In example embodiments, the first channel layer 202 may have an impurity concentration greater than that of the second channel layer 206. The first channel layer 202 may have a thickness greater than that of the second channel layer 206.

Figure 29:
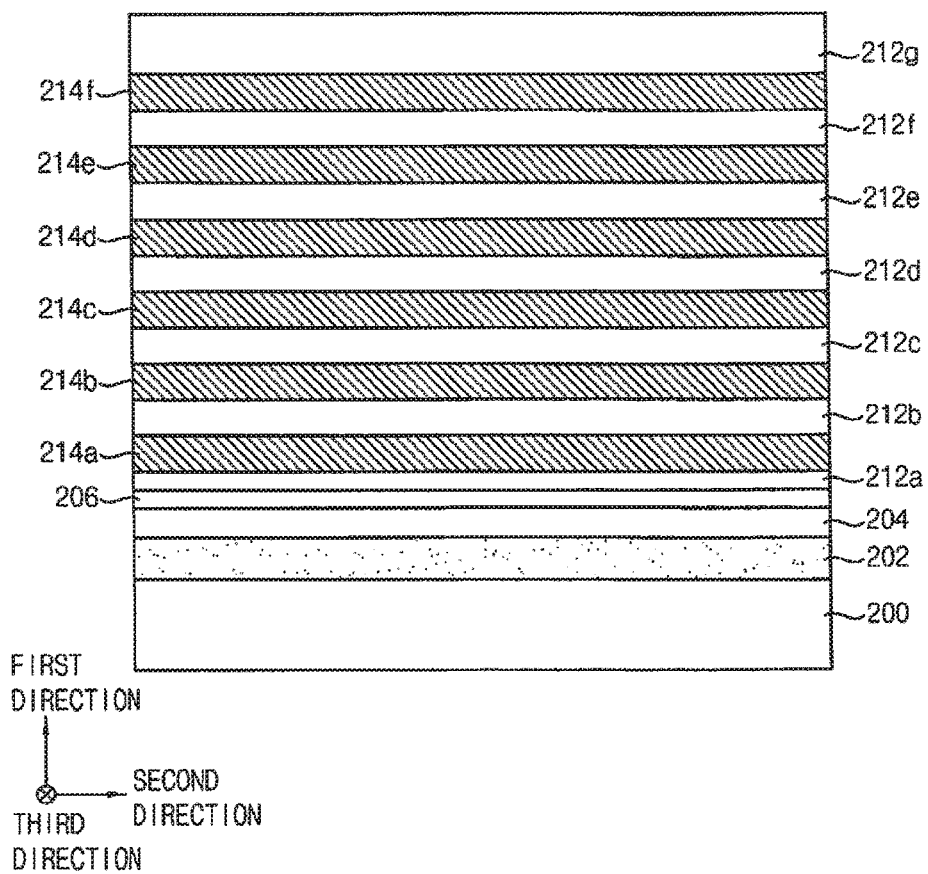

Referring to FIG. 29, a process that is substantially the same as or similar to that illustrated with reference to FIG. 3 may be performed. Accordingly, insulating interlayers 212 (212a through 212g) and sacrificial layers 214 (214a through 214f) may be alternately and repeatedly formed on the second channel layer 206.

Referring to FIG. 30, a process that is substantially the same as or similar to that illustrated with reference to FIG. 4 may be performed to form a plurality of channel holes 220.

In example embodiments, the channel hole 220 may be formed through the insulating interlayers 212, the sacrificial layers 214, the second channel layer 206 and the separating insulation layer 204. Accordingly, a top surface of the first channel layer 202 may be exposed through the channel hole 220.

In example embodiments, an upper portion of the first channel layer 202 may be partially removed while forming the channel hole 220 such that a first recess may be formed at the upper portion of the first channel layer 202.

Referring to FIG. 31, a process that is substantially the same as or similar to that illustrated with reference to FIG. 5 may be performed to form a first semiconductor pattern 230 filling a lower portion of the channel hole 220.

For example, an SEG process may be performed using the top surface of the first channel layer 202 as a seed to form the first semiconductor pattern 230. In example embodiments, a top surface of the first semiconductor pattern 230 may be located between a top surface of a first sacrificial layer 214a and a bottom of a second sacrificial layer 214b. Accordingly, the second channel layer 206 may be in contact with an outer sidewall of the first semiconductor pattern 230.

In example embodiments, the first semiconductor pattern 230 may be partially buried or embedded at the upper portion of the first channel layer 202. In this case, a lower portion of the first semiconductor pattern 230 may be inserted in the first recess.

Figure 32:
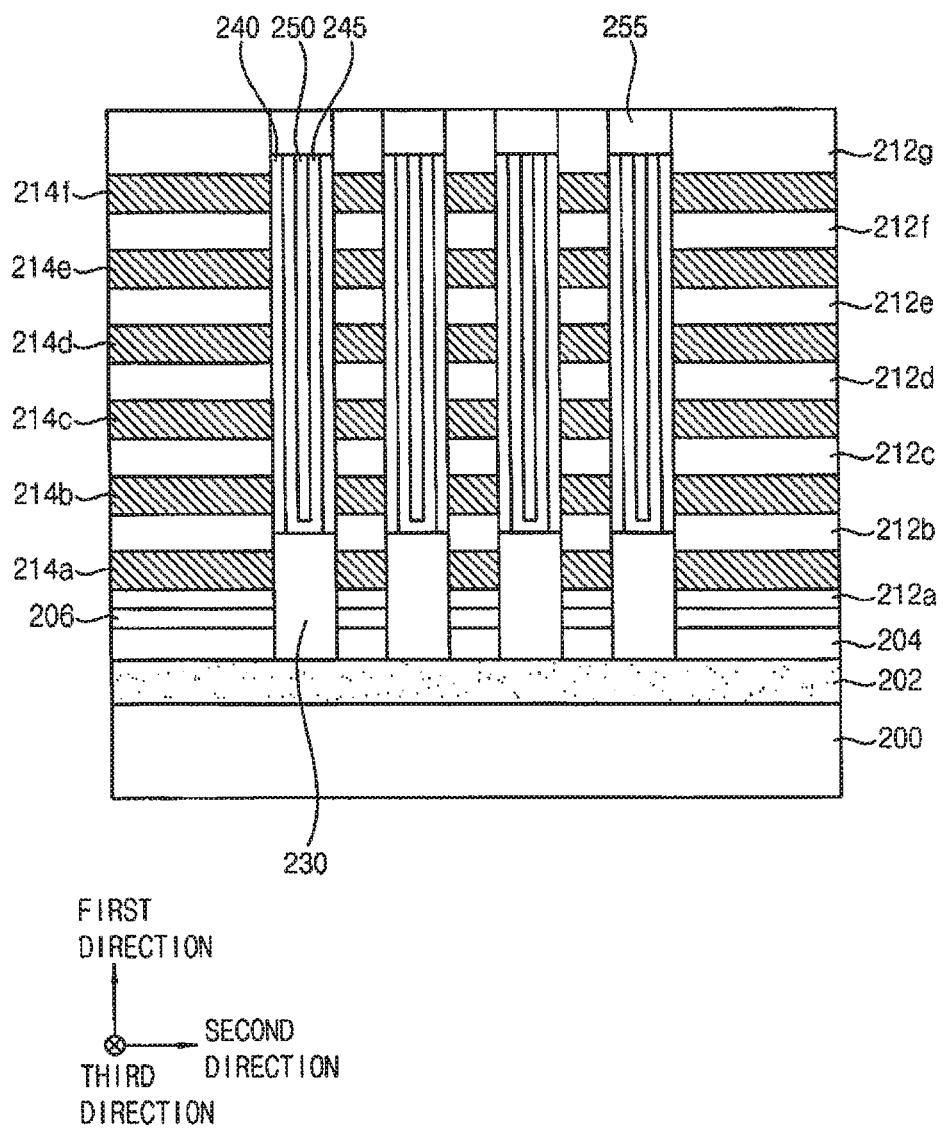

Referring to FIG. 32, processes that are substantially the same as or similar to those illustrated with reference to FIGS. 6 to 9 may be performed. Accordingly, a dielectric layer structure 240, a vertical channel 245 and a first filling layer pattern 250 may be formed on the first semiconductor pattern 230. A pad 255 may be formed on the dielectric layer structure 240, the vertical channel 245 and the first filling layer pattern 250 such that an upper portion of the channel hole 220 may be capped by the pad 255.

Referring to FIG. 33, a process that is substantially the same as or similar to that illustrated with reference to FIG. 10 may be performed to form openings 260 through the insulating interlayers 212 and the sacrificial layers 214. The opening 260 may extend in the third direction. In an etching process for the formation of the opening 260, the second channel layer 206 may substantially serve as an etch-stop layer. Accordingly, a top surface of the second channel layer 206 may be exposed.

An etch-back process may be further performed on the exposed top surface of the second channel layer 206 after the formation of the opening 260. Accordingly, a hole 262 may be formed through the second channel layer 206 and the separating insulation layer 204. The top surface of the first channel layer 202 may be exposed through the hole 262. In example embodiments, an upper portion of the first channel layer 202 exposed through the hole 262 may be partially removed to form a second recess.

By the formation of the openings 260, the insulating interlayers 212 and the sacrificial layers 214 may be changed into insulating interlayer patterns 216 (216a through 216g) and sacrificial layer patterns 218 (218a through 218f), respectively.

Figure 34:
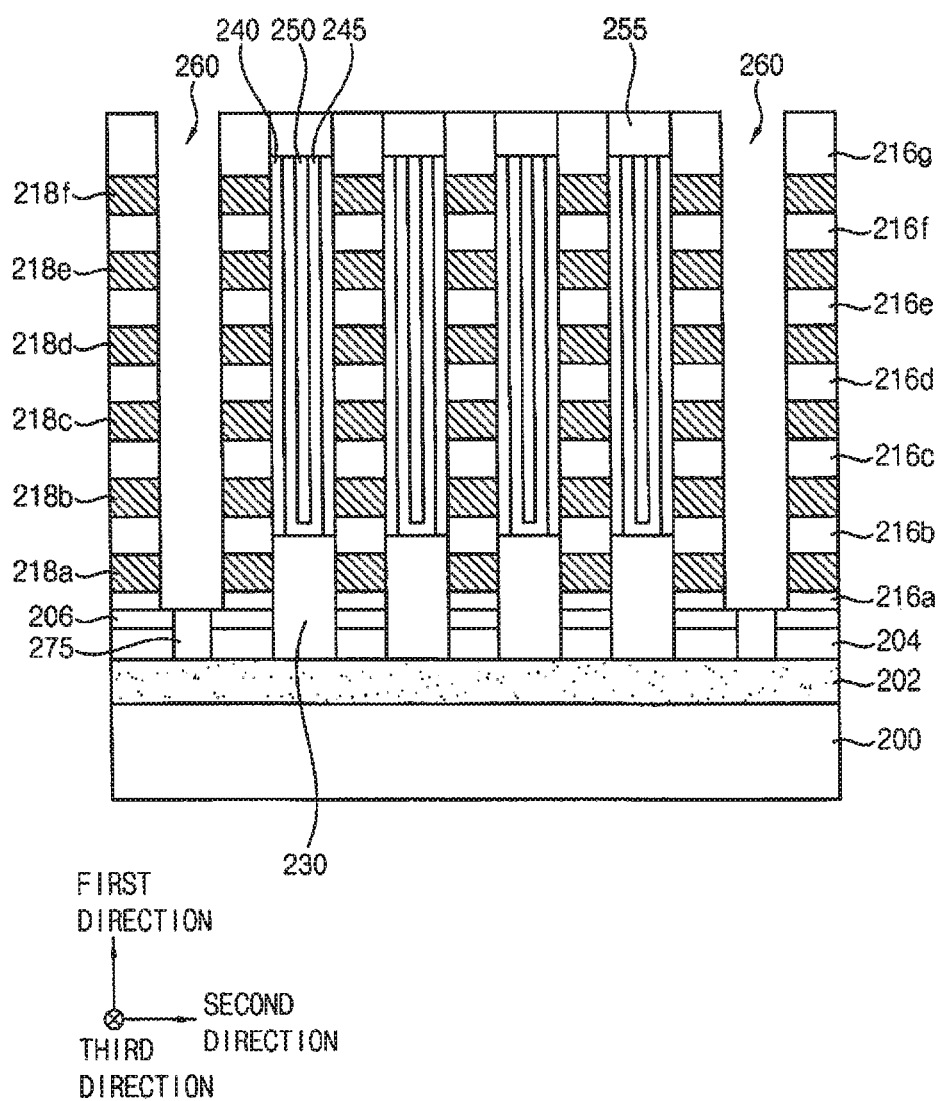

Referring to FIG. 34, a second semiconductor pattern 275 filling the hole 262 may be formed.

In example embodiments, an SEG process using the first channel layer 202 as a seed may be performed to form the second semiconductor pattern 275. Top surfaces of the second semiconductor pattern 275 and the second channel layer 206 may be coplanar with each other. Alternatively, the second semiconductor pattern 262 may protrude from the top surface of the second channel layer 206.

Referring to FIG. 35, processes that are substantially the same as or similar to those illustrated with reference to FIGS. 11 to 13 may be performed. Accordingly, the sacrificial layer patterns 218 may be changed into gate lines 280.

In example embodiments, a lowermost gate line 280a may surround the outer sidewall of the first semiconductor pattern 230. In this case, the lowermost gate line 280a may serve as a GSL of the vertical memory device. In example embodiments, the second channel layer 206 may serve as a channel of a GST including the GSL. An additional blocking layer or a gate insulation layer may be further formed between the lowermost gate line 280a and the outer sidewall of the first semiconductor pattern 230. The gate insulation layer may be formed by a thermal oxidation of the outer sidewall of the first semiconductor pattern 230.

The gate lines 280 on the GSL may surround an outer sidewall of the dielectric layer structure 240 and extend in the third direction. For example, four gate lines 280b, 280c, 280d and 280e on the GSL may serve as a word line, and an uppermost gate line 280f may serve as an SSL.

Figure 36:
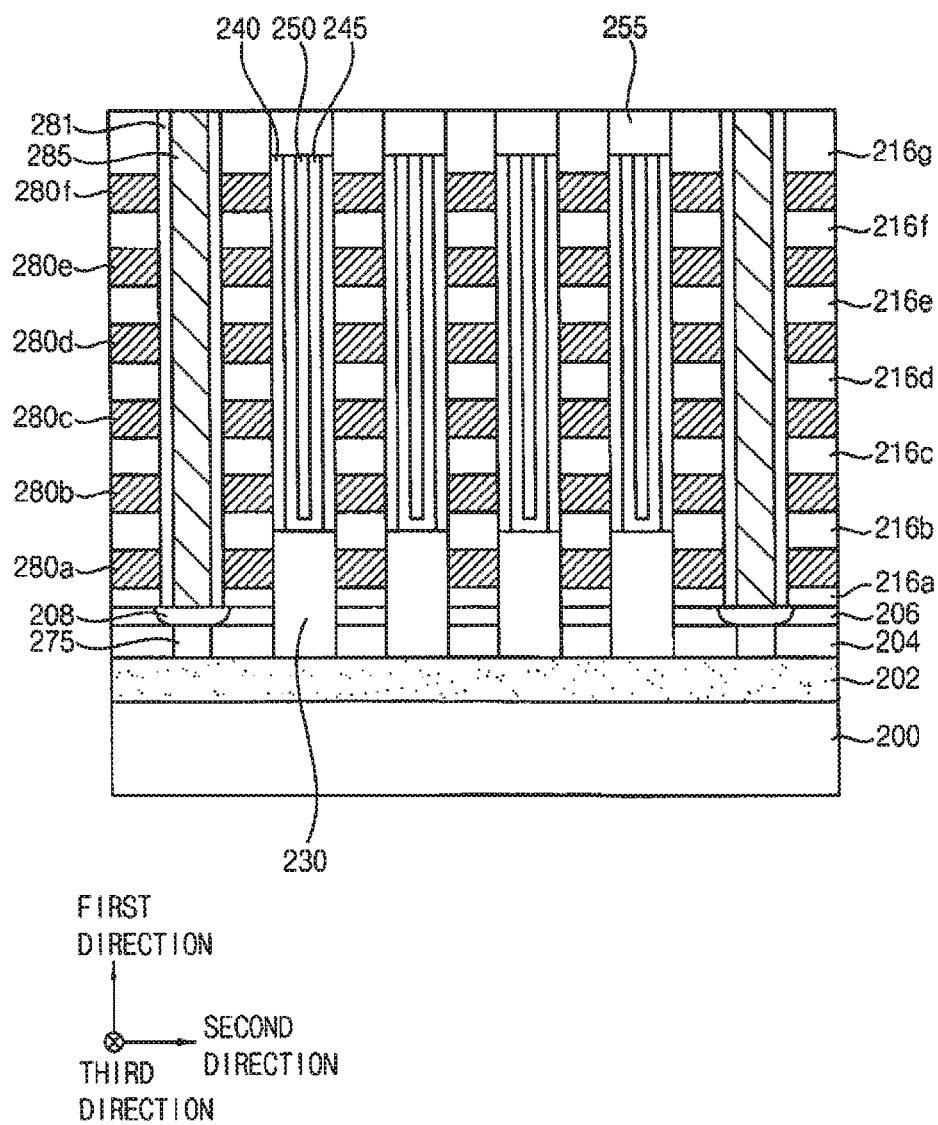

Referring to FIG. 36, processes that are substantially the same as or similar to those illustrated with reference to FIGS. 14 and 15 may be performed.

For example, n-type impurities may be implanted to the second channel layer 206 and the second semiconductor pattern 275 exposed through the opening 260 to form an impurity region 208. The impurity region 208 may extend in the third direction and serve as a CSL of the vertical memory device.

A second filling layer pattern 281 may be formed on the impurity region 208 to fill the opening 260. A first CSL contact 285 may be formed through the second filling layer pattern to be electrically connected to the impurity region 208.

Figure 37:
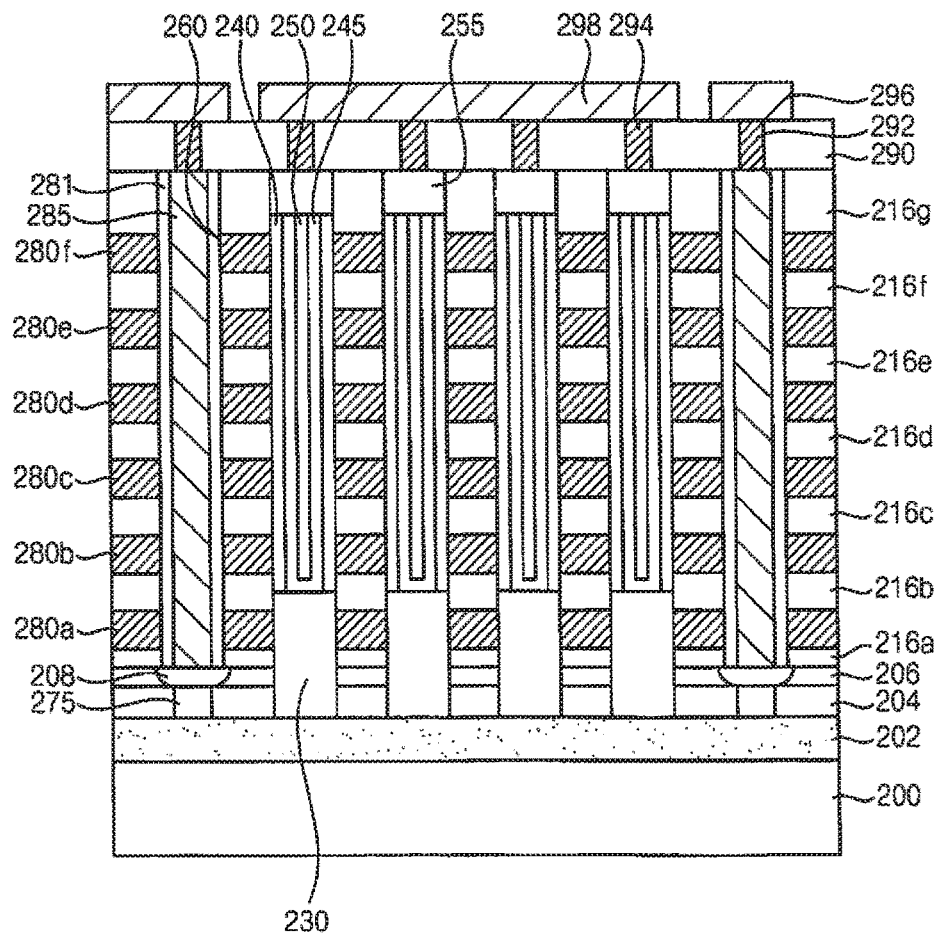

Referring to FIG. 37, a process that is substantially the same as or similar to that illustrated with reference to FIG. 16 may be performed. Accordingly, an upper insulation layer 290, a bit line contact 294, a second CSL contact 292, a bit line 298 and a CSL wiring 296 may be formed to obtain the vertical memory device in accordance with example embodiments.

Figure 38:
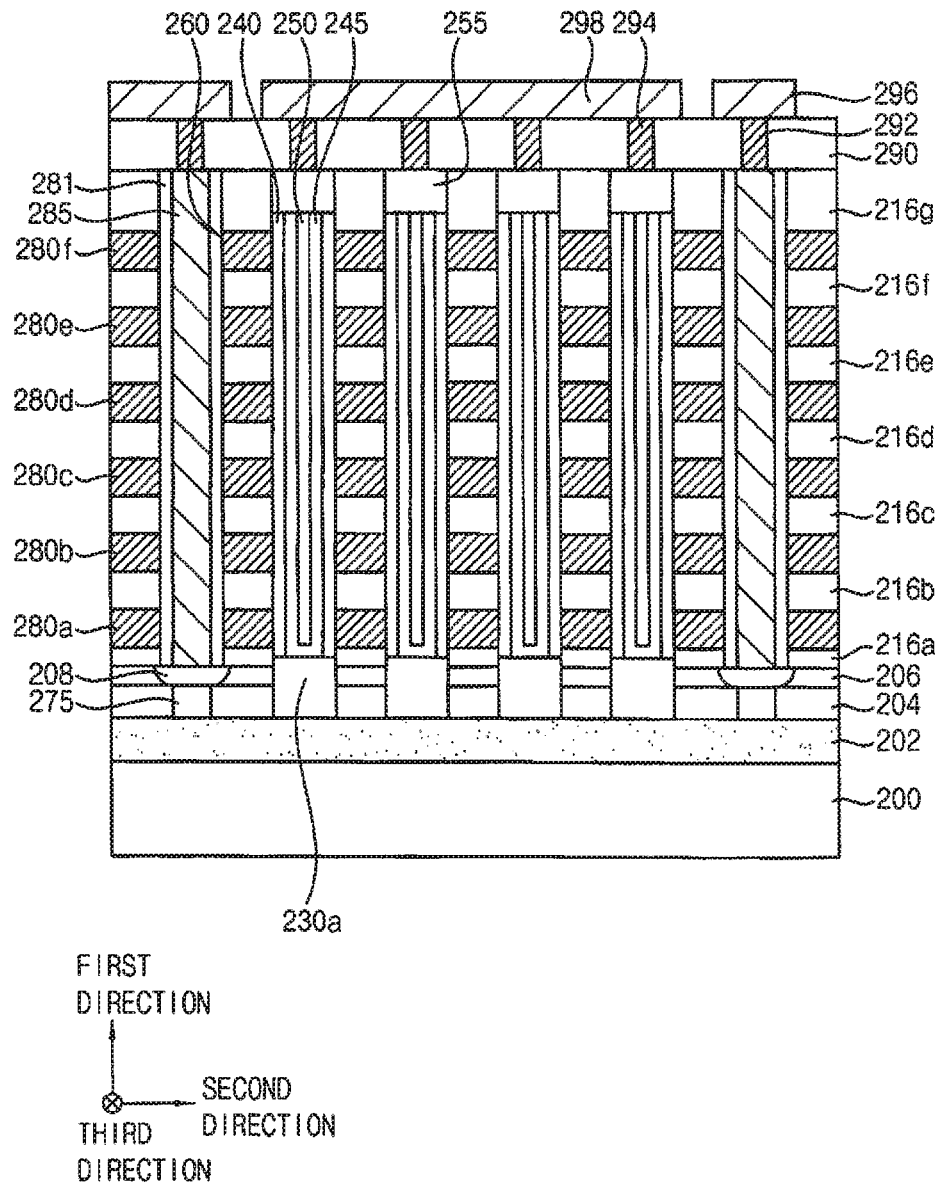
FIG. 38 is a cross-sectional view illustrating a vertical memory device in accordance with example embodiments.

FIG. 38 is a cross-sectional view illustrating a vertical memory device in accordance with example embodiments. The vertical memory device of FIG. 38 may have elements and/or constructions that are substantially the same as or similar to those illustrated in FIG. 27 except for a structure of a first semiconductor pattern. Thus, detailed descriptions on repeated elements and/or constructions are omitted for brevity.

FIG. 38, a top surface of a first semiconductor pattern 230a may be located between a top surface of a second channel layer 206 and a bottom of a lowermost gate line 280a.

In this case, the second channel layer 206 may form a GST together with the first semiconductor pattern 230a. Gate lines 180 may surround an outer sidewall of a dielectric layer structure 240.

A process time or a growth rate of a SEG process for a formation of the first semiconductor pattern 230a may be controlled such that the top surface of the first semiconductor pattern 230a may be located between the top surface of the second channel layer 206 and the bottom of a lowermost gate line 280a.

Processes except for the SEG process may be substantially the same as or similar to those illustrated with reference to FIGS. 28 to 37. Thus, detailed descriptions on a method of manufacturing the vertical memory device of FIG. 38 are omitted for brevity.

Figure 39A:
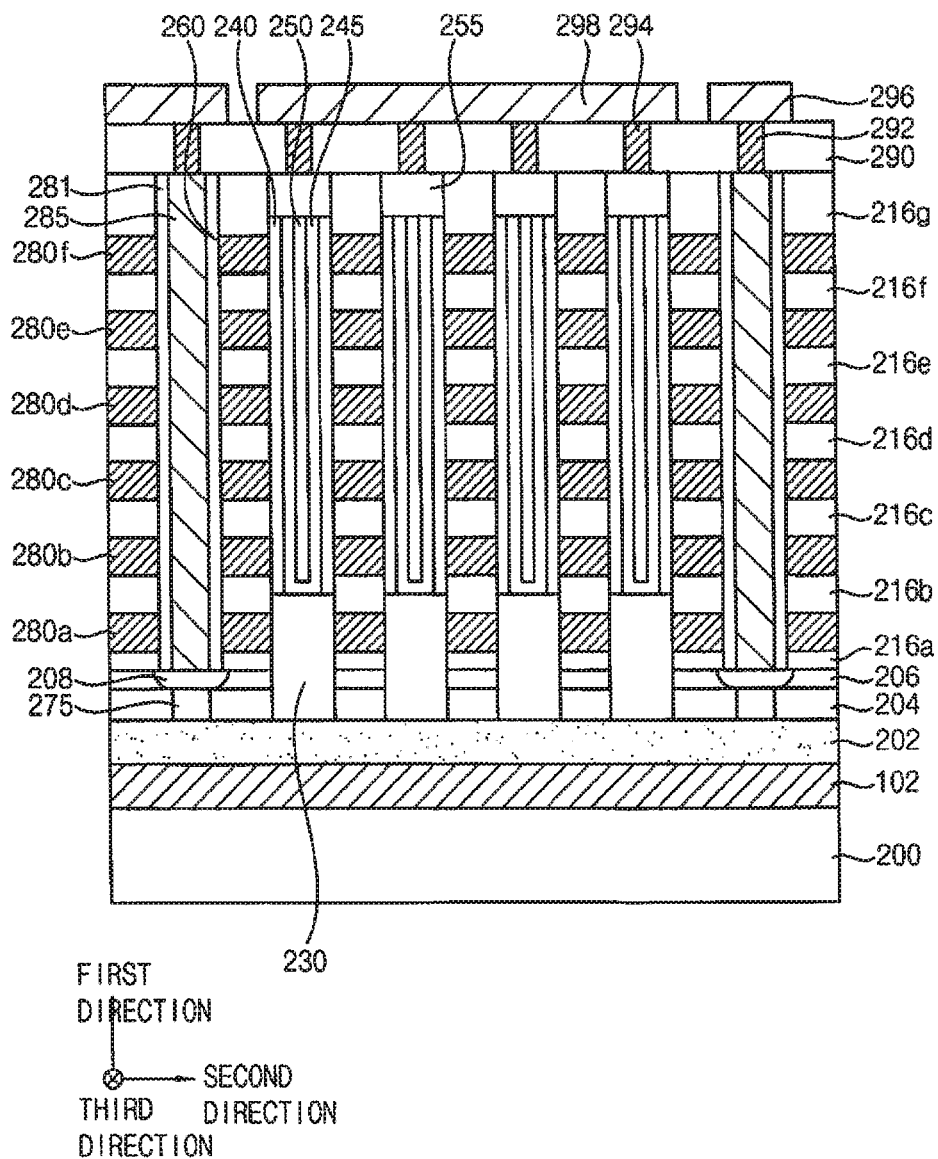
FIGS. 39A and 39B are cross-sectional views illustrating vertical memory devices in accordance with example embodiments.
Figure 39B:
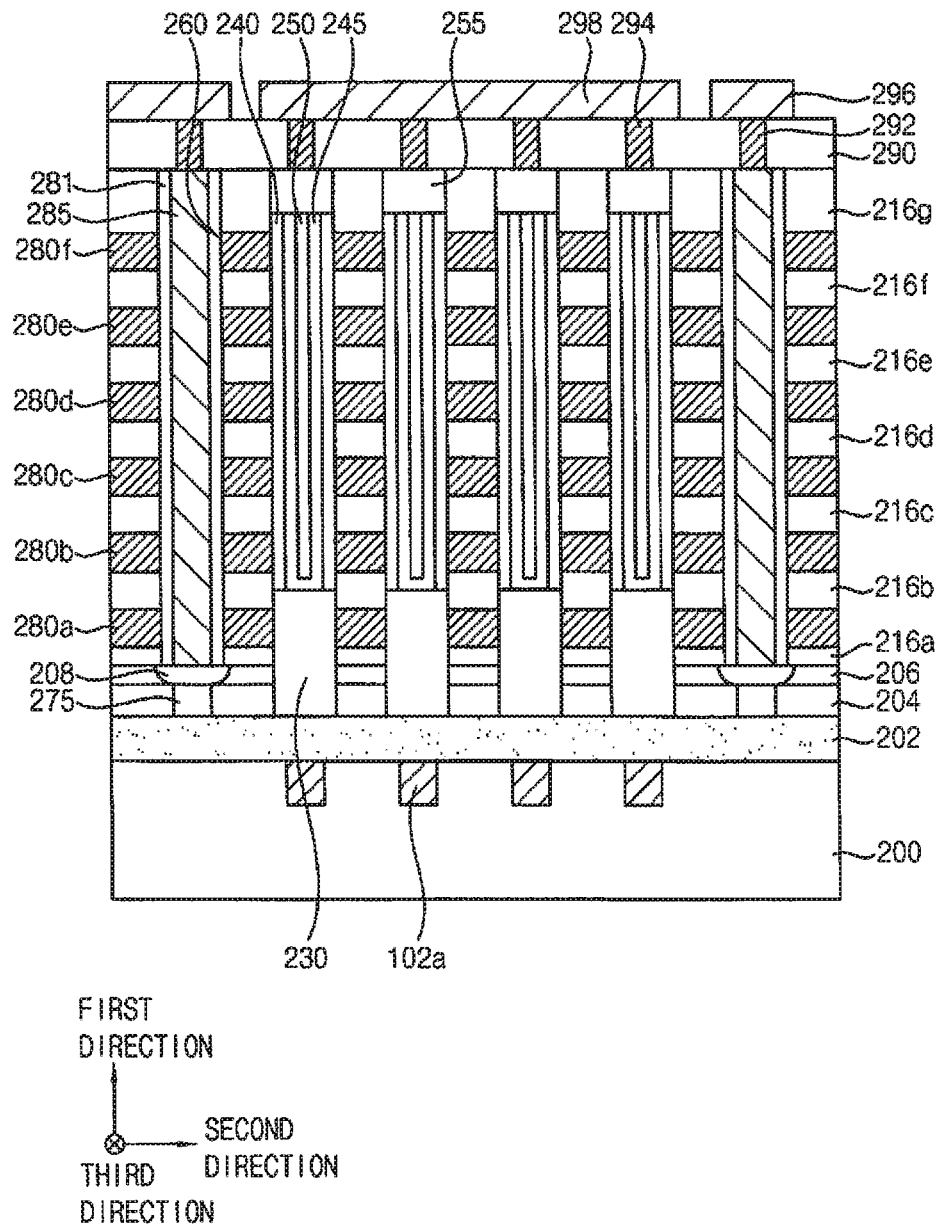

FIGS. 39A and 39B are cross-sectional views illustrating vertical memory devices in accordance with example embodiments. The vertical memory devices of FIGS. 39A and 39B may have elements and/or constructions that are substantially the same as or similar to those illustrated in FIG. 27 or FIG. 38 except for an addition of a low resistance layer. Thus, detailed descriptions on repeated elements and/or constructions are omitted for brevity.

Referring to FIG. 39A, a low resistance layer 102 may be further formed between a lower insulation layer 200 and a first channel layer 202. The low resistance layer 102 may include a metal, a metal nitride and/or a metal silicide. For example, the low resistance layer 102 may include a metal such as W, Co, Ti, Al or Ni, a nitride thereof, or a silicide thereof.

In example embodiments, the low resistance layer 102 may include polysilicon doped with p-type impurities. In this case, the first channel layer 202, a second channel layer 206 and the low resistance layer 102 may commonly include polysilicon doped with p-type impurities. In example embodiments, the low resistance layer 102 may have a maximum impurity concentration, and the second channel layer 206 may have a minimum impurity concentration.

According to example embodiments, the low resistance layer 102 may be provided under the first channel layer 202 serving as a p-well so that a resistance of the first channel layer 202 may be further reduced.

Referring to FIG. 39B, a low resistance layer 102a may have a substantially linear shape. For example, the low resistance layer 102a may include a plurality of linear patterns extending in the third direction. In this case, the low resistance layer 102a may overlap at least one channel row.

The low resistance layers 102 and 102a may be formed by processes that are substantially the same as or similar to those illustrated with reference to FIG. 2 or FIGS. 18 to 20. Thus, a method of manufacturing the vertical memory devices of FIGS. 39A and 39B are omitted for brevity.

Figure 40:
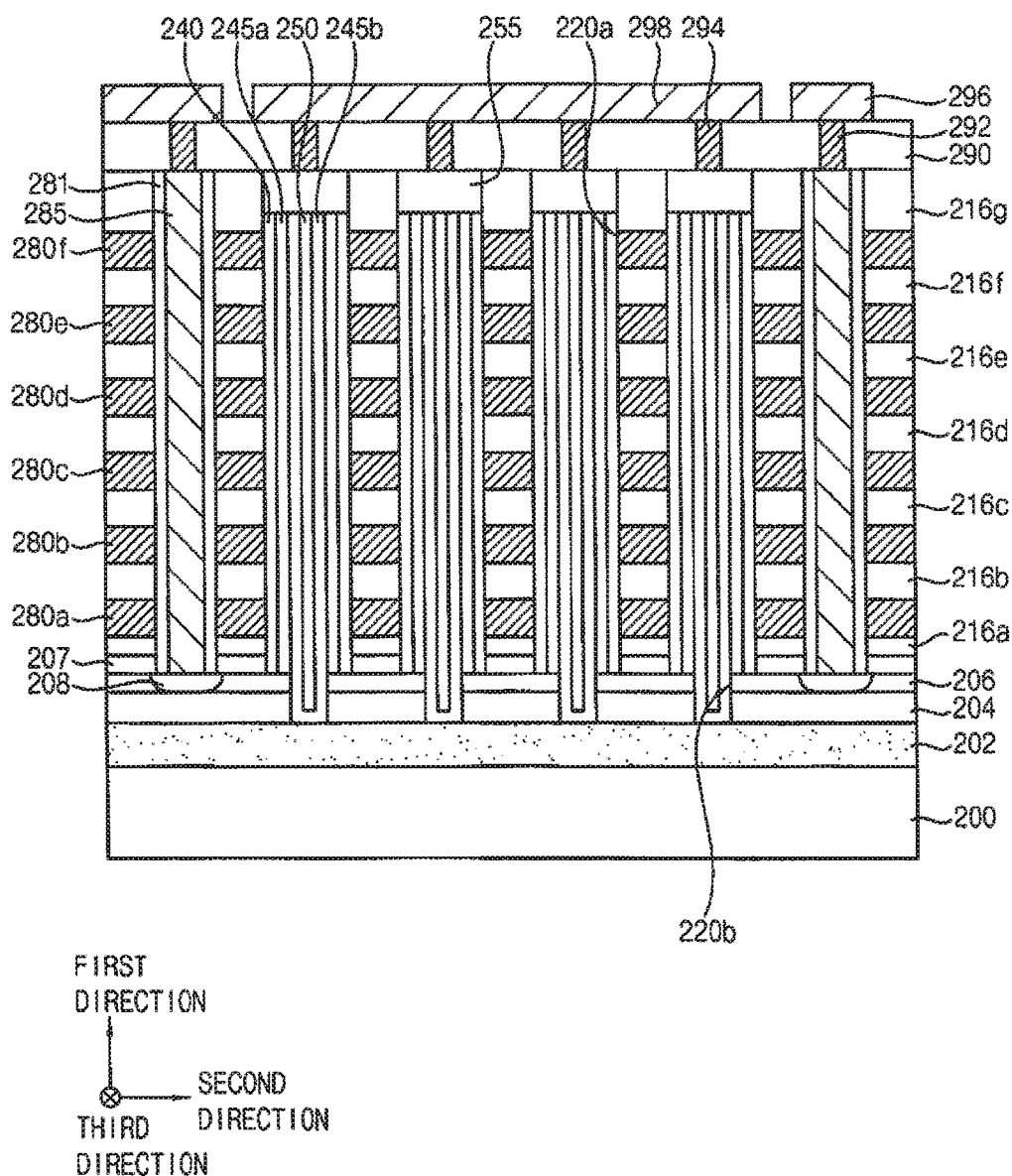
FIG. 40 is a cross-sectional view illustrating a vertical memory device in accordance with example embodiments.

FIG. 40 is a cross-sectional view illustrating a vertical memory device in accordance with example embodiments. The vertical memory device of FIG. 40 may have elements and/or constructions that are substantially the same as or similar to those illustrated in FIG. 27 except for a structure of a vertical channel Thus, detailed descriptions on repeated elements and/or constructions are omitted for brevity.

Referring to FIG. 40, an etch-stop layer 207 may be further formed on a second channel layer 206. The etch-stop layer 207 may include a metal oxide, e.g., aluminum oxide.

A channel hole accommodating a vertical channel may be divided into a first channel hole 220a and a second channel hole 220b. The first channel hole 220a may extend through insulating interlayer patterns 216, gate lines 280 and the etch-stop layer 207. A height of the first channel hole 220a may be substantially equal to a distance between a top surface of a second channel layer 206 and a top surface of an uppermost insulating interlayer pattern 206g. The second channel hole 220b may have a width smaller than that of the first channel hole 220a. The second channel hole 220b may extend through the second channel layer 206 and a separating insulation layer 204. A top surface of a first channel layer 202 may be exposed through the second channel hole 220b. In example embodiments, the second channel hole 220b may extend through an upper portion of the first channel layer 202.

In example embodiments, the vertical channel may be divided into a first vertical channel 245a and a second vertical channel 245b. A dielectric layer structure 240 may be formed on a sidewall of the first channel hole 220a, and the first vertical channel 245a may be formed on an inner wall of the dielectric layer structure 240 and the top surface of the second channel layer 206. The dielectric layer structure 240 and the first vertical channel 245a may have a straw shape or a hollow cylindrical shape. The dielectric layer structure 240 and the first vertical channel 245a may not extend into the second channel hole 220b.

The second vertical channel 245b may be disposed on an inner wall of the first vertical channel 245a, and may extend in the first direction throughout the first and second channel holes 220a and 220b. The second vertical channel 245b may contact the first channel layer 202 and may have a substantially cup shape. A first filling layer pattern 250 may be formed in the second vertical channel 245b.

In example embodiments, the second vertical channel 245b may be inserted or buried in the upper portion of the first channel layer 202.

The second channel layer 206 may surround an outer sidewall of the second vertical channel 245b to be provided as a channel of a GST.

In example embodiments, a second semiconductor pattern (not illustrated) may be formed in the separating insulation layer 204 to be electrically connected to a first CSL contact 285 via an impurity region 208, as illustrated in FIG. 27.

FIGS. 41 to 47 are cross-sectional views illustrating a method of manufacturing a vertical memory device in accordance with example embodiments. For example, FIGS. 41 to 47 illustrate a method of manufacturing the vertical memory device of FIG. 40. Detailed descriptions on processes and/or materials that are substantially the same as or similar to those illustrated with reference to FIGS. 2 to 16, or FIGS. 28 to 37 are omitted for brevity.

Referring to FIG. 41, a process substantially the same as or similar to that illustrated with reference to FIG. 28 may be performed to form a first channel layer 202, a separating insulation layer 204 and a second channel layer 206 sequentially on a lower insulation layer 200. An etch-stop layer 207 may be further formed on the second channel layer 206. The etch-stop layer 207 may be formed using a metal oxide such as aluminum oxide by a CVD process, an ALD process, etc.

A process substantially the same as or similar to that illustrated with reference to FIG. 3 may be performed.

Accordingly, insulating interlayers 212 and sacrificial layers 214 may be alternately and repeatedly formed on the etch-stop layer 207.

Figure 42:
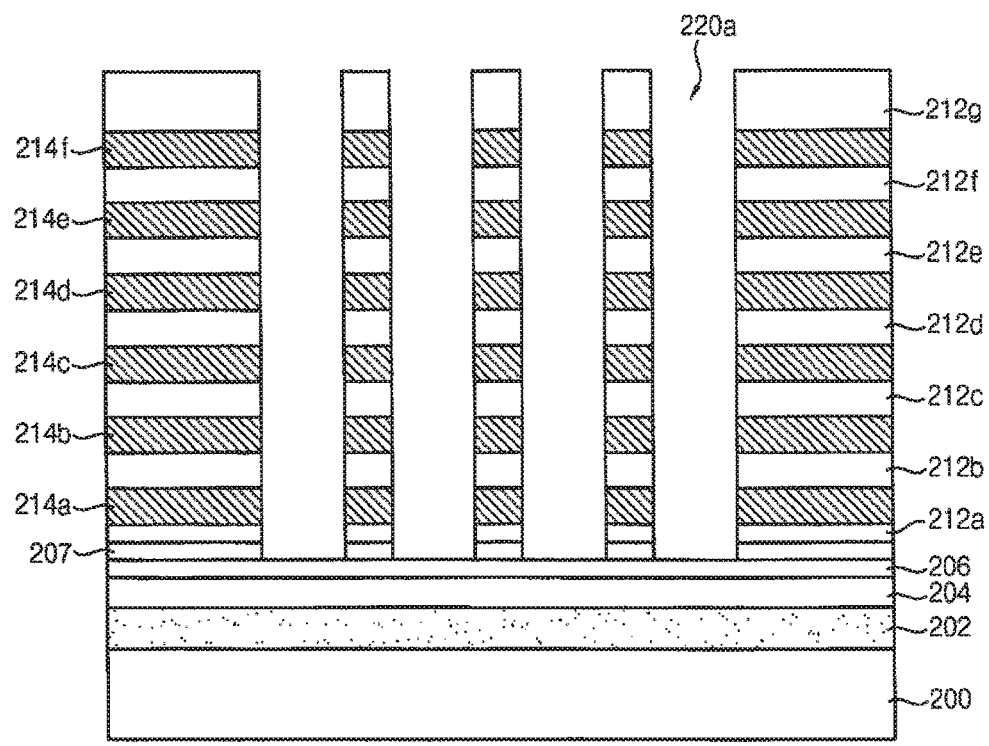

Referring to FIG. 42, a process substantially the same as or similar to that illustrated with reference to FIG. 4 may be performed to form a plurality of first channel holes 220a.

The first channel hole 220a may be formed through the insulating interlayers 212, the sacrificial layers 214 and the etch-stop layer 207. A top surface of the second channel layer 206 may be exposed through the first channel hole 220a. In example embodiments, the etch-stop layer 207 may reduce (and/or prevent) the second channel layer 206 from being damaged during an etching process for the formation of the first channel hole 220a.

Figure 43:
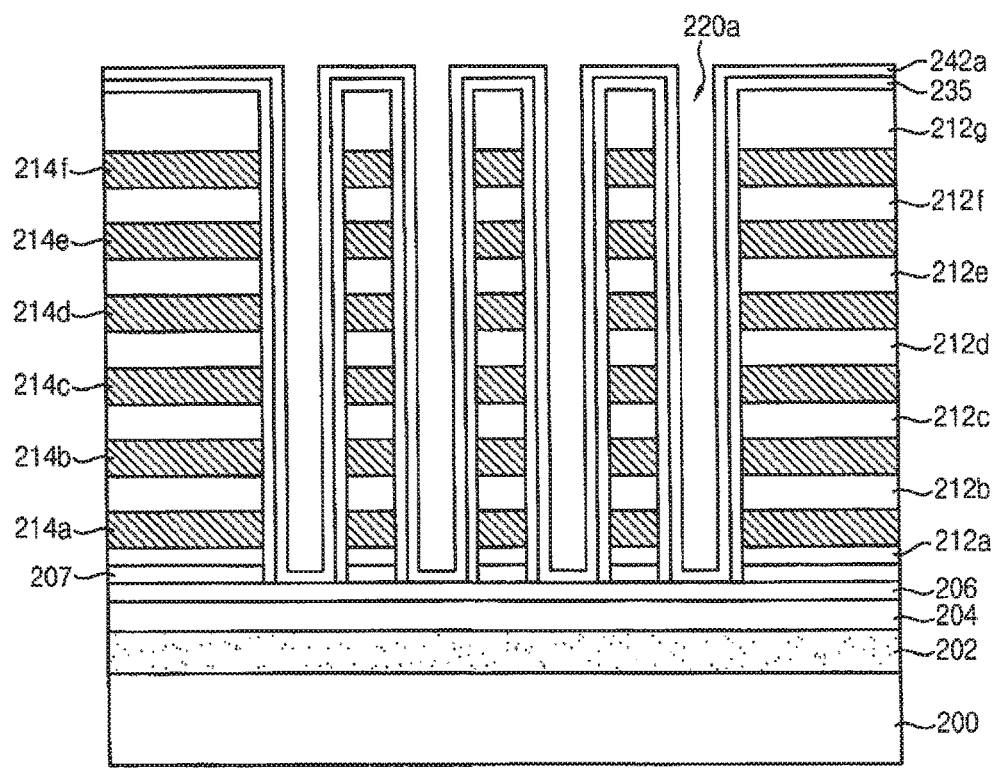

Referring to FIG. 43, processes substantially the same as or similar to those illustrated with reference to FIGS. 6 and 7 may be performed to form a dielectric layer 235 and a first vertical channel layer 242a.

In example embodiments, the dielectric layer 235 may be formed on an uppermost insulating interlayer (e.g., 212g), a sidewall of the first channel hole 220a, and a portion of a bottom of the first channel hole 220a. The first vertical channel layer 242a may be formed on the dielectric layer 235 and the bottom of the channel hole 220a.

Referring to FIG. 44, a portion of the first vertical channel layer 242a formed on the bottom of the first channel hole 220a may be removed by an etch-back process. The second channel layer 206 and the separating insulation layer 204 may be also partially removed by the etch-back process to form a second channel hole 220b.

In example embodiments, the second channel hole 220b may extend from the top surface of the second channel layer 206 to a top surface of the first channel layer 202. In example embodiments, an upper portion of the first channel layer 202 may be partially removed by the etch-back process to form a recess. In this case, the second channel hole 220b may extend from the top surface of the second channel layer 206 to a bottom of the recess.

The second channel hole 220b may have a width smaller than that of the first channel hole 220a.

Referring to FIG. 45, a second vertical channel layer 242b may be formed conformably on the first vertical channel layer 242a and on a sidewall and a bottom of the second channel hole 220b. The second vertical channel layer 242b may be formed using a material substantially the same as or similar to that of the first vertical channel layer 242a by a sputtering process or an ALD process.

A first filling layer 247 filling remaining portions of the first and second channel holes 220a and 220b may be formed on the second vertical channel layer 242b.

Referring to FIG. 46, upper portions of the first filling layer 247, the second vertical channel layer 242b, the first vertical channel layer 242a and the dielectric layer 235 may be planarized by, e.g., a CMP process until a top surface of the uppermost insulating interlayer 212g is exposed. Accordingly, a dielectric layer structure 240 and a first vertical channel 245a may be formed on the sidewall and the bottom of the first channel hole 220a. Further, a second vertical channel 245b and a first filling layer pattern 250 extending in the first direction throughout the first and second channel holes 220a and 220b may be formed.

In example embodiments, the dielectric layer structure 240 and the first vertical channel 245a may have a straw shape or a hollow cylindrical shape. The second vertical channel 245b may have a cup shape. The first filling layer pattern 250 may have a pillar shape or a solid cylindrical shape. In example embodiments, the second vertical channel layer 245b may be formed to sufficiently fill the first and second channel holes 220a and 220b. In this case, the second vertical channel 245b may have a pillar shape or a solid cylindrical shape, and the formation of the first filling layer pattern 250 may be omitted.

In example embodiments, the second channel layer 206 may be in contact with an outer sidewall of the second vertical channel 245b to surround the second vertical channel 245b. The second channel layer 206 may serve as a GST channel together with the second vertical channel 245b. The first channel layer 202 may serve as a p-well and/or a substrate in contact with the second vertical channel 245b.

Referring to FIG. 47, a process substantially the same as or similar to that illustrated with reference to FIG. 9 may be performed. Accordingly, a pad 255 capping the first channel hole 220a may be formed on the dielectric layer structure 240, the first vertical channel 245a, the second vertical channel 245b and the first filling layer pattern 250.

Subsequently, processes that are substantially the same as or similar to those illustrated with reference to FIGS. 10 to 17 may be performed to obtain the vertical memory device of FIG. 40.

In example embodiments, processes that are substantially the same as or similar to those illustrated with reference to FIGS. 33 to 36 may be performed to further form the second semiconductor pattern 275 illustrated in FIG. 27.

Figure 48A:
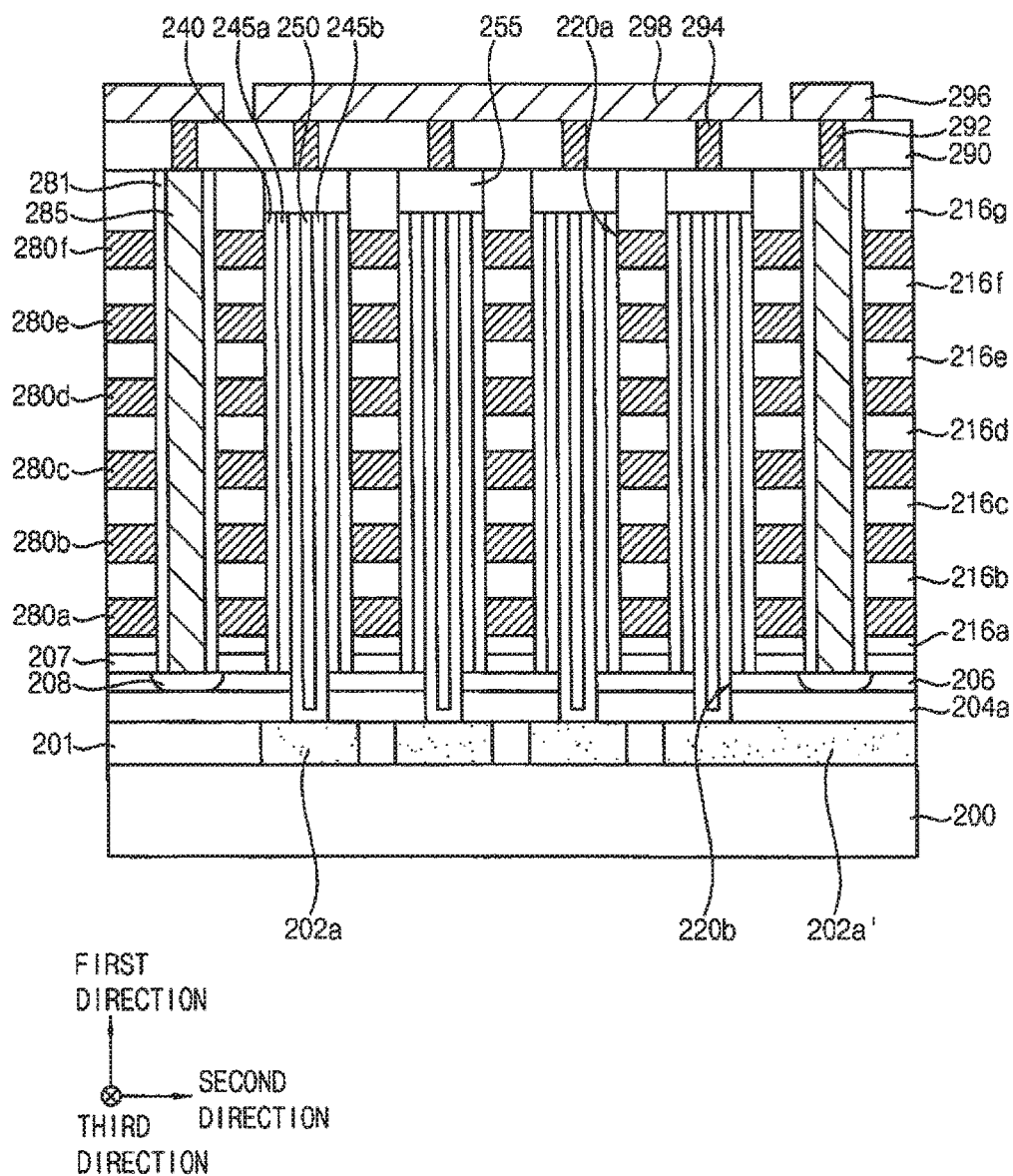
FIGS. 48A and 48B are cross-sectional views illustrating vertical memory devices in accordance with example embodiments.
Figure 48B:
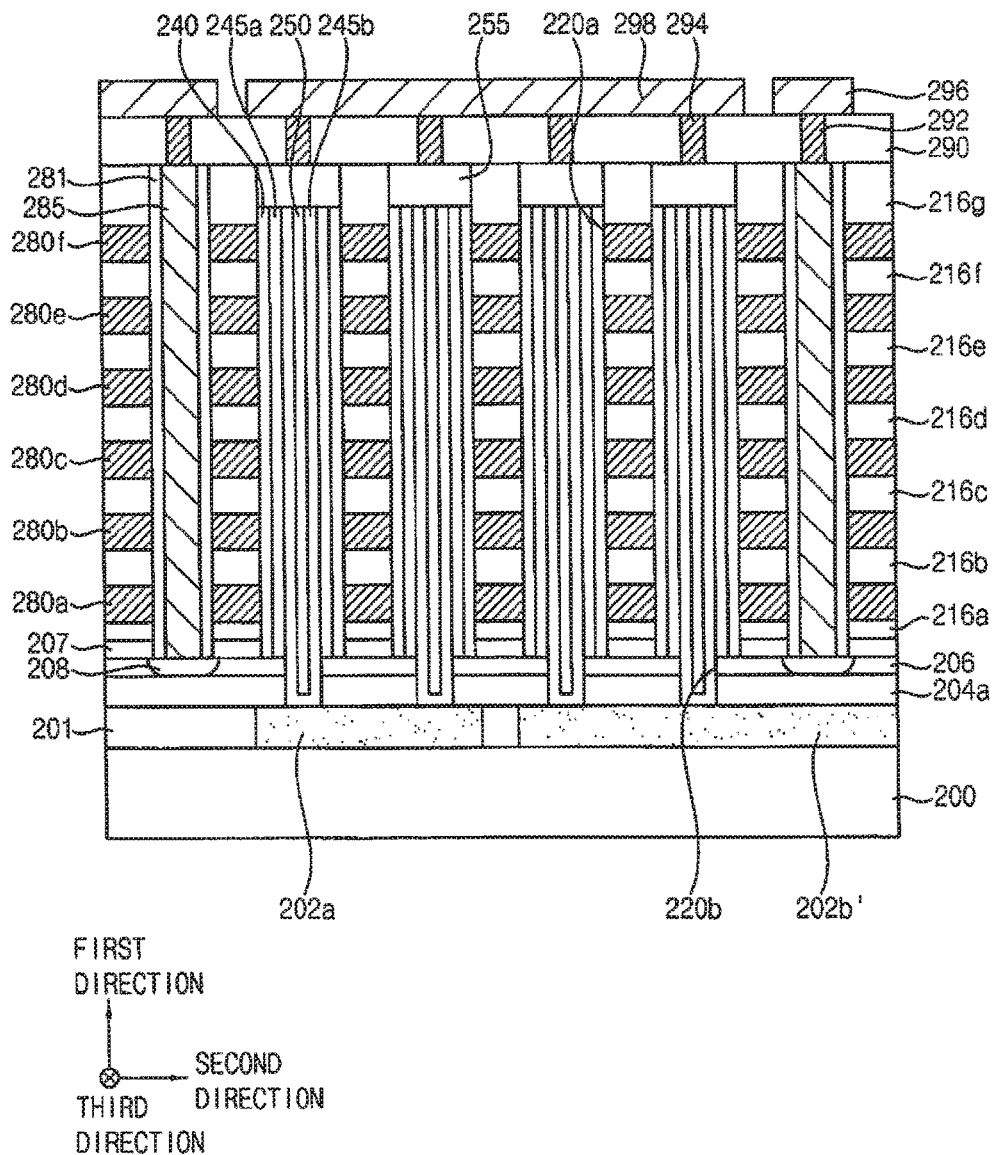

FIGS. 48A and 48B are cross-sectional views illustrating vertical memory devices in accordance with example embodiments. The vertical memory devices of FIGS. 48A and 48B may have elements and/or constructions that are substantially the same as or similar to those illustrated in FIG. 40 except for a structure of a first channel layer. Thus, detailed descriptions on repeated elements and/or constructions are omitted for brevity.

Referring to FIG. 48A, the first channel layer illustrated in FIG. 40 may be provided as a pattern shape. In example embodiments, a plurality of first channel layer patterns 202a may be disposed on a lower insulation layer 200, and a first separating insulation layer 201 may be formed between the neighboring first channel layer patterns 202a. The first channel layer pattern 202a may extend linearly in the third direction.

A second separating insulation layer 204a and a second channel layer 206 may be sequentially formed on the first separating insulation layer 201 and the first channel layer pattern 202a. A second vertical channel 245b may extend through the second channel layer 206 and the second separating insulation layer 204a to be in contact with the first channel layer pattern 202a. In example embodiments, the second vertical channel 245b may extend through an upper portion of the first channel layer pattern 202a.

In example embodiments, the first channel layer pattern 202a may be in contact with the second vertical channels 245b included in one channel row extending in the third direction. In this case, the first channel layer pattern 202a may be formed under each channel row. For example, the first channel layer pattern 202a may overlap the each channel row.

In example embodiments, at least one of the first channel layer patterns 202a (indicated by a reference numeral 202a') may extend to a peripheral circuit region along the second direction to be electrically connected to a peripheral circuit.

Referring to FIG. 48B, a first channel layer pattern 202b may overlap a plurality of the channel rows such that the channel rows may form a group by the first channel layer pattern 202b. For example, as illustrated in FIG. 48B, the first channel layer pattern 202b may be formed per two channel rows to be in contact with the second vertical channels 245b included in the two channel rows.

In example embodiments, at least one of the first channel layer patterns 202b (indicated by a reference numeral 202b') may extend to the peripheral circuit region along the second direction to be electrically connected to the peripheral circuit.

According to example embodiments, at least one channel row may form a channel row group or a channel row block by the first channel layer patterns 202a and 202b serving as a p-well. Thus, an operation of the vertical memory device may be controlled independently for each channel row group or each channel row block. For example, an erase voltage may be independently applied to each channel row group or each channel row block.

Although not illustrated in FIGS. 48A and 48B, the vertical memory devices may further include a low resistance layer between the first channel layer patterns 202a and 202b and the lower insulation layer 200. The low resistance layer may be patterned.

FIGS. 49 to 52 are cross-sectional views illustrating a method of manufacturing a vertical memory device in accordance with example embodiments. For example, FIGS. 49 to 52 illustrate a method of manufacturing the vertical memory devices of FIGS. 48A and 48B. Detailed descriptions on processes and/or materials that are substantially the same as or similar to those illustrated with reference to FIGS. 2 to 16, or FIGS. 41 to 47 are omitted for brevity.

Referring to FIG. 49, a first channel layer 202 may be formed on a lower insulation layer 200.

Referring to FIG. 50, the first channel layer 202 may be partially etched to form first channel layer patterns 202a. The first channel layer patterns 202a may be spaced apart from each other in the second direction, and may extend linearly in the third direction.

In example embodiments, the etching process for the formation of the first channel layer patterns 202a may include an etching process in which an etchant solution having an etching selectivity for polysilicon is used. For example, the etchant solution may include ammonium hydroxide or peroxide.

Figure 51:
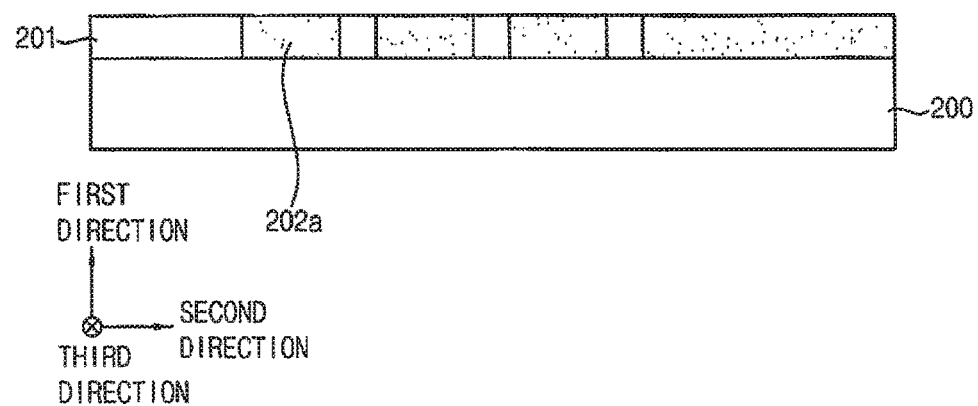

Referring to FIG. 51, an insulation layer covering the first channel layer patterns 202a may be formed on the lower insulation layer 200 using, e.g., silicon oxide. An upper portion of the insulation layer may be planarized until a top surface of the first channel layer pattern 202a is exposed to form a first separating insulation layer 201.

In example embodiments, the first separating insulation layer 201 including openings may be formed, and then a first channel layer filling the openings may be formed on the first separating insulation layer 201. An upper portion of the first channel layer may be planarized to form the first channel layer patterns 202a.

Figure 52:
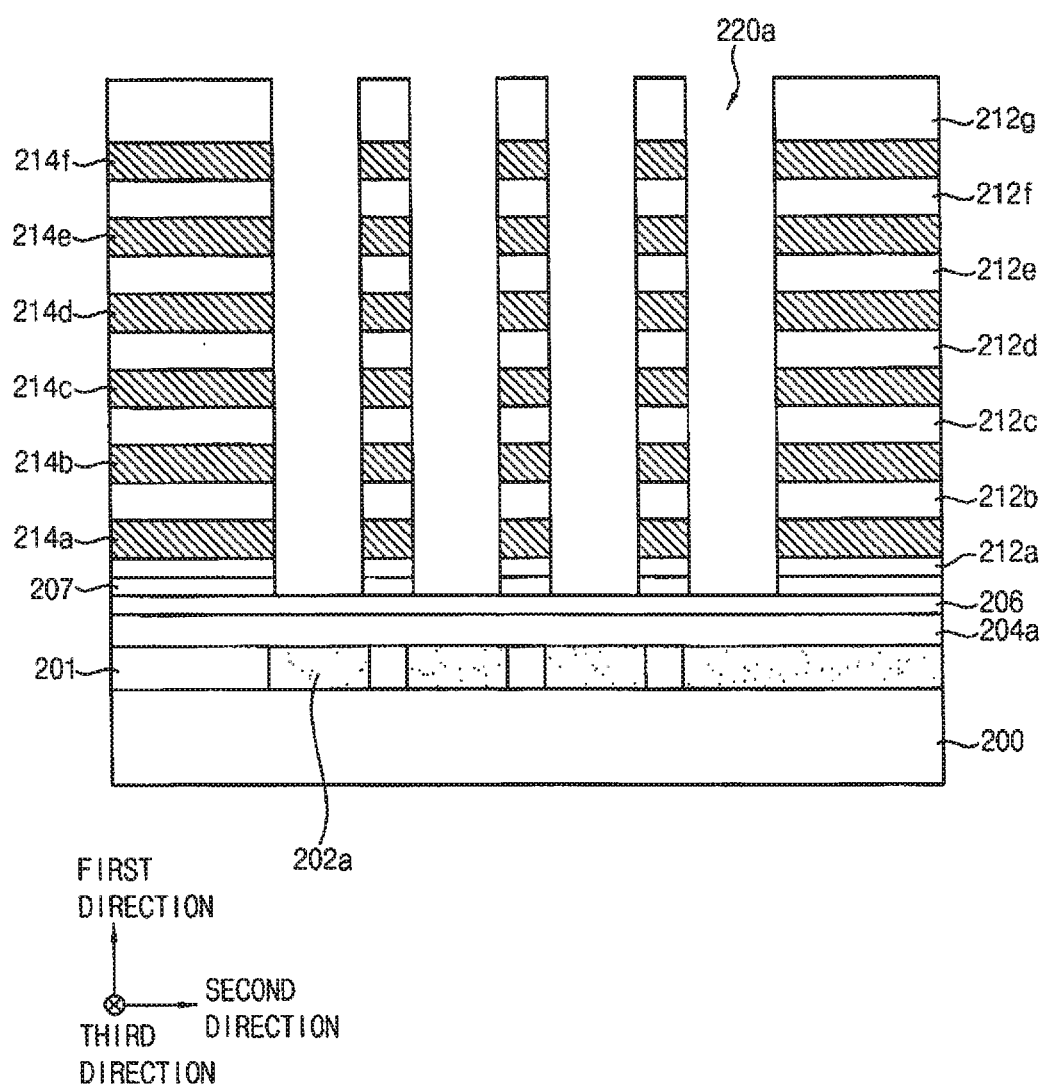

Referring to FIG. 52, a second separating insulation layer 204a, a second channel layer 206 and an etch-stop layer 207 may be sequentially formed on the first separating insulation layer 201 and the first channel layer patterns 202a. Insulating interlayers 212 and sacrificial layers 214 may be formed alternately and repeatedly on the etch-stop layer 207. A process substantially the same as or similar to that illustrated with reference to FIG. 41 may be performed to form first channel holes 220a.

In example embodiments, the first channel holes 220a may be superimposed over the first channel layer patterns 202a.

Processes that are substantially the same as or similar to those illustrated with reference to FIGS. 43 to 47 or FIGS. 10 to 17 may be performed to obtain the vertical memory device of FIG. 48A.

In example embodiments, the first channel layer pattern may be formed to have a greater width than that illustrated in FIG. 50 such that the first channel layer pattern may be in contact with at least two channel rows.

Figure 53B:
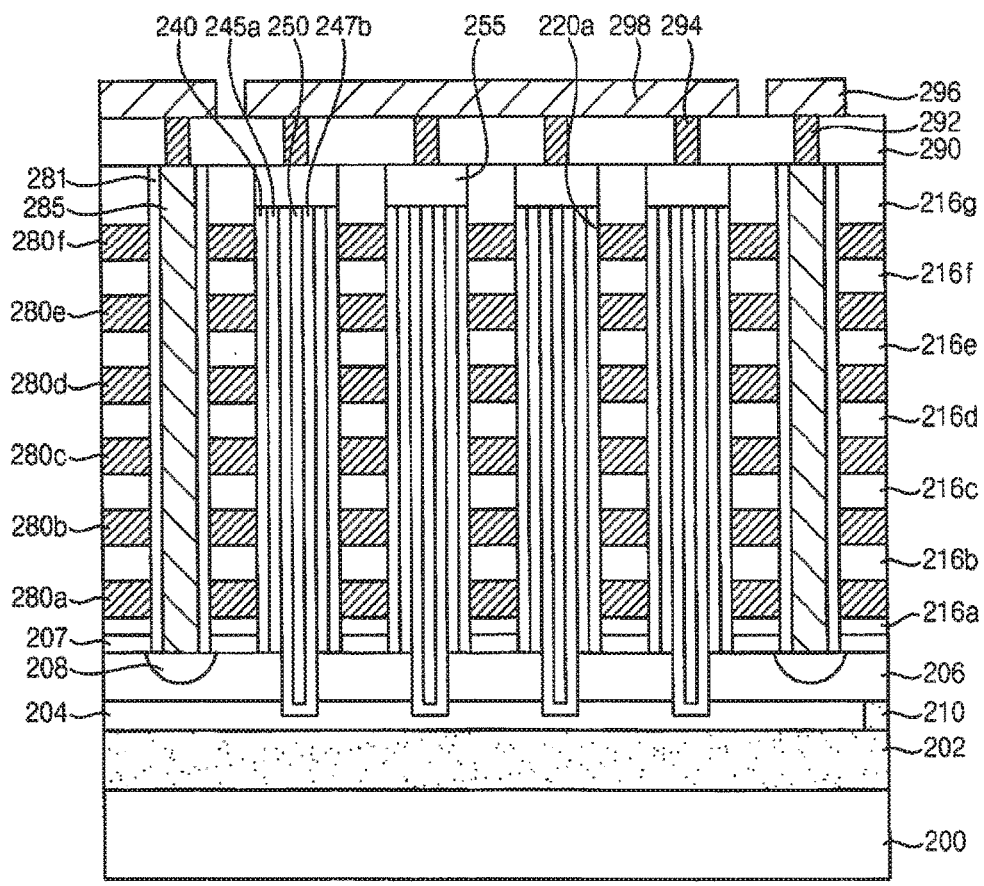
Figure 53C:
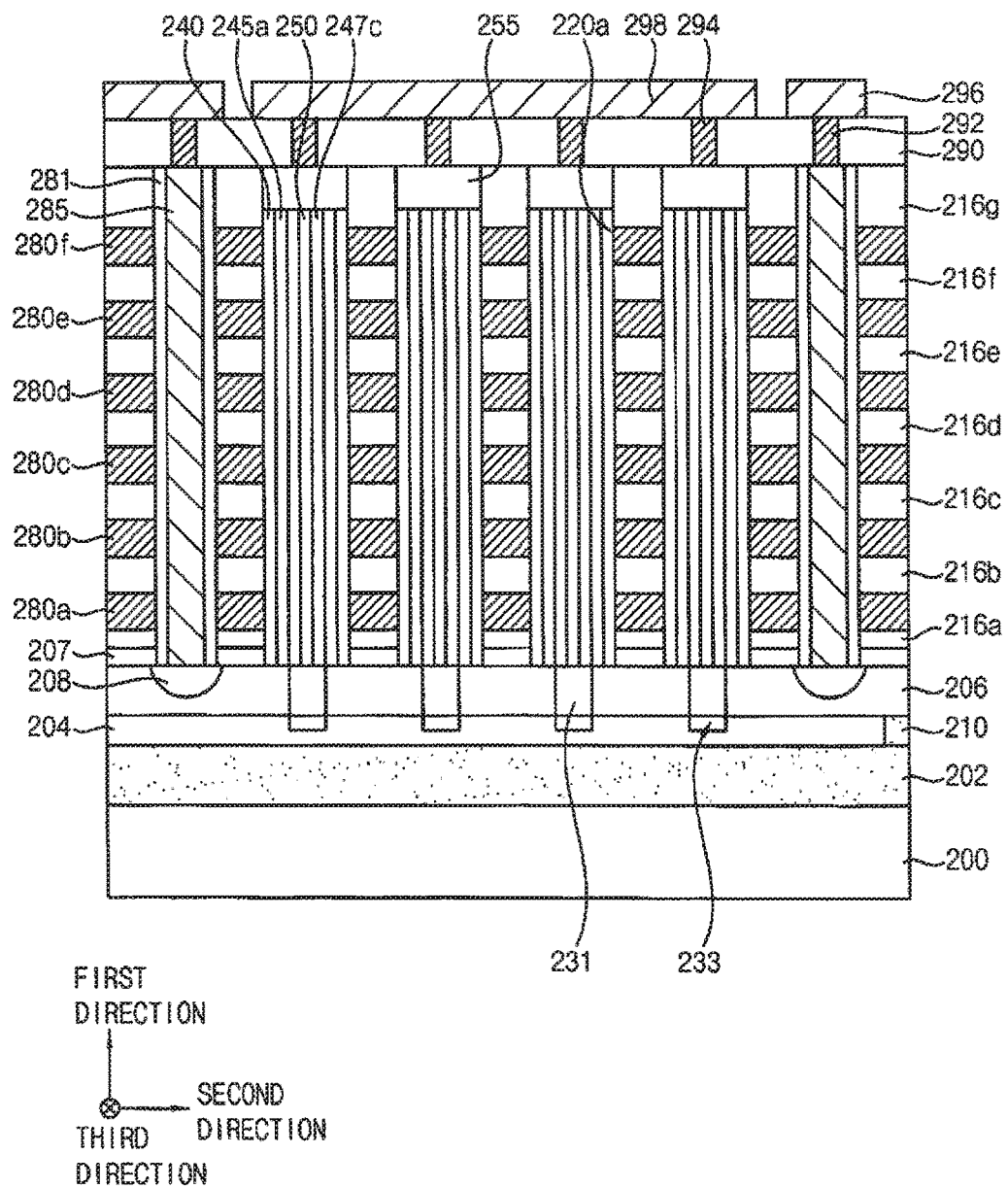

FIGS. 53A to 53C are cross-sectional views illustrating a vertical memory device in accordance with example embodiments. Detailed descriptions on elements and/or structures that are substantially the same as or similar to those illustrated with reference to FIG. 40 are omitted. Detailed descriptions on processes that are substantially the same as or similar to those illustrated with reference to FIGS. 41 to 47 are omitted.

Referring to FIG. 53A, a channel connecting portion 210 may be interposed between a first channel layer 202 and a second channel layer 206. The first and second channel layers 202 and 206 may be electrically connected to each other by the channel connecting portion 210. The channel connecting portion 210 may include polysilicon.

In example embodiments, the channel connecting portion 210 may have a shape of a line pattern or a pillar formed in a separating insulation layer 204. The channel connecting portion 210 may contact the first and second channel layers 202 and 206 on a peripheral portion of a memory cell region.

A second vertical channel 247a may be inserted in an upper portion of the second channel layer 206. For example, a lower portion of the second vertical channel 247a may be buried in the upper portion of the second channel layer 206. A portion of the second channel layer 247a adjacent to the lower portion of the second vertical channel 247a may serve as a GST channel.

In example embodiments, the first channel layer 202 and the separating insulation layer 204 may be formed on a lower insulation layer 200. The separating insulation layer 204 may be partially removed to form an opening through which the first channel layer 202 is exposed. The opening may have a hole shape or a line shape. An SEG process may be performed using the exposed first channel layer 202 as a seed to form the channel connecting portion 210. The second channel layer 206 may be formed on the separating insulation layer 204 and the channel connecting portion 210.

Processes that are substantially the same as or similar to those illustrated with reference to FIGS. 41 to 47 may be performed to obtain the vertical memory device of FIG. 53A. The second channel hole 220b (see FIG. 44) may be formed to extend partially through the second channel layer 206 such that the second vertical channel 247a inserted in the upper portion of the second channel layer 206 may be formed.

Referring to FIG. 53B, a second vertical channel 247b may extend through the second channel layer 206 and may be inserted or buried in an upper portion of the separating insulation layer 204. In this case, the second channel hole may be formed to extend through the second channel layer 206 and partially through the separating insulation layer 204 such that the second vertical channel 247b may be formed.

Referring to FIG. 53C, a semiconductor pattern 231 having a pillar shape may be formed in the second channel layer 206, and a second vertical channel 247c may be disposed on the semiconductor pattern 231. A cavity 233 may be formed under the semiconductor pattern 231 and in the separating insulation layer 204.

In this case, the second channel hole may be formed to extend through the second channel layer 206 and partially through the separating insulation layer 204. An SEG process may be performed using a lateral portion of the second channel layer 206 exposed by the second channel hole as a seed to form the semiconductor pattern 231. Accordingly, a portion of the second channel hole under the semiconductor pattern 231 may be transformed into the cavity 233. The second vertical channel 247c may be formed on an inner wall of a first vertical channel 245a and a top surface of the semiconductor pattern 231.

In example embodiments, the channel connecting portion 210 illustrated in FIGS. 53A to 53C may be omitted. Accordingly, the first channel layer 202 and the second channel layer 206 may be electrically separated from each other by the separating insulation layer 204. In this case, the first channel layer 202 may serve as a back gate to improve characteristics of the GST. For example, the first channel layer 202 may be electrically connected to a contact structure formed on a peripheral circuit region. A zero voltage or a negative voltage may be applied to the first channel layer 202 during a programming operation to reduce (and/or prevent) a leakage current of the GST. A zero voltage or a positive voltage may be applied to the first channel layer 202 during a read operation.

Figure 54:
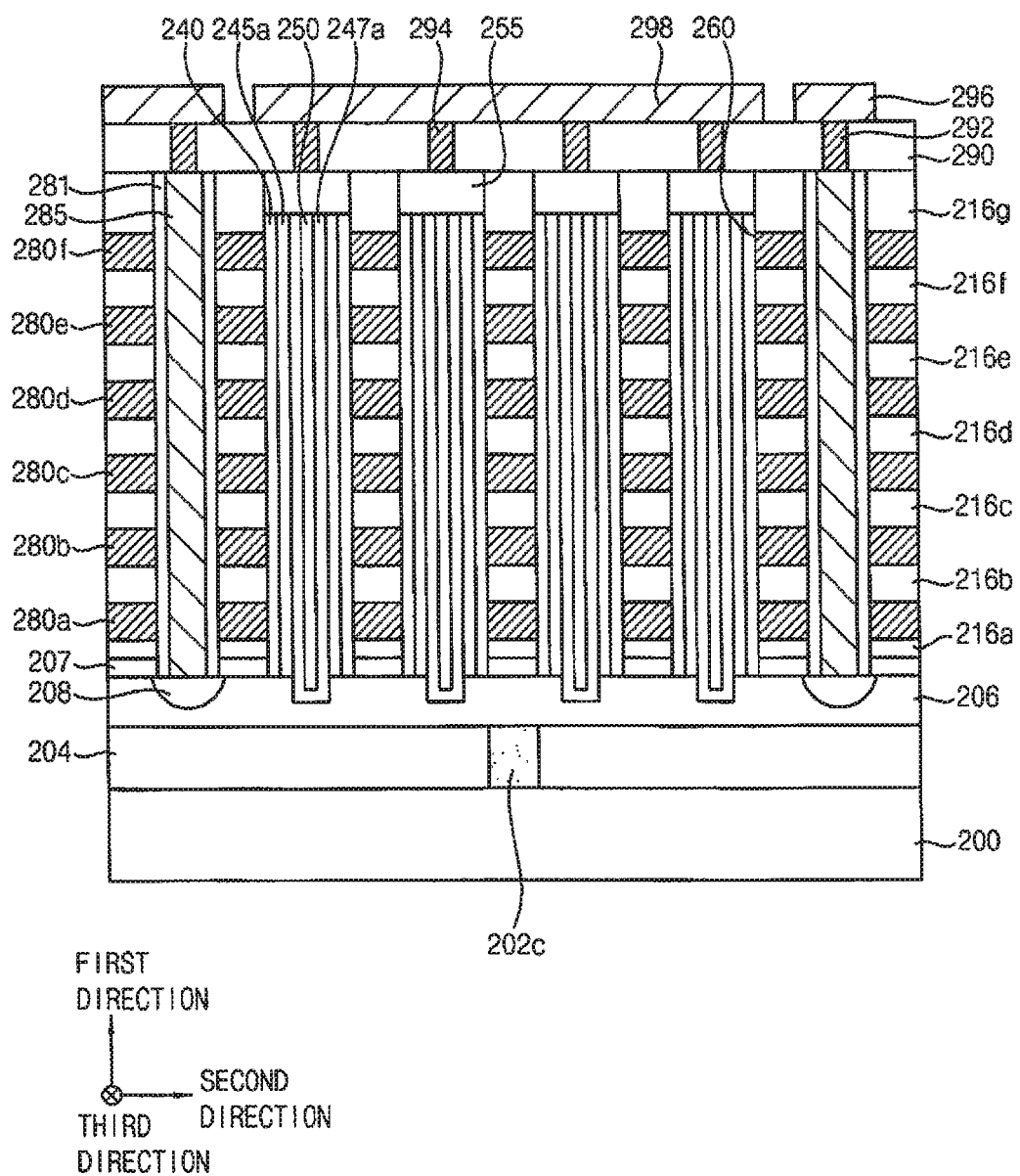
FIG. 54 is a cross-sectional view illustrating a vertical memory device in accordance with example embodiments.

FIG. 54 is a cross-sectional view illustrating a vertical memory device in accordance with example embodiments. Detailed descriptions on elements and/or constructions that are substantially the same as or similar to those illustrated with reference to FIG. 53A are omitted for brevity.

Referring to FIG. 54, a first channel layer pattern 202c may be formed between a lower insulation layer 200 and a second channel layer 206 to be in contact with a lower surface of the second channel layer 206.

The first channel layer pattern 202c may include p-type impurities. In this case, the first channel layer pattern 202c may serve as a p-well of the vertical memory device. In example embodiments, an impurity concentration per unit area of the first channel layer pattern 202c may be greater than that of the second channel layer 206.

In example embodiments, the first channel layer pattern 202c may extend linearly in the third direction. The first channel layer pattern 202c may be located substantially in the middle of a region between two neighboring openings 260 that may serve as a gate line cut region. Accordingly, a uniform current may be applied through the first channel layer pattern 202c to channel rows included in a group or a block that may be defined by the two neighboring openings 260.

A second vertical channel 247a may extend partially through the second channel layer 206 to be inserted or buried in an upper portion of the second channel layer 206. In example embodiments the second vertical channel 247a may extend through the second channel layer 206 and partially through a separating insulation layer 204 as illustrated in FIG. 53B. In example embodiments, as illustrated in FIG. 53C, a semiconductor pattern may be formed in the second channel layer 206, and the second vertical channel 247a may be formed on the semiconductor pattern. A cavity may be formed under the semiconductor pattern and in the separating insulation layer 204.

FIG. 55 is a top plan view illustrating a vertical memory device in accordance with example embodiments. For example, FIG. 55 illustrates an arrangement of pads (or vertical channels) and impurity regions. The arrangement of FIG. 55 may be commonly implemented in the vertical memory devices of FIG. 1, FIG. 17, FIG. 22, FIG. 27, FIG. 38, FIGS. 39A and 39B, FIG. 40, FIGS. 48A and 48B, FIGS. 53A to 53C, and FIGS. 59 to 62. The figures listed above may be cross-sectional views taken along a line I-I' of FIG. 55. For convenience of an explanation, FIG. 55 only illustrates the pads and the impurity regions.

Referring to FIG. 55, gate lines may be intersected or cut by the openings 160 and 260 to form a gate line group including the desired (and/or alternatively predetermined) number of channel rows. For example, the gate line group may include four channel rows as illustrated in FIG. 55. Impurity regions may be formed at upper portions of the channel layer 106 and the second channel layer 206 exposed through the openings 160 and 260. The impurity region may include a first impurity region 208a and a second impurity region 208b. The first and second impurity regions 208a and 208b may extend linearly in the third direction.

In example embodiments, the first impurity region 208a may include n-type impurities and serve as a CSL of the vertical memory device. The second impurity region 208b may include p-type impurities and may serve as a p-well of the vertical memory device. In this case, a current may be additionally supplied to vertical channels by the second impurity region 208b, and thus the first channel layers 202 illustrated in FIGS. 27 and 40 may be omitted.

As illustrated in FIG. 55, a plurality of the first impurity regions 208a may be arranged symmetrically with respect to the second impurity region 208b. Thus, a uniform current may be supplied to the vertical channels from the second impurity region 208b.

Figure 56B:
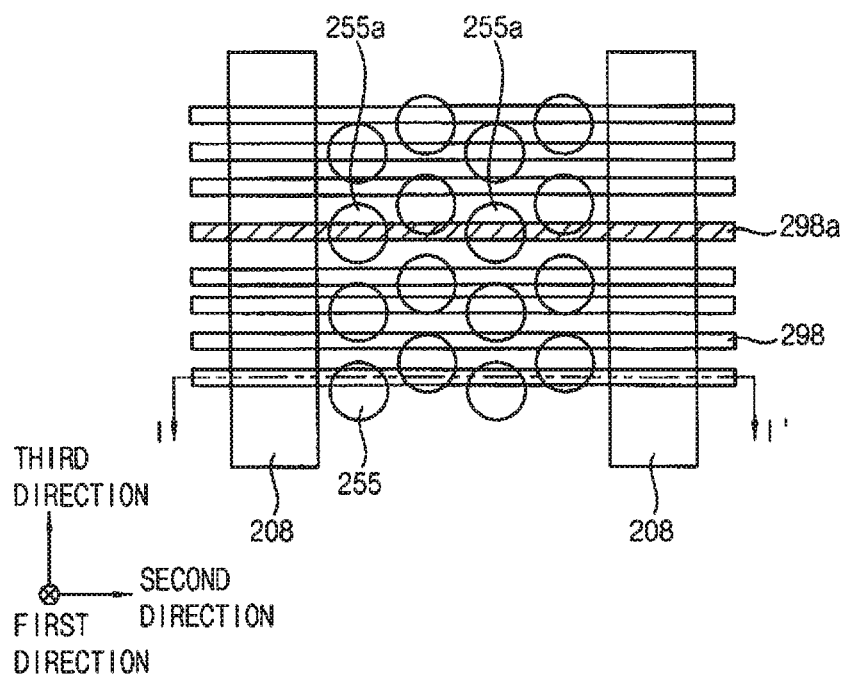
Figure 56C:
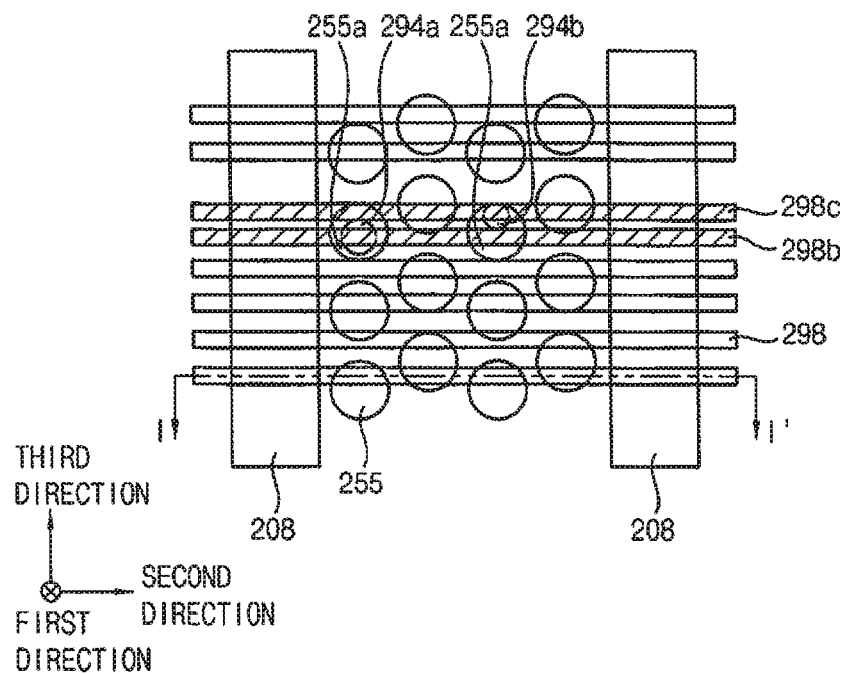

FIGS. 56A to 56C are cross-sectional views illustrating vertical memory devices in accordance with example embodiments. For example, FIGS. 56A to 56C illustrate arrangements of pads (or vertical channels) and bit lines. The arrangements of FIG. 56A to 56C may be commonly implemented in the vertical memory devices of FIG. 1, FIG. 17, FIG. 22, FIG. 27, FIG. 38, FIGS. 39A and 39B, FIG. 40, FIGS. 48A and 48B, FIGS. 53A to 53C, and FIGS. 59 to 62. The figures listed above may be cross-sectional views taken along lines I-I' of FIGS. 56A to 56C. For convenience of an explanation, FIGS. 56A to 56C only illustrate the pads, impurity regions and the bit lines.

Referring to FIG. 56A, an impurity region 208 extending in the third direction may be formed at an upper portion of a channel layer. A gate line group including, e.g., four channel rows may be defined by the neighboring impurity regions 208. A pad 255 may be formed at an upper portion of each channel hole to form a pad array. A vertical channel may be disposed under the pad 255.

In example embodiments, at least one of the pads 255 may serve as a dummy pad 255a. For example, the dummy pad 255a may include p-type impurities, and remaining pads 255 except for the dummy pad 255a may include n-type impurities. In this case, the dummy pad 255a may be electrically connected to a first channel layer and/or a second channel layer via the vertical channel under the dummy pad 255a to provide a current. Thus, the dummy pad 255a may serve as a p-well.

A bit line 298 may be disposed over the pad array to be electrically connected to the pad 255 via a bit line contact. For example, the bit line 298 may extend in the second direction, and a plurality of the bit lines 298 may be arranged in the third direction. In example embodiments, at least one of the bit lines 298 may serve as a dummy bit line 298a electrically connected to the dummy pad 255a.

Referring to FIG. 56B, a distance between the dummy bit line 298a and the bit line 298 neighboring in the third direction may be greater than that between the neighboring bit lines 298.

In example embodiments, electrical signals transferred or applied through the bit line 298 and the dummy bit line 298a may be different from each other. Thus, the distance between the dummy bit line 298a and the bit line 298 may be increased to reduce (and/or prevent) a coupling or a fluctuation of the different electrical signals.

Referring to FIG. 56C, the vertical memory device may include a plurality of dummy bit lines disposed on different layers or different levels. For example, a first dummy bit line 298b may be electrically connected to the dummy pad 255a via a first dummy bit line contact 294a, and a second dummy bit line 298c may be electrically connected to the dummy pad 255a via a second dummy bit line contact 294b. In this case, the first and second dummy bit lines 298b and 298c may be disposed on different insulating interlayers.

Figure 57:
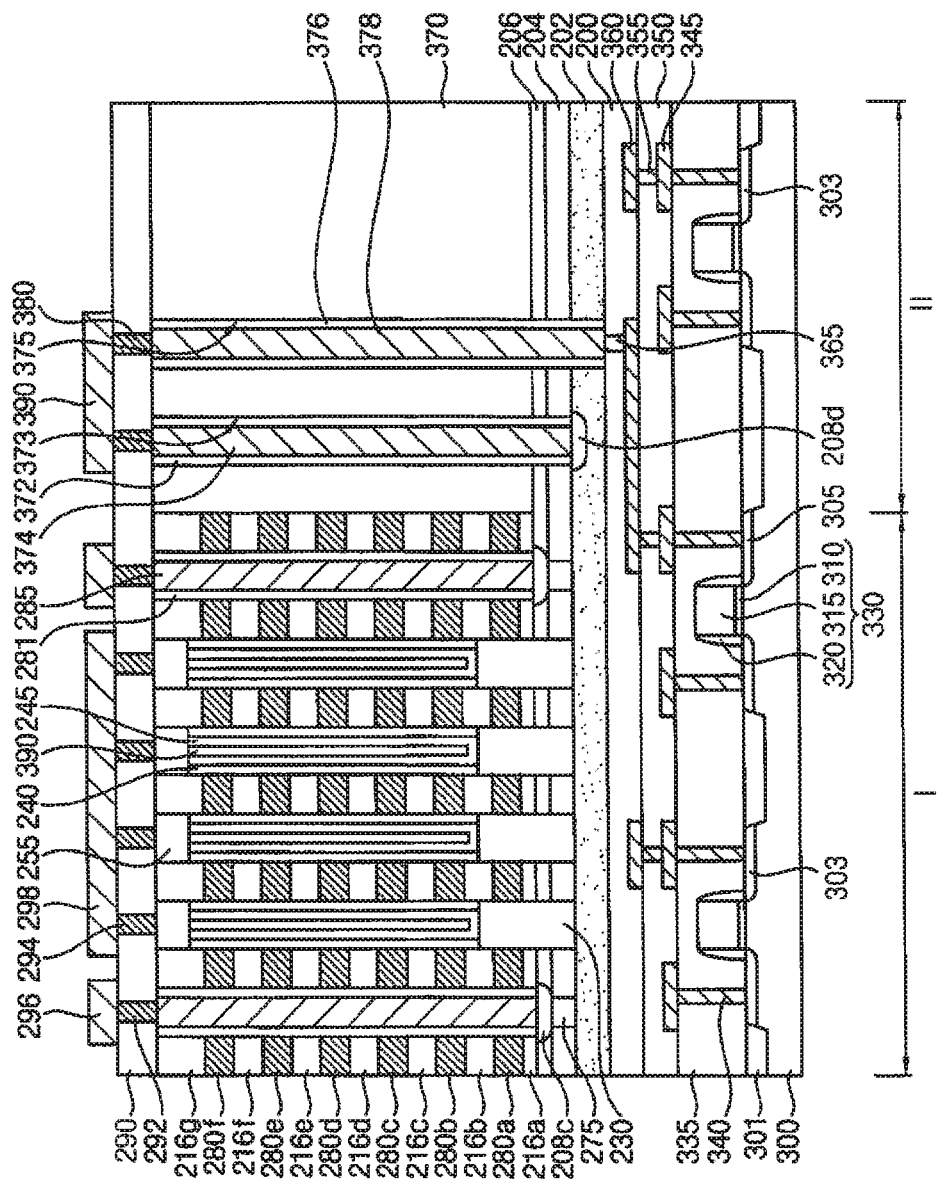
FIG. 57 is a cross-sectional view illustrating a vertical memory device in accordance with example embodiments.

FIG. 57 is a cross-sectional view illustrating a vertical memory device in accordance with example embodiments. For example, FIG. 57 illustrates the vertical memory device including a memory cell structure stacked on a peripheral circuit. The memory cell structure may have elements and/or constructions that are substantially the same as or similar to that illustrated in FIG. 27. In example embodiments, the memory cell structure may have elements and/or constructions that are substantially the same as or similar to those illustrated in FIG. 1, FIG. 17, FIG. 22, FIG. 38, FIGS. 39A and 39B, FIG. 40, FIGS. 48A and 48B, FIGS. 53A to 53C, and FIGS. 59 to 62.

Hereinafter, a method of manufacturing the vertical memory device is also described with reference to FIG. 57. Detailed descriptions on processes that are substantially the same as or similar to those illustrated with reference to FIGS. 28 to 37 are omitted.

Referring to FIG. 57, the vertical memory device may include a peripheral circuit formed on a substrate 300, and a memory cell structure disposed on the peripheral circuit.

A semiconductor substrate including single crystalline silicon or single crystalline germanium may be used as the substrate 300. The substrate 300 may be divided into a memory cell region I and a peripheral circuit connection region II. The memory cell structure may be disposed on the memory cell region I. A connection wiring structure by which the memory cell structure and the peripheral circuit are electrically connected to each other may be disposed on the peripheral circuit connection region II.

The peripheral circuit may include a gate structure 330, a first plug 340, a second plug 355, a third plug 365, a first wiring 345 and a second wiring 360. A first impurity region 303 and a second impurity region 305 may be formed at upper portions of the substrate 300 adjacent to the gate structure 330. In example embodiments, the first impurity region 303 may include n-type impurities, and the second impurity region 305 may include p-type impurities. In this case, an n-channel metal oxide semiconductor (NMOS) transistor may be defined by the first impurity region 303 and the gate structure 330, and a p-channel metal oxide semiconductor (PMOS) transistor may be defined by the second impurity region 305 and the gate structure 330.

The gate structure 330 may include a gate insulation layer pattern 310 and a gate electrode 315 sequentially stacked on the substrate 300. The gate structure 330 may further include a gate spacer 320 formed on sidewalls of the gate insulation layer pattern 310 and the gate electrode 315.

The first plugs 340 may be formed through a first insulation layer 335 covering the gate structure 330 to be electrically connected to the impurity regions 303 and 305. The first wiring 345 may be formed on the first insulation layer 335 and the first plug 340.

A second insulation layer 350 may be formed on the first insulation layer 335 to cover the first wiring 345. The second plug 355 may be formed through the second insulation layer 350 to be electrically connected to the first wiring 345. The second wiring 360 may be formed on the second insulation layer 350 and the second plug 355. A lower insulation layer 200 covering the second wiring 360 may be formed on the second insulation layer 350. The third plug 365 may be formed through the lower insulation layer 200 to be electrically connected to the second wiring 360.

FIG. 57 illustrates a double-leveled wiring structure, however, the wiring structure may include at least three levels.

The memory cell structure may be formed on the lower insulation layer 200 of the memory cell region I. The connection wiring structure may be formed on the lower insulation layer 200 of the peripheral circuit connection region II. The memory cell structure may be formed by, e.g., processes that are substantially the same as or similar to those illustrated with reference to FIGS. 28 to 37.

The connection wiring structure may include a protection layer 370 formed on a second channel layer 206, and a connection contact formed through the protection layer 370 and connecting the memory cell structure and the peripheral circuit. The connection contact may include a first connection contact 374 and a second connection contact 378.

In example embodiments, portions of insulating interlayers 212 and sacrificial layers 214 (see FIG. 29) formed on the peripheral circuit connection region II may be removed to form an opening. An insulation layer filling the opening may be formed, and then an upper portion of the insulation layer may be planarized to form the protection layer 370.

The first connection contact 374 may be formed in a first contact hole 373 extending through the protection layer 370, the second channel layer 206 and a separating insulation layer 204. A first insulation layer pattern 372 may be formed on a sidewall of the first contact hole 373 to surround the first connection contact 374.

A fourth impurity region 208d may be formed at an upper portion of a first channel layer 202 in contact with the first connection contact 374. For example, the fourth impurity region 208d may include p-type impurities. A third impurity region 208c included in the memory cell structure and serving as a CSL may include n-type impurities.

In example embodiments, after forming the first contact hole 373, p-type impurities may be implanted through the first contact hole 373 to form the fourth impurity region 208d at the upper portion of the first channel layer 202. The first insulation layer pattern 372 may be formed on the sidewall of the first contact hole 373, and then the first connection contact 374 filling a remaining portion of the first contact hole 373 may be formed.

The second connection contact 378 may be formed in a second contact hole 375 extending through the protection layer 370, the second channel layer 206, the separating insulation layer 204 and the first channel layer 202. A second insulation layer pattern 376 may be formed on a sidewall of the second contact hole 375 to surround the second connection contact 378.

The second connection contact 378 may make contact with the third plug 365 to be electrically connected to the second wiring 360. In example embodiments, the second connection contact 378 may be electrically connected to the second impurity region 305 of the PMOS transistor via the second wiring 360.

An upper insulation layer 290 may be formed throughout the memory cell region I and the peripheral circuit connection region II to cover the protection layer 370. Fourth plugs 380 may be formed through the protection layer 370 to be in contact with the first and second connection contacts 374 and 378.

Figure 58:
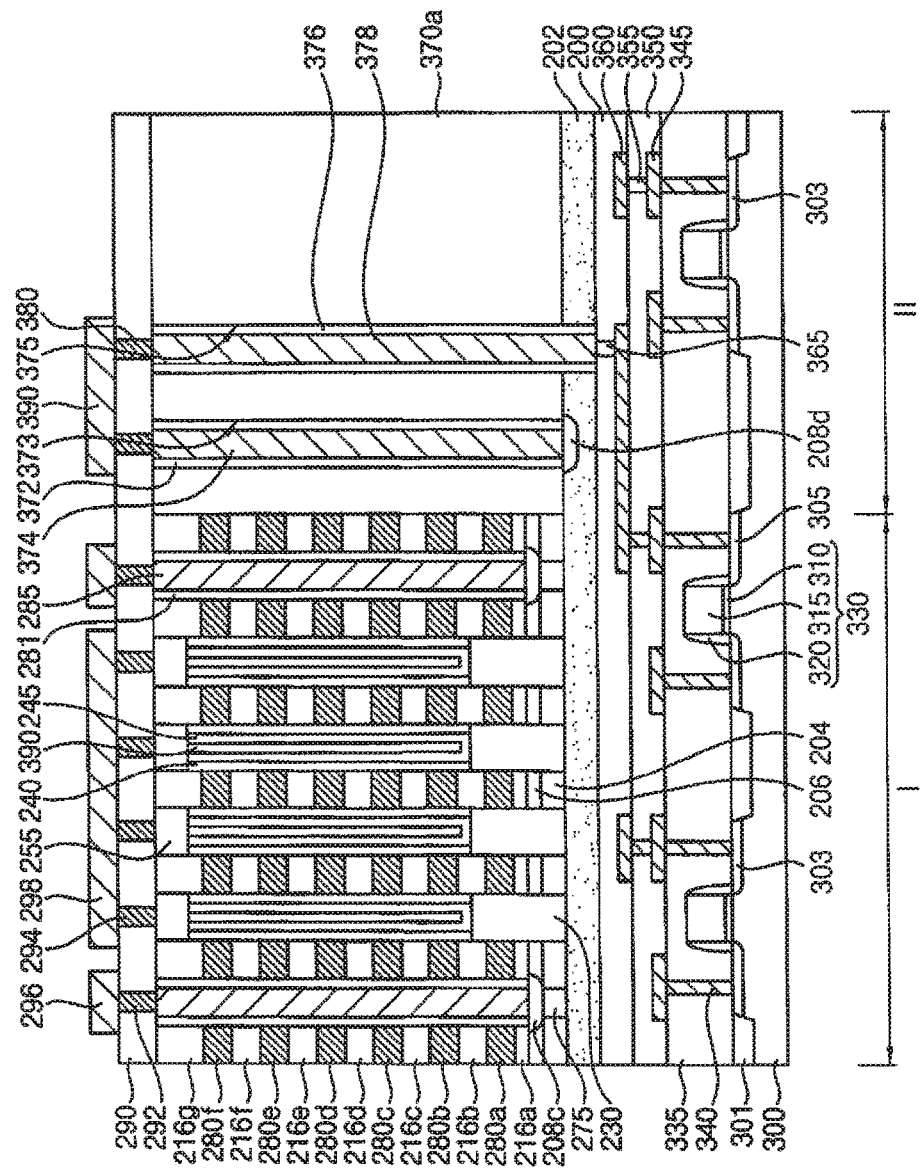
FIG. 58 is a cross-sectional view illustrating a vertical memory device in accordance with example embodiments.

FIG. 58 is a cross-sectional view illustrating a vertical memory device in accordance with example embodiments. Detailed descriptions on elements and/or constructions that are substantially the same as or similar to those illustrated with reference to FIG. 57 are omitted for brevity.

Referring to FIG. 58, a second channel layer 206 and a separating insulation layer 204 may be formed only on the memory cell region I and may not extend on the peripheral circuit connection region II. In this case, a first connection contact 374 may be formed through a protection layer 370a to be in contact with a fourth impurity region 208d, and a second connection contact 378 may be formed through the protection layer 370a and a first channel layer 202 to be in contact with a third plug 365.

In example embodiments, portions of insulating interlayers 212, sacrificial layers 214, the second channel layer 206 and the separating insulation layer 204 (see FIG. 29) formed on the peripheral circuit connection region II may be removed to form an opening. An insulation layer filling the opening may be formed, and then an upper portion of the insulation layer may be planarized to form the protection layer 370a.

FIG. 59 is a cross-sectional view illustrating a vertical memory device in accordance with example embodiments.

Referring to FIG. 59, a vertical memory device may be the same as or similar to the vertical memory device in FIG. 21 of the present application except for the width of the patterns in the low resistance layer may be different. As illustrated in FIG. 59, in example embodiments, a low resistance layer 102c may be patterned so each one of the patterns in the low resistance layer 102c corresponds to a plurality of the channel holes 120. In FIG. 59, two of the channel holes 120 are over each one of the patterns in the low resistance layer 102c, but example embodiments are not limited thereto. For example, the patterns of the low resistance layer 102c may alternatively have a greater width such that three or more of the channel holes are over each one of the patterns in the low resistance layer 102c.

Figure 60:
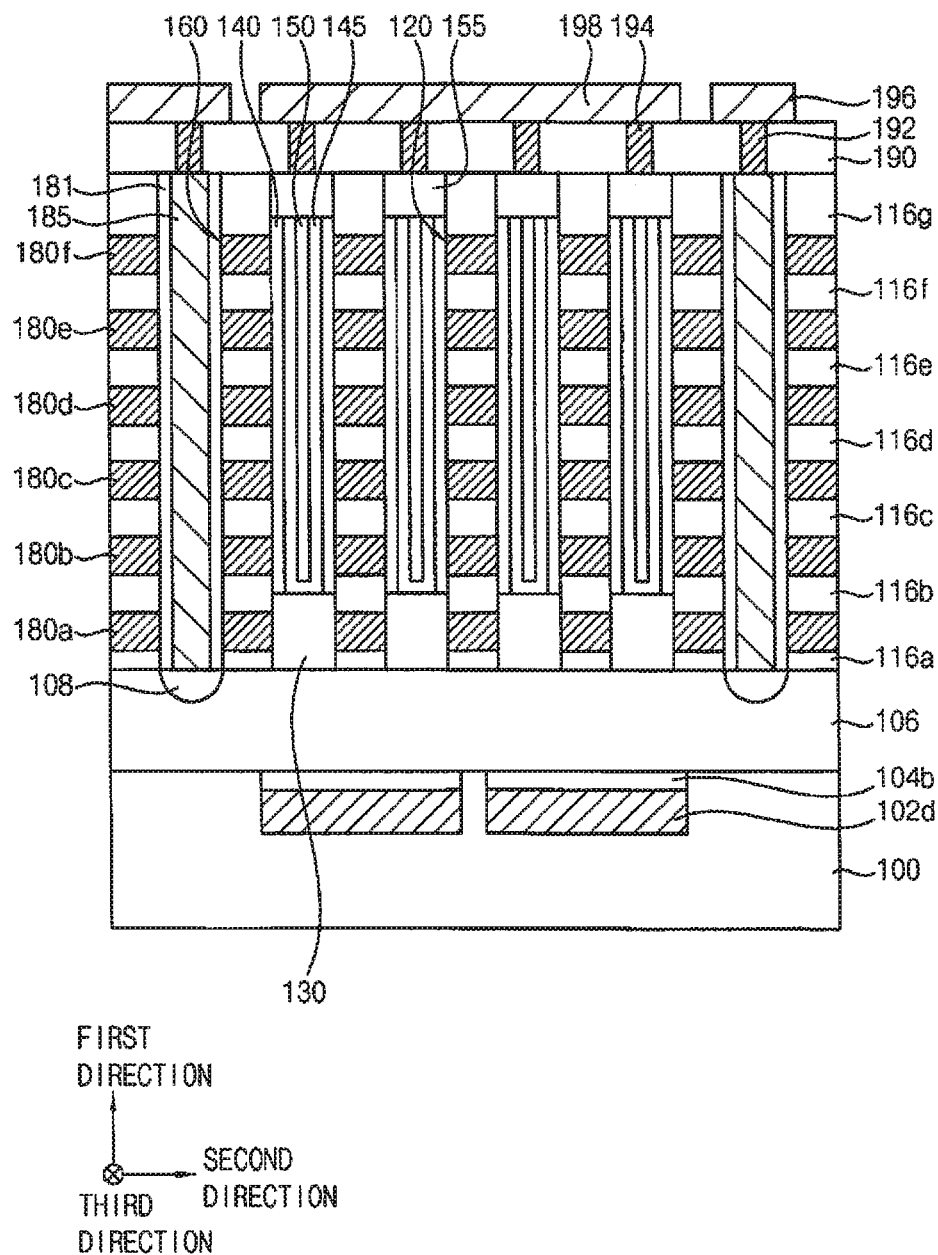
FIG. 60 is a cross-sectional view illustrating a vertical memory device in accordance with example embodiments.

FIG. 60 is a cross-sectional view illustrating a vertical memory device in accordance with example embodiments.

Referring to FIG. 60, a vertical memory device may be the same as or similar to the vertical memory device in FIG. 22 of the present application except for the widths of the patterns in the low resistance layer and the ohmic contact layer pattern may be different. As illustrated in FIG. 60, in example embodiments, a low resistance layer 102d may be patterned so each one of the patterns in the low resistance layer 102d corresponds to a plurality of the channel holes 120. In FIG. 60, two of the channel holes 120 are over each one of the patterns in the low resistance layer 102d, but example embodiments are not limited thereto. For example, the patterns of the low resistance layer 102d may alternatively have a greater width such that three or more of the channel holes are over each one of the patterns in the low resistance layer 102d. The ohmic contact layer pattern 104b may be patterned so the width of the patterns in the ohmic contact layer pattern 104b are the same as the width of the patterns in the low resistance layer 102d.

Figure 61:
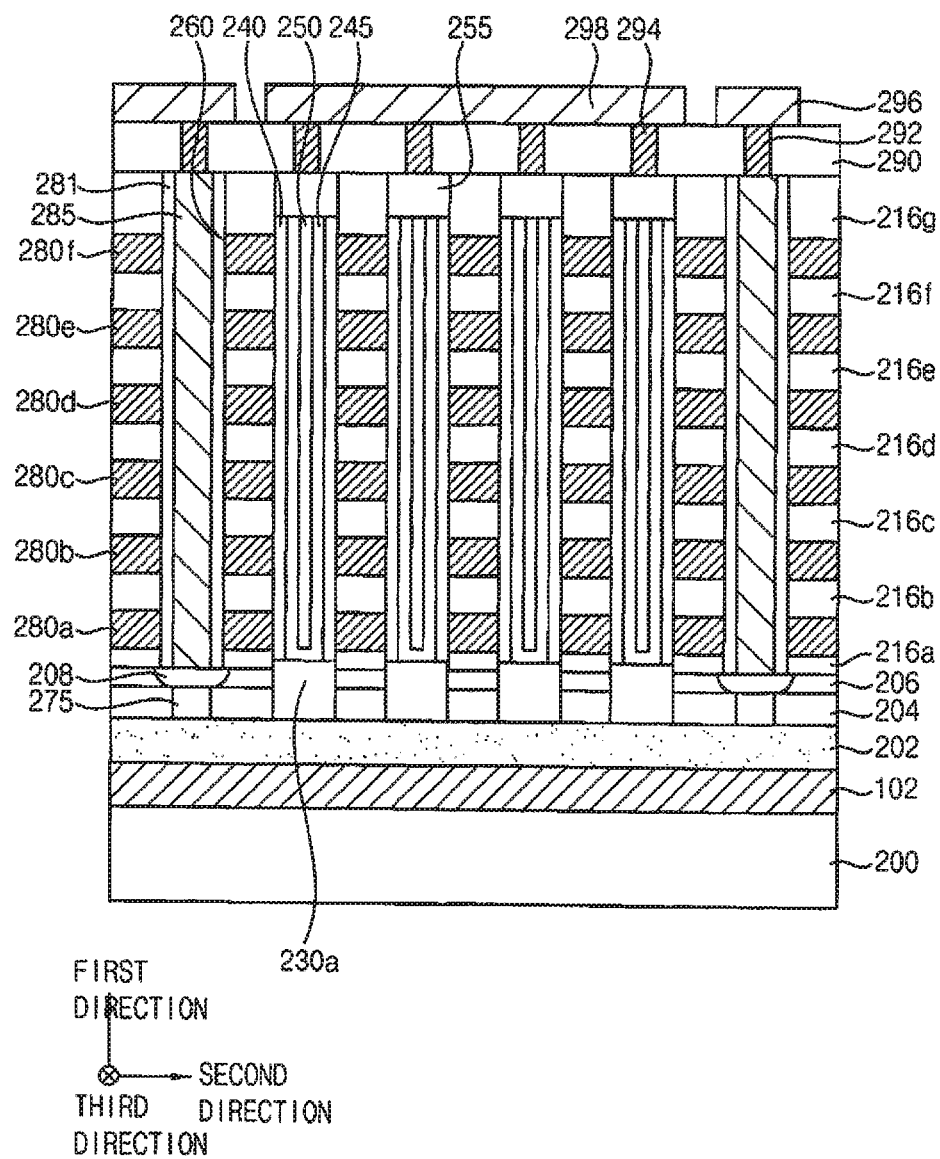
FIG. 61 is a cross-sectional view illustrating a vertical memory device in accordance with example embodiments.

FIG. 61 is a cross-sectional view illustrating a vertical memory device in accordance with example embodiments.

Referring to FIG. 61, a vertical memory device may be the same as or similar to the vertical memory device in FIG. 39A of the present application except for the height of the semiconductor patterns. As illustrated in FIG. 61, in example embodiments, a vertical memory device may include the semiconductor patterns 230a that do not extend vertically through a lowermost one of the gate lines 280 (e.g., 280a).

Figure 62:
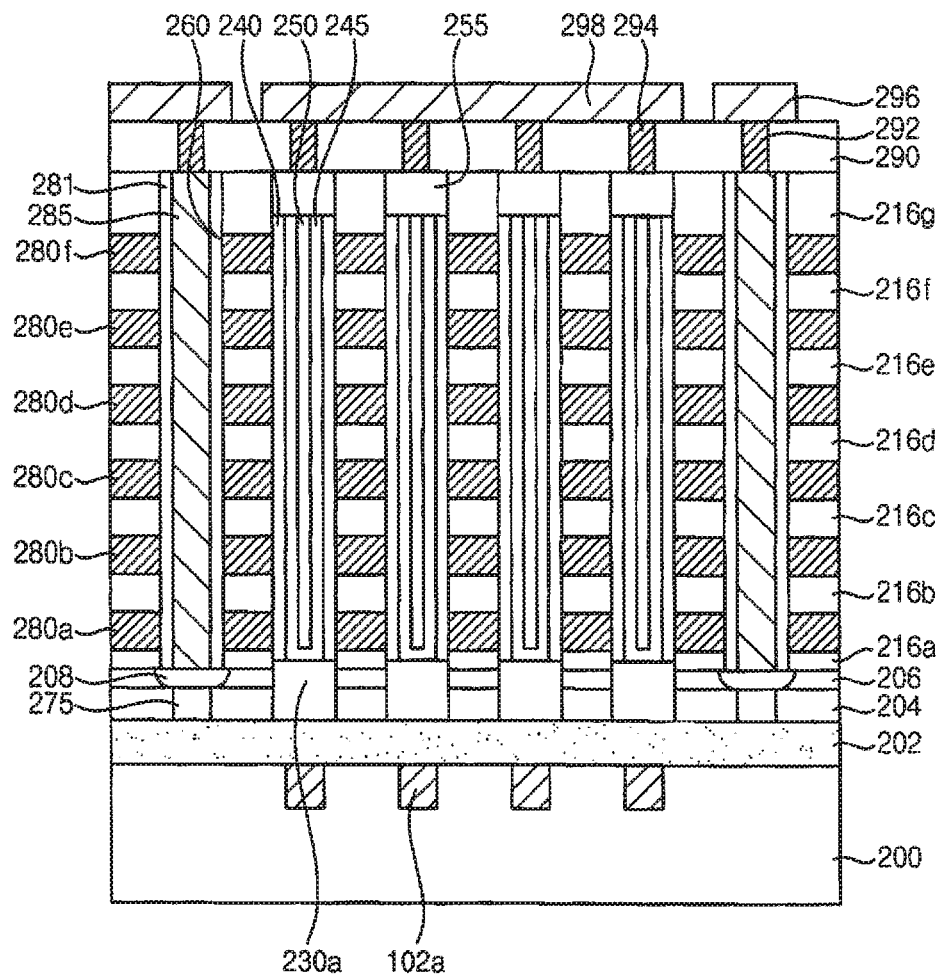
FIG. 62 is a cross-sectional view illustrating a vertical memory device in accordance with example embodiments.

FIG. 62 is a cross-sectional view illustrating a vertical memory device in accordance with example embodiments.

Referring to FIG. 62, a vertical memory device may be the same as or similar to the vertical memory device in FIG. 61 of the present application except the low resistance layer 102a may be patterned. Although not illustrated in FIG. 62, an ohmic contact layer pattern (see e.g., 104a in FIG. 22) may be formed on the low resistance layer 102a.

According to example embodiments of inventive concepts, a low resistance layer or a channel layer having at least two different layers may be utilized for a vertical memory device so that a resistance and a leakage current of the vertical memory device may be reduced. The vertical memory device may be implemented as a memory cell structure vertically stacked on a peripheral circuit region.

The foregoing is illustrative of example embodiments and is not to be construed as limiting thereof. Although a few example embodiments have been described, those skilled in the art will readily appreciate that many modifications are possible in the example embodiments without materially departing from the scope of the claims. Accordingly, all such modifications are intended to be included within the scope of the claims. In the claims, means-plus-function clauses are intended to cover the structures described herein as performing the recited function and not only structural equivalents but also equivalent structures.

What is claimed is:

1. A method of manufacturing a vertical memory device, the method comprising:
    forming a lower insulation layer on a substrate;
    forming a low resistance layer on the lower insulation layer;
    forming a channel layer on the low resistance layer;
    forming a plurality of vertical channels on the channel layer, the vertical channels extending in a first direction that is perpendicular with respect to a top surface of the channel layer, the vertical channels including outer sidewalls, the vertical channels being over the low resistance layer in the first direction; and
    forming a plurality of gate lines surrounding the outer sidewalls of the vertical channels, the gate lines being stacked in the first direction and spaced apart from each other.

2. The method of the vertical memory device of claim 1, further comprising:
    forming an ohmic contact layer between the low resistance layer and the channel layer.

3. The method of the vertical memory device of claim 2, wherein
    the ohmic contact layer and the channel layer include polysilicon doped with p-type impurities, and
    an impurity concentration of the ohmic contact layer is greater than an impurity concentration of the channel layer.

4. The method of the vertical memory device of claim 1, further comprising:
    forming a hole extending in the first direction through the plurality of gate lines, a bottom of the hole exposing the channel layer;
    forming an insulation pattern on a sidewall of the hole; and
    forming a common source line contact filling the hole, wherein the common source line formed on the channel layer.

5. The method of the vertical memory device of claim 4, further comprising:
    forming an impurity region an upper portion of the channel layer exposed by the hole.

6. The method of the vertical memory device of claim 1, wherein
    the low resistance layer includes at least one of a metal, a metal nitride and a metal silicide, and
    an electrical resistance of the low resistance layer is less than an electrical resistance of the channel layer.

7. The method of the vertical memory device of claim 1, wherein the low resistance layer covers an upper surface of the lower insulation layer.

8. The method of the vertical memory device of claim 1, wherein forming the low resistance layer on the lower insulation layer comprises:
    etching an upper portion of the lower insulation layer to form an opening; and
    filling a conductive layer in the opening to form the low resistance layer.

9. The method of the vertical memory device of claim 1, further comprising:
    forming a peripheral circuit on the substrate, wherein the lower insulation layer covers the peripheral circuit.

10. A method of manufacturing a vertical memory device, the method comprising:
    forming a lower insulation layer on a substrate;
    forming a first channel layer on the lower insulation layer;
    forming a second channel layer on the first channel layer, the second channel layer and the first channel layer being spaced apart from each other in a first direction that is perpendicular with respect to a top surface of the second channel layer;
    forming a plurality of vertical channels on the first channel layer, the vertical channels extending in the first direction; and
    forming a plurality of gate lines, the gate lines surrounding outer sidewalls of the vertical channels, the gate lines being stacked in the first direction and spaced apart from each other in the first direction on the lower insulation layer.

11. The method of the vertical memory device of claim 10, wherein forming the first channel layer on the lower insulation layer includes:
    forming a channel layer on the lower insulation layer; and
    patterning the channel layer to form a first channel pattern including a plurality of line patterns.

12. The method of the vertical memory device of claim 11, wherein each one of the line patterns overlaps at least one channel row including a plurality of the vertical channels.

13. The method of the vertical memory device of claim 10, further comprises:
    forming a hole extending in the first direction through the plurality of gate lines, the hole exposing the second channel layer;
    forming an insulation pattern on the sidewall of the hole; and
    forming a common source line contact filling the hole, wherein the common source line formed on the second channel layer.

14. The method of the vertical memory device of claim 13, further comprises:
    forming an impurity region an upper portion of the second channel layer exposed by the hole.

15. The method of the vertical memory device of claim 10, wherein
the first channel layer and the second channel layer include polysilicon doped with p-type impurities, and
an impurity concentration of the first channel layer is greater than an impurity concentration of the second channel layer.

16. The method of the vertical memory device of claim 10, wherein a thickness of the first channel layer is greater than a thickness of the second channel layer.

17. The method of the vertical memory device of claim 10, further comprising:
forming a semiconductor pattern on the second channel layer, wherein the semiconductor pattern passing through the second channel layer and a lower most gate line,
wherein the vertical channels are formed on the semiconductor pattern.

18. The method of the vertical memory device of claim 10, further comprises:
forming a peripheral circuit on the substrate, wherein the lower insulation layer covers the peripheral circuit.

19. A method of manufacturing a vertical memory device, the method comprising:
forming a peripheral circuit on a substrate;
forming a lower insulation layer on a substrate, the lower insulation layer covering the peripheral circuit;
forming a low resistance layer on the lower insulation layer;
forming a channel layer on the low resistance layer;
forming a plurality of vertical channels on the channel layer, the vertical channels extending in a first direction that is perpendicular with respect to a top surface of the channel layer, the vertical channels including outer sidewalls, the vertical channels being over the low resistance layer in the first direction; and
forming a plurality of gate lines surrounding the outer sidewalls of the vertical channels, the gate lines being stacked in the first direction and spaced apart from each other.

20. The method of the vertical memory device of claim 19, wherein the low resistance layer is spaced apart from the channel layer in the first direction.

* * * * *